(12) United States Patent
Hoshi et al.

(10) Patent No.: US 12,219,871 B2
(45) Date of Patent: Feb. 4, 2025

(54) LIGHT EMITTING DEVICE

(71) Applicant: Samsung Display Co., Ltd., Yongin-si (KR)

(72) Inventors: Keigo Hoshi, Yokohama (JP); Tetsuji Hayano, Yokohama (JP); Yuuki Miyazaki, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 820 days.

(21) Appl. No.: 17/391,636

(22) Filed: Aug. 2, 2021

(65) Prior Publication Data

US 2022/0223799 A1 Jul. 14, 2022

(30) Foreign Application Priority Data

Dec. 18, 2020 (KR) .................. 10-2020-0178995

(51) Int. Cl.
*H10K 85/60* (2023.01)
*H10K 50/11* (2023.01)
*H10K 101/40* (2023.01)

(52) U.S. Cl.
CPC ....... *H10K 85/6572* (2023.02); *H10K 85/636* (2023.02); *H10K 50/11* (2023.02); *H10K 2101/40* (2023.02)

(58) Field of Classification Search
CPC ............. H10K 85/6572; H10K 85/636; H10K 85/322; H10K 50/11; H10K 50/121;
(Continued)

(56) References Cited

U.S. PATENT DOCUMENTS 10,686,141 B2 6/2020 Hatakeyama et al.
2019/0115538 A1 4/2019 Lim et al.
(Continued)

FOREIGN PATENT DOCUMENTS

CN 110790782 2/2020
CN 111094302 5/2020
(Continued)

*Primary Examiner* — Shane Fang
(74) *Attorney, Agent, or Firm* — KILE PARK REED & HOUTTEMAN PLLC

(57) ABSTRACT

Provided is a light emitting device including a first electrode, a second electrode disposed on the first electrode, and an emission layer disposed between the first electrode and the second electrode. The emission layer includes at least one polycyclic compound represented by Formula 1 below, and may thus exhibit long life characteristics.

[Formula 1]

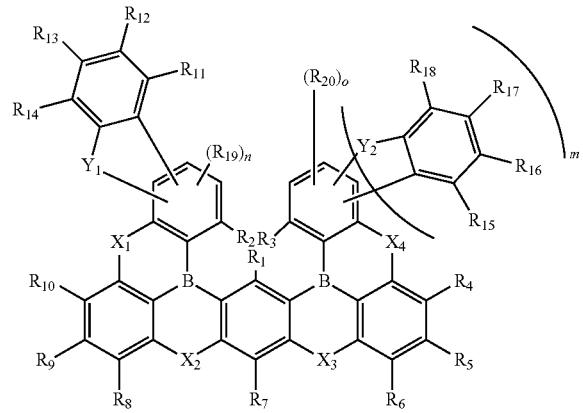

12 Claims, 6 Drawing Sheets

(58) Field of Classification Search
CPC .................. H10K 2101/10; H10K 2101/40; C07F 5/027; C08G 61/10; C08G 61/122; C08G 2261/124; C08G 2261/1412; C08G 2261/1414; C08G 2261/148; C08G 2261/18; C08G 2261/228; C08G 2261/312; C08G 2261/3142; C08G 2261/3162; C08G 2261/3221; C08G 2261/95; C09K 11/06; C09K 2211/1018

See application file for complete search history.

(56) References Cited

U.S. PATENT DOCUMENTS

| | | | |
|---|---|---|---|
| 2020/0185626 A1 | 6/2020 | Yuuki | |
| 2020/0185635 A1 | 6/2020 | Yuuki | |
| 2020/0190115 A1* | 6/2020 | Hatakeyama | H10K 85/6572 |

FOREIGN PATENT DOCUMENTS

| | | |
|---|---|---|
| JP | 2018-43984 | 3/2018 |
| KR | 10-2019-0042791 | 4/2019 |
| KR | 10-2020-0006965 | 1/2020 |
| KR | 10-2020-0071192 | 6/2020 |
| KR | 10-2020-0071193 | 6/2020 |

* cited by examiner

LIGHT EMITTING DEVICE

CROSS-REFERENCE TO RELATED APPLICATION(S)

This application claims priority to and benefits of Korean Patent Application No. 10-2020-0178995 under 35 U.S.C. § 119, filed on Dec. 18, 2020 in the Korean Intellectual Property Office, the entire contents of which are incorporated herein by reference.

BACKGROUND

1. Technical Field

The disclosure relates to a light emitting device including a polycyclic compound in an emission layer.

2. Description of the Related Art

Active development continues for an organic electroluminescence display as an image display apparatus. In contrast top liquid crystal displays and the like, the organic electroluminescence display is a so-called self-luminescent display apparatus in which holes and electrons respectively injected from a first electrode and a second electrode recombine in an emission layer, so that a luminescent material including an organic compound in the emission layer emits light to achieve display.

In the application of light emitting device to an image display apparatus, there is a need for a light emitting device having a low driving voltage, high luminous efficiency, and a long service life, and continuous development for materials for light emitting devices which stably achieves such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device having a long service life.

An embodiment provides a light emitting device which may include a first electrode, a second electrode disposed on the first electrode, and an emission layer disposed between the first electrode and the second electrode, wherein the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, W, In, Sn, Zn, an oxide thereof, a compound thereof, and a mixture thereof. The emission layer may include a polycyclic compound represented by Formula 1.

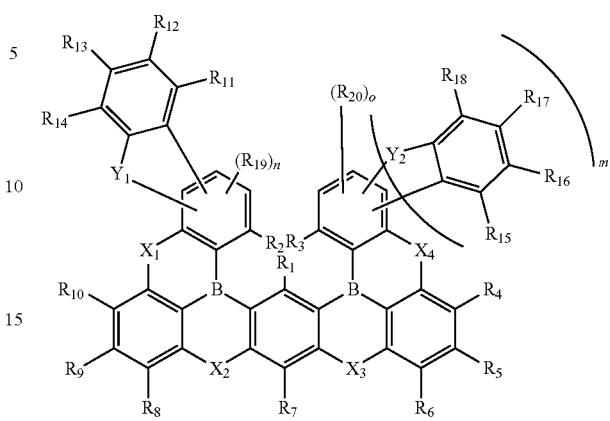

[Formula 1]

In Formula 1 above, m and n may each independently be 0 or 1, o may be an integer from 0 to 3, $X_1$ to $X_4$ may each independently be N(Ra), C(Rb)(Rc), O, or S, $Y_1$ and $Y_2$ may each independently be N(Rd), O, or S, and $R_1$ to $R_{20}$, and Ra to Rd may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

In an embodiment, the polycyclic compound represented by Formula 1 above may be represented by Formula 2-1 or Formula 2-2 below.

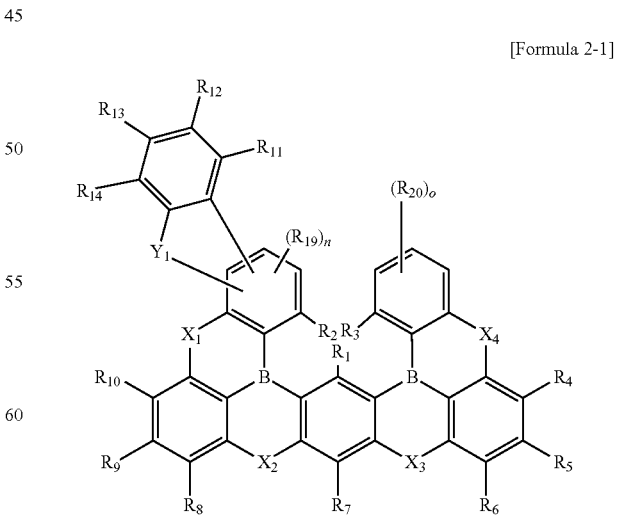

[Formula 2-1]

[Formula 2-2]

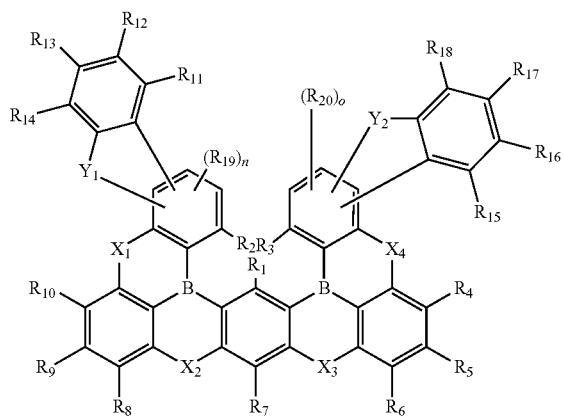

In Formulas 2-1 and 2-2 above, n, o, $X_1$ to $X_4$, $Y_1$, $Y_2$, and $R_1$ to $R_{20}$ may be the same as defined in connection with Formula 1 above. In Formula 2-2 above, o1 may be 0 or 1.

In an embodiment, the polycyclic compound represented by Formula 1 above may be represented by any one of Formulas 3-1 to 3-3 below.

[Formula 3-1]

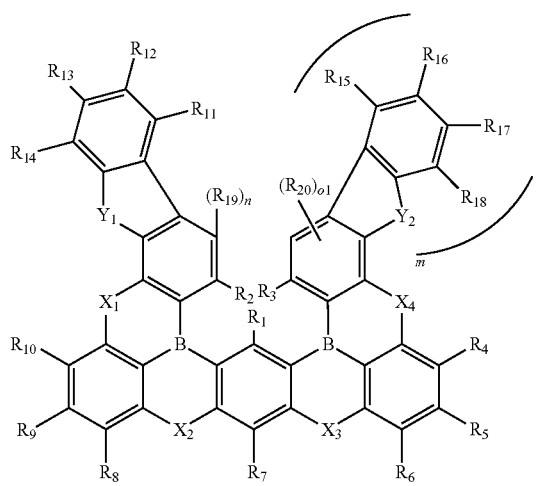

[Formula 3-2]

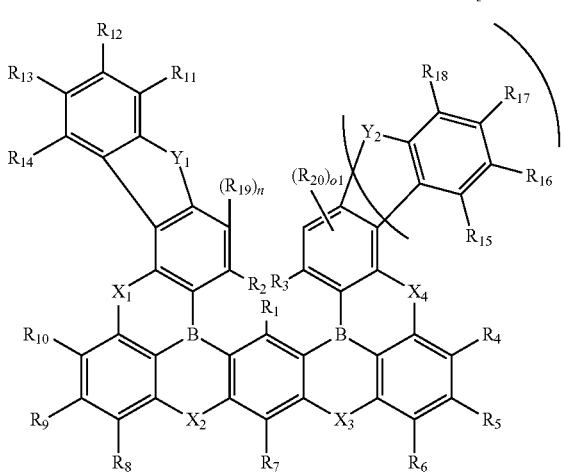

[Formula 3-3]

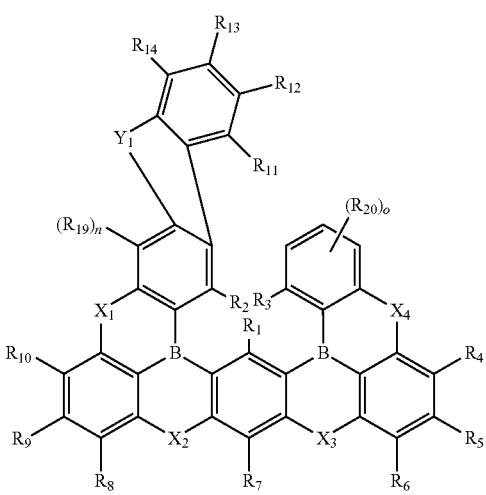

In Formulas 3-1 to 3-3 above, m to o, $X_1$ to $X_4$, $Y_1$, $Y_2$, and $R_1$ to $R_{20}$ may be the same as defined in connection with Formula 1 above. In Formulas 3-1 and 3-2 above, o1 may be 0 or 1.

In an embodiment, in Formula 3-1 above, at least one of $R_{11}$ to $R_{18}$ may be an unsubstituted phenyl group.

In an embodiment, the polycyclic compound represented by Formula 1 above may be represented by any one of Formulas 4-1 to 4-3 below.

[Formula 4-1]

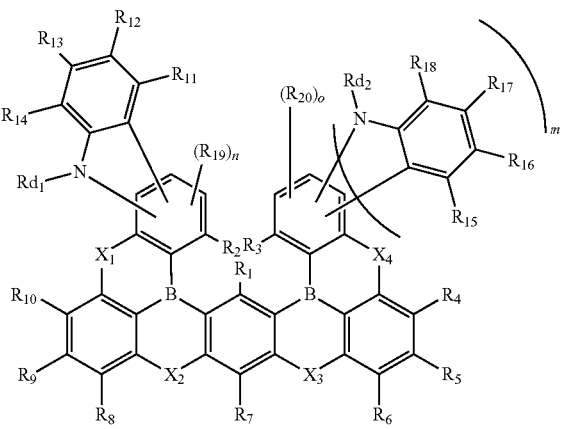

-continued

[Formula 4-2]

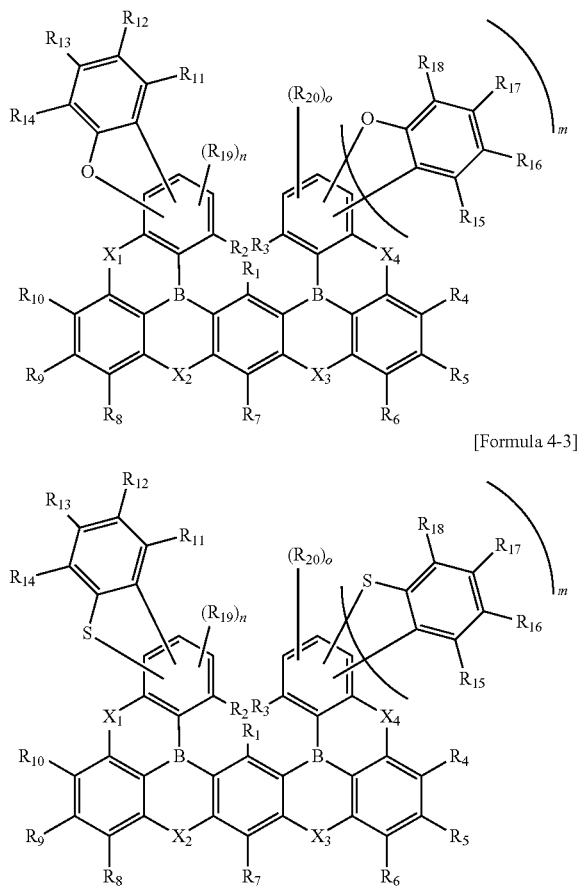

[Formula 4-3]

In Formulas 4-1 to 4-3 above, m to o, $X_1$ to $X_4$, and $R_1$ to $R_{20}$ may be the same as defined in connection with Formula 1 above, and $Rd_1$ and $Rd_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, in Formula 1 above, at least one of $X_1$ to $X_4$ may be N(Ra), and Ra may be a substituted or unsubstituted phenyl group, a substituted or unsubstituted biphenyl group, or a substituted or unsubstituted terphenyl group.

In an embodiment, in Formula 1 above, at least one of $Y_1$ and $Y_2$ may be N(Rd), and Rd may be a substituted or unsubstituted phenyl group.

In an embodiment, the emission layer may include a dopant and a host, and the dopant may include the polycyclic compound.

In an embodiment, the emission layer may emit thermally activated delayed fluorescence.

In an embodiment, the emission layer may emit light having a central emission wavelength in a range of about 430 nm to about 490 nm.

In an embodiment, in Formula 1, $R_1$ to $R_{20}$ above may each be a deuterium atom.

In an embodiment, a light emitting device may include a first electrode, a second electrode disposed on the first electrode, an emission layer disposed between the first electrode and the second electrode, and a capping layer disposed on the second electrode and having a refractive index equal to or greater than about 1.6. The emission layer may include a polycyclic compound represented by Formula 1A.

[Formula 1A]

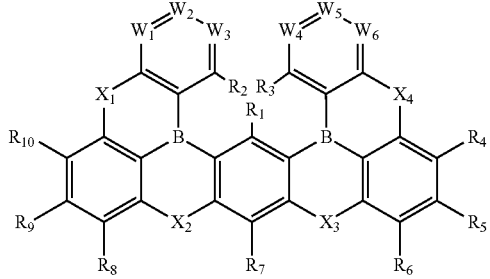

In Formula 1A above, at least one pair of a pair of adjacent two selected from $W_1$ to $W_3$ and a pair of adjacent two selected from $W_4$ to $W_6$ may be bonded to a group represented by Formula 2A, the remainder of $W_1$ to $W_6$ may each independently be C(Re), $X_1$ to $X_4$ may each independently be N(Ra), C(Rb)(Rc), O, or S, and $R_1$ to $R_{10}$, Ra to Rc, and Re may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

[Formula 2A]

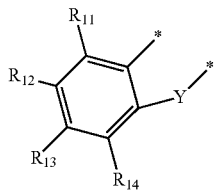

In Formula 2A above, Y may be N(Rd), O, or S, and $R_{11}$ to $R_{14}$, and Rd may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms. In Formula 2A,

/* represents a binding site to one of $W_1$ to $W_6$ in Formula 1A.

In an embodiment, the group represented by Formula 2A above may be represented by Formula 3A-1 or Formula 3A-2 below.

[Formula 3A-1]

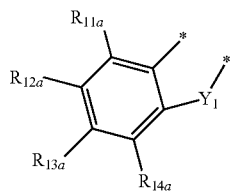

[Formula 3A-2]

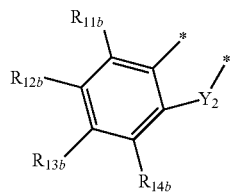

In Formula 3A-1 above, $Y_1$ may be $N(Rd_1)$, O, or S, $Y_1$ may be bonded to $W_1$ or $W_2$, and $R_{11a}$ to $R_{14a}$, and $Rd_1$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 carbon atoms. In Formula 3A-2 above, $Y_2$ may be $N(Rd_2)$, O, or S, $Y_2$ may be bonded to $W_5$ or $W_6$, and $R_{11b}$ to $R_{14b}$, and $Rd_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 carbon atoms. In Formula 3A-1 and 3A-2,

represents a binding site to one of $W_1$ to $W_6$ in Formula 1A.

In an embodiment, when a group represented by Formula 3A-1 above is bonded to $W_1$ and $W_2$, a group represented by Formula 3A-2 above may be bonded to $W_5$ and $W_6$.

In an embodiment, $Y_1$ in Formula 3A-1 above and $Y_2$ in Formula 3A-2 above may be the same.

In an embodiment, the group represented by Formula 2A above may be represented by Formulas 4A-1 to 4A-3 below.

[Formula 4A-1]

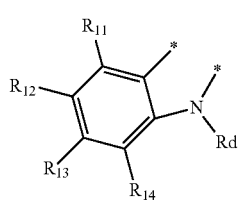

[Formula 4A-2]

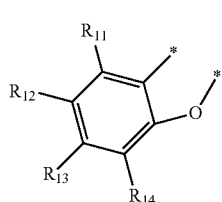

[Formula 4A-3]

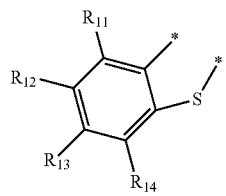

In Formulas 4A-1 to 4A-3 above, $R_{11}$ to $R_{14}$, and Rd may be the same as defined in connection with Formula 2A above, and

represents a binding site to one of $W_1$ to $W_6$ in Formula 1A.

In an embodiment, in Formula 1A above, at least one of $X_1$ to $X_4$ may be N(Ra), and Ra may be a substituted or unsubstituted phenyl group, a substituted or unsubstituted biphenyl group, or a substituted or unsubstituted terphenyl group.

In an embodiment, in Formula 2A above, Y may be N(Rd), and Rd may be a substituted or unsubstituted phenyl group.

In an embodiment, the emission layer may include at least one compound selected from Compound Group 1 below.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
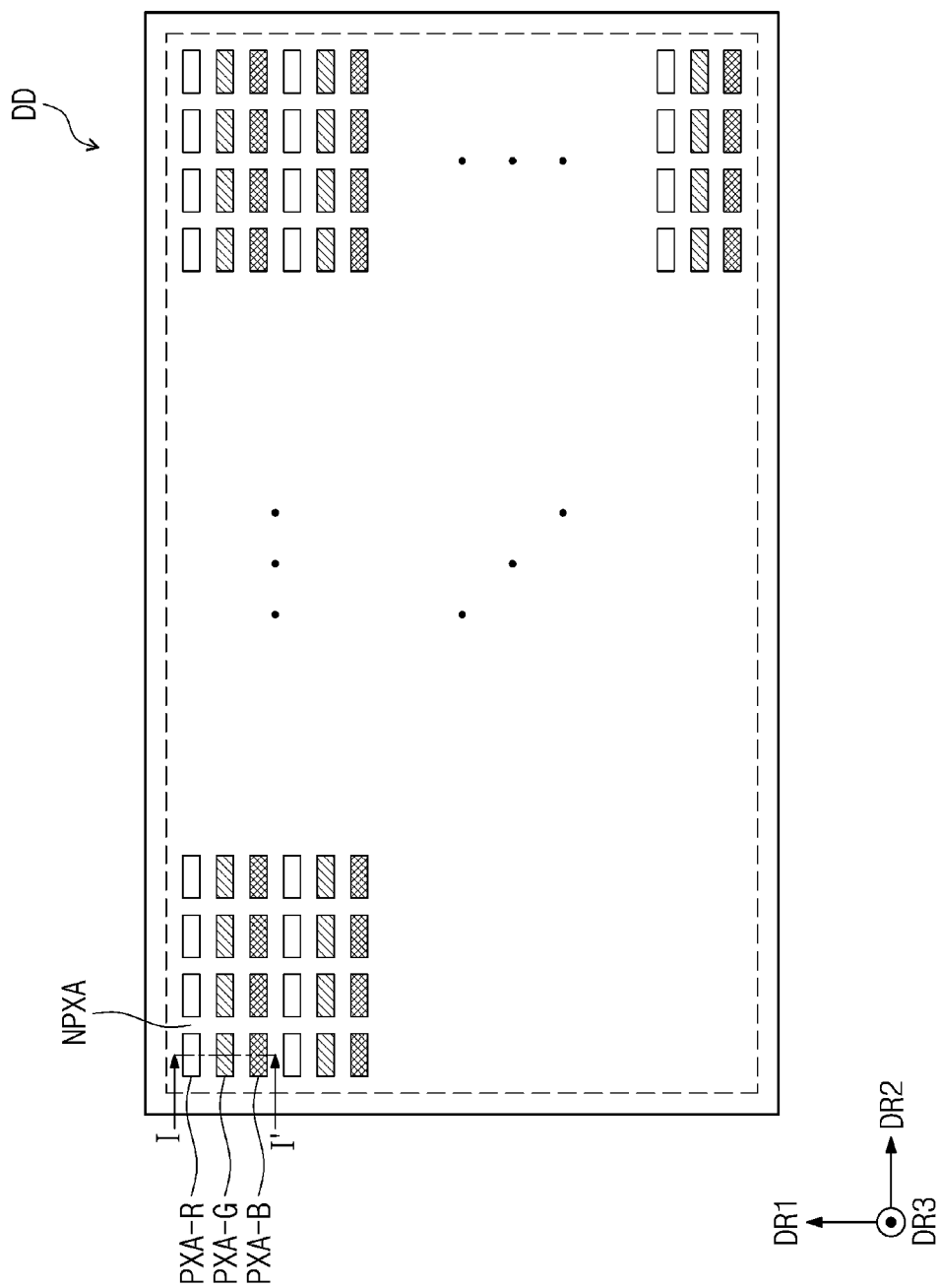
FIG. 1 is a plan view illustrating an embodiment of a display apparatus.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may themselves be substituted or unsubstituted. For example, a biphenyl group may be interpreted as an aryl group or as a phenyl group substituted with a phenyl group.

In the description, the term "bonded to an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may be monocyclic or polycyclic. The rings formed by groups bonded to each other may be connected to another ring to form a spiro structure.

In the description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest point to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". For example, two methyl groups in 4,5-dimethylphenanthrene may be interpreted as mutually "adjacent groups".

In the description, examples of a halogen atom may include a fluorine atom, a chlorine atom, a bromine atom, and an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, a hydrocarbon ring group may be any functional group or substituent derived from an aliphatic hydrocarbon ring. For example, the hydrocarbon ring group may be a saturated hydrocarbon ring group having 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the description, a fluorenyl group may be substituted, and two substituents may be bonded to each other to form a spiro structure. Examples of substituted fluorenyl groups are as follows. However, embodiments are not limited thereto.

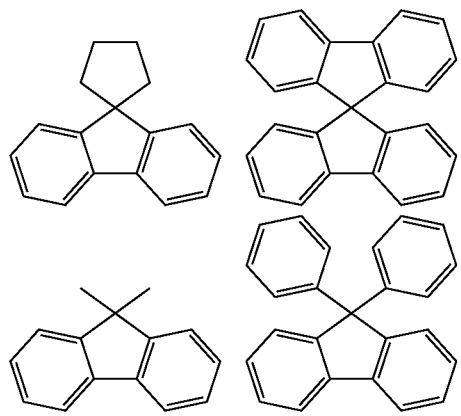

In the description, a heterocyclic group may be any functional group or substituent derived from a ring containing at least one of B, O, N, P, Si, and S as a hetero atom. The heterocyclic group may be an aliphatic heterocyclic group or an aromatic heterocyclic group. The aromatic heterocyclic group may be a heteroaryl group. The aliphatic heterocycle and the aromatic heterocycle may be monocyclic or polycyclic.

In the description, the heterocyclic group may contain at least one of B, O, N, P, Si, and S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and this term may also include a heteroaryl group. The number of ring-forming carbon atoms in the heterocyclic group may be 2 to 30, 2 to 20, or 2 to 10.

In the description, the aliphatic heterocyclic group may contain at least one of B, O, N, P, Si, and S as a hetero atom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the description, a heteroaryl group may include at least one of B, O, N, P, Si, and S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the above description with respect to the aryl group may be applied to an arylene group, except that the arylene group is a divalent group. The above description with respect to the heteroaryl group may be applied to a heteroarylene group, except that the heteroarylene group is a divalent group.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the description, the number of carbon atoms in an amino group is not particularly limited, but may be 1 to 30. The amino group may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

In the description, the number of carbon atoms in a carbonyl group is not particularly limited, but may be 1 to 40, 1 to 30, or 1 to 20. For example, the carbonyl group may have a structure as shown below, but is not limited thereto.

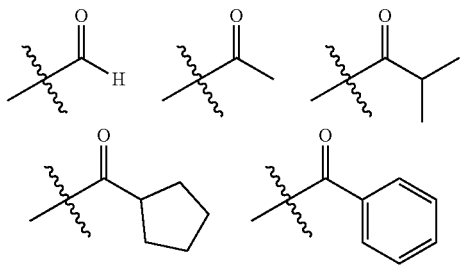

In the description, the number of carbon atoms in a sulfinyl group and a sulfonyl group is not particularly limited, but may be 1 to 30. The sulfinyl group may be an alkyl sulfinyl group or an aryl sulfinyl group. The sulfonyl group may be an alkyl sulfonyl group or an aryl sulfonyl group.

In the description, a thio group may be an alkyl thio group or an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the description, an oxy group may be an oxygen atom that is bonded to an alkyl group or an aryl group as defined above. The oxy group may be an alkoxy group or an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the description, a boron group may be a boron atom that is bonded to an alkyl group or an aryl group as defined above. The boron group may be an alkyl boron group or an aryl boron group. Examples of the boron group may include a trimethylboron group, a triethylboron group, a t-butyldimethylboron group, a triphenylboron group, a diphenylboron group, a phenylboron group, etc., but are not limited thereto.

In the description, an alkenyl group may be linear or branched. The number of carbon atoms in the alkenyl group is not particularly limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the description, the number of carbon atoms in an amine group is not particularly limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but are not limited thereto.

In the description, examples of an alkyl group may include an alkylthio group, an alkyl sulfoxy group, an alkylaryl group, an alkylamino group, an alkyl boron group, an alkyl silyl group, and an alkyl amine group.

In the description, examples of an aryl group may include an aryloxy group, an arylthio group, an aryl sulfoxy group, an arylamino group, an aryl boron group, an aryl silyl group, and an aryl amine group.

In the description, a direct linkage may be a single bond.

In the description,

and —* each represent a binding site to a neighboring atom.

Hereinafter, embodiments will be described with reference to the accompanying drawings.

Figure 2:
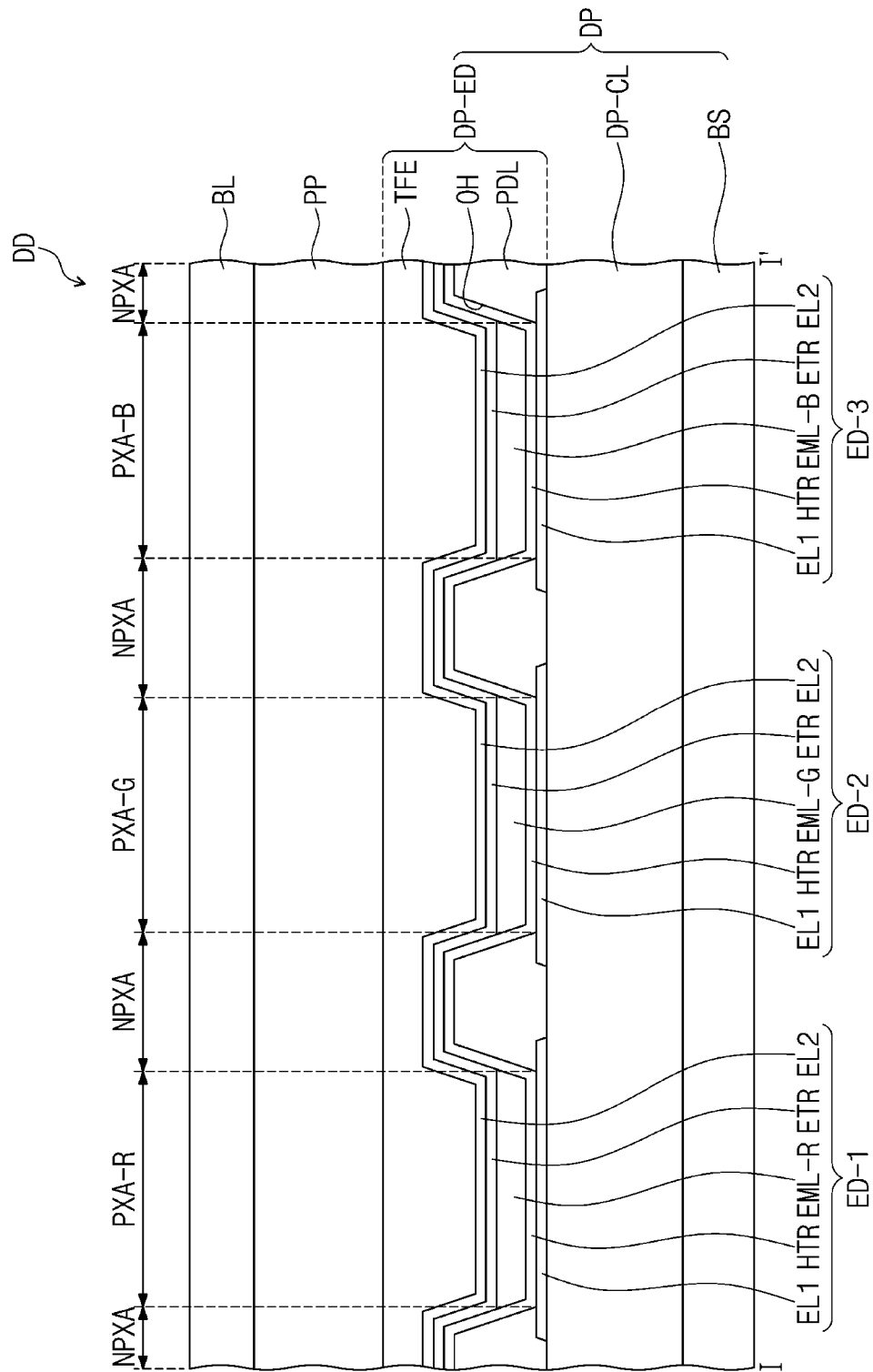
FIG. 2 is a schematic cross-sectional view of a display apparatus according to an embodiment.

FIG. 1 is a plan view illustrating an embodiment of a display apparatus DD. FIG. 2 is a schematic cross-sectional view of a display apparatus DD according to an embodiment. FIG. 2 is a schematic cross-sectional view showing a portion corresponding to line I-I' of FIG. 1.

The display apparatus DD may include a display panel DP and an optical layer PP disposed on the display panel DP. The display panel DP includes light emitting devices ED-1, ED-2, and ED-3. The display apparatus DD may include multiples light emitting devices each of ED-1, ED-2, and ED-3. The optical layer PP may be disposed on the display panel DP and may control light reflected at the display panel DP from an external light. The optical layer PP may include, for example, a polarizing layer or a color filter layer. Although not shown in the drawings, in an embodiment, the optical layer PP may be omitted from the display apparatus DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may be an organic material layer. The filling layer (not shown) may include at least one of an acrylic-based resin, a silicone-based resin, and an epoxy-based resin.

The display panel DP may include a base layer BS, a circuit layer DP-CL provided on the base layer BS, and a display device layer DP-ED. The display device layer DP-ED may include a pixel defining film PDL, light emitting devices ED-1, ED-2, and ED-3 disposed in the pixel defining film PDL, and an encapsulation layer TFE disposed on the light emitting devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light emitting devices ED-1, ED-2, and ED-3 of the display device layer DP-ED.

The light emitting devices ED-1, ED-2, and ED-3 may each have a structure of a light emitting device ED according to an embodiment of FIGS. 3 to 6, which will be described later. The light emitting devices ED-1, ED-2, and ED-3 may each include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are disposed in openings OH defined in the pixel defining film PDL, and the hole transport region HTR, the electron transport region ETR, and the second electrode EL2 are each provided as a common layer throughout the light emitting devices ED-1, ED-2, and ED-3. However, embodiments are not limited thereto, and although not shown in FIG. 2, in an embodiment, the hole transport region HTR and the electron transport region ETR may each be provided to be patterned inside the openings OH defined in the pixel defining film PDL. For example, in an embodiment, the hole transport region HTR, the emission layers EML-R, EML-G, and EML-B, and the electron transport region ETR, etc. of the light emitting devices ED-1, ED-2, and ED-3 may each be provided by patterning through inkjet printing.

The encapsulation layer TFE may cover the light emitting devices ED-1, ED-2, and ED-3. The encapsulation layer TFE may seal the display device layer DP-ED. The encapsulation layer TFE may be a thin film encapsulation layer. The encapsulation layer TFE may be a single layer or may be laminated with multiple layers. The encapsulation layer TFE may include at least one insulating layer. The encapsulation layer TFE according to an embodiment may include at least one inorganic film (hereinafter, an encapsulation inorganic film). In an embodiment, the encapsulation layer TFE according to an embodiment may include at least one organic film (hereinafter, an encapsulation organic film) and at least one encapsulation inorganic film.

The encapsulation inorganic film may protect the display device layer DP-ED from moisture and/or oxygen, and the encapsulation organic film may protect the display device layer DP-ED from foreign substances such as dust particles. The encapsulation inorganic film may include silicon nitride, silicon oxy nitride, silicon oxide, titanium oxide, aluminum oxide, etc., but is not limited thereto. The encapsulation organic layer may include an acrylic-based compound, an epoxy-based compound, etc. The encapsulation organic layer may include a photopolymerizable compound, but is not limited thereto.

The encapsulation layer TFE may be disposed on the second electrode EL2, and may be disposed to fill the openings OH.

Referring to FIGS. 1 and 2, the display apparatus DD may include a non-light emitting area NPXA and light emitting areas PXA-R, PXA-G, and PXA-B. The light emitting areas PXA-R, PXA-G, and PXA-B may each be an area emitting light generated from each of the light emitting devices ED-1, ED-2, and ED-3. The light emitting areas PXA-R, PXA-G, and PXA-B may be spaced apart from each other on a plane.

Each of the light emitting areas PXA-R, PXA-G, and PXA-B may be an area separated by the pixel defining film PDL. The non-light emitting areas NPXA may be an area between neighboring light emitting areas PXA-R, PXA-G, and PXA-B, and may correspond to the pixel defining film PDL. In the description, each of the light emitting areas PXA-R, PXA-G, and PXA-B may correspond to a pixel. The pixel defining film PDL may separate the light emitting devices ED-1, ED-2, and ED-3. The emission layers EML-R, EML-G, and EML-B of the light emitting devices ED-1, ED-2, and ED-3 may be disposed and separated in the openings OH defined by the pixel defining film PDL.

The light emitting areas PXA-R, PXA-G, and PXA-B may be divided into groups according to the color of light generated from the light emitting devices ED-1, ED-2, and ED-3. In the display apparatus DD of an embodiment shown in FIGS. 1 and 2, three light emitting areas PXA-R, PXA-G, and PXA-B which emit red light, green light, and blue light, are illustrated as an example. For example, the display apparatus DD of an embodiment may include a red light emitting area PXA-R, a green light emitting area PXA-G, and a blue light emitting area PXA-B, which are distinct from one another.

In the display apparatus DD according to an embodiment, the light emitting devices ED-1, ED-2, and ED-3 may emit light having different wavelength ranges. For example, in an embodiment, the display apparatus DD may include a first light emitting device ED-1 emitting red light, a second light emitting device ED-2 emitting green light, and a third light emitting device ED-3 emitting blue light. For example, the red light emitting area PXA-R, the green light emitting area PXA-G, and the blue light emitting area PXA-B of the display apparatus DD may correspond to the first light emitting device ED-1, the second light emitting device ED-2, and the third light emitting device ED-3, respectively.

However, embodiments are not limited thereto, and the first to third light emitting devices ED-1, ED-2, and ED-3 may emit light in a same wavelength range or emit light in at least one different wavelength range. For example, the first to third light emitting devices ED-1, ED-2, and ED-3 may each emit blue light.

The light emitting areas PXA-R, PXA-G, and PXA-B in the display apparatus DD according to an embodiment may be arranged in the form of a stripe. Referring to FIG. 1, red light emitting areas PXA-R, green light emitting areas PXA-G, and blue light emitting areas PXA-B may each be arranged along a second directional axis DR2. The red light emitting area PXA-R, the green light emitting area PXA-G, and the blue light emitting area PXA-B may be alternately arranged along a first directional axis DR1.

FIGS. 1 and 2 illustrate that the light emitting areas PXA-R, PXA-G, and PXA-B are all similar in size, but embodiments are not limited thereto, and the light emitting areas PXA-R, PXA-G, and PXA-B may be different in size from each other according to a wavelength range of emitted light. The area of the light emitting areas PXA-R, PXA-G, and PXA-B may be areas in a plan view that are defined by the first directional axis DR1 and the second directional axis DR2.

The arrangement of the light emitting areas PXA-R, PXA-G, and PXA-B is not limited to the one shown in FIG. 1, and the order that the red light emitting area PXA-R, the green light emitting area PXA-G, and the blue light emitting area PXA-B are arranged may be provided in another arrangement according to the display quality characteristics required for the display apparatus DD. For example, the light emitting areas PXA-R, PXA-G, and PXA-B may be arranged as a PenTile® configuration or as a diamond configuration.

An area of each of the light emitting areas PXA-R, PXA-G, and PXA-B may be different in size from one another. For example, in an embodiment, an area of the green light emitting area PXA-G may be smaller than an area of the blue light emitting area PXA-B, but embodiments are not limited thereto.

Figure 3:
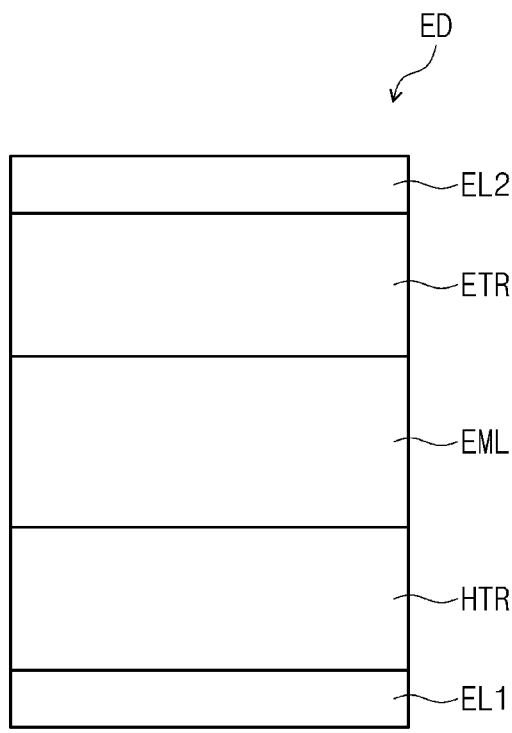
FIG. 3 is a schematic cross-sectional view showing a light emitting device according to an embodiment.

Hereinafter, FIGS. 3 to 6 are each a schematic cross-sectional view illustrating a light emitting device according to an embodiment. As shown in FIG. 3, the light emitting device ED according to an embodiment may include a first electrode EL1, a hole transport region HTR, an emission layer EML, an electron transport region ETR, and a second electrode EL2.

Figure 4:
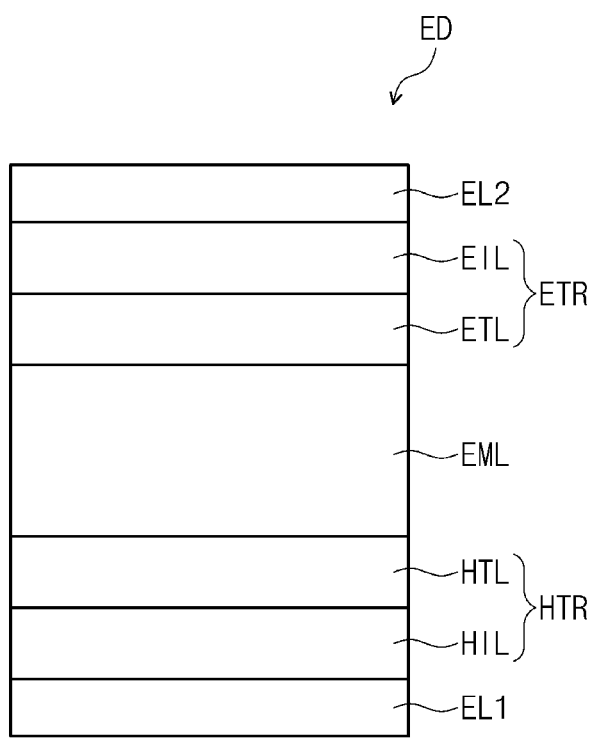
FIG. 4 is a schematic cross-sectional view showing a light emitting device according to an embodiment.
Figure 5:
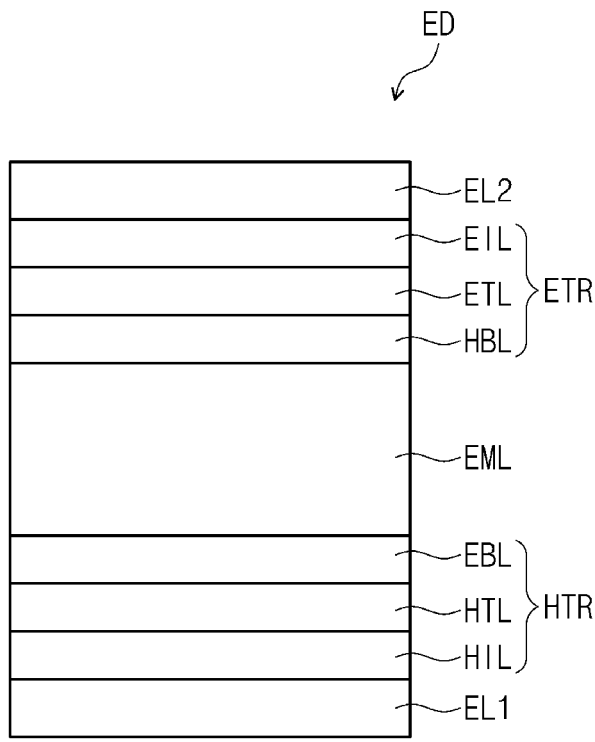
FIG. 5 is a schematic cross-sectional view showing a light emitting device according to an embodiment.
Figure 6:
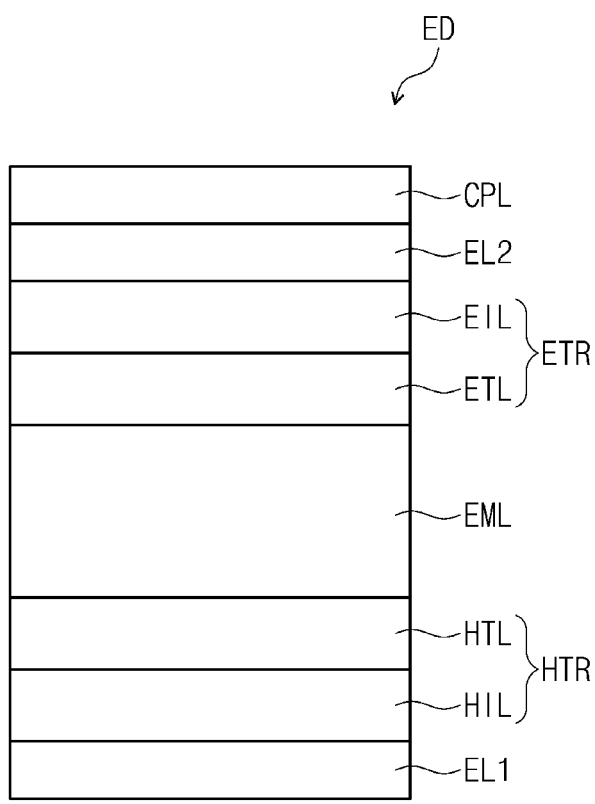
FIG. 6 is a schematic cross-sectional view showing a light emitting device according to an embodiment.

In comparison to FIG. 3, FIG. 4 is a schematic cross-sectional view of a light emitting device ED according to an embodiment in which the hole transport region HTR includes a hole injection layer HIL and a hole transport layer HTL, and the electron transport region ETR includes an electron injection layer EIL and an electron transport layer ETL. In comparison to FIG. 3, FIG. 5 is a schematic cross-sectional view of a light emitting device ED according to an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. In comparison to FIG. 4, FIG. 6 is a schematic cross-sectional view of a light emitting device ED according to an embodiment, which includes a capping layer CPL disposed on the second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO. However, embodiments are not limited thereto, and the first electrode EL1 may include the above-described metal materials, a combination of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), a light emitting auxiliary layer (not shown), and an electron blocking layer EBL. The hole transport region HTR may have a thickness, for example, in a range of about 50 Å to about 15,000 Å.

The hole transport region HTR may have a layer formed of a single material, a layer formed of different materials, or a multilayer structure having layers formed of different materials.

For example, the hole transport region HTR may have a single-layer structure formed of a hole injection layer HIL or a hole transport layer HTL, or a single-layer structure formed of a hole injection material or a hole transport material. For example, the hole transport region HTR may have a single-layer structure formed of different materials, or a structure in which a hole injection layer HIL/a hole transport layer HTL, a hole injection layer HIL/a hole transport layer HTL/a buffer layer (not shown), a hole injection layer HIL/a buffer layer (not shown), a hole transport layer HTL/a buffer layer (not shown), or a hole injection layer HIL/a hole transport layer HTL/an electron blocking layer EBL are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

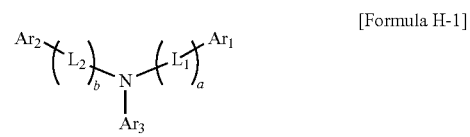

[Formula H-1]

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

A compound represented by Formula H-1 above may be a monoamine compound. In another embodiment, the compound represented by Formula H-1 may be a diamine compound in which at least one of $Ar_1$ to $Ar_3$ includes an amine group as a substituent. For example, the compound represented by Formula H-1 may be a carbazole-based compound including a substituted or unsubstituted carbazole group in at least one of $Ar_1$ and $Ar_2$ or a substituted or unsubstituted fluorene-based group in at least one of $Ar_1$ and $Ar_2$.

The compound represented by Formula H-1 may be any one selected from Compound Group H below. However, the compounds listed in Compound Group H below are only examples, and the compound represented by Formula H-1 is not limited to the compounds listed in Compound Group H below.

[Compound Group H]

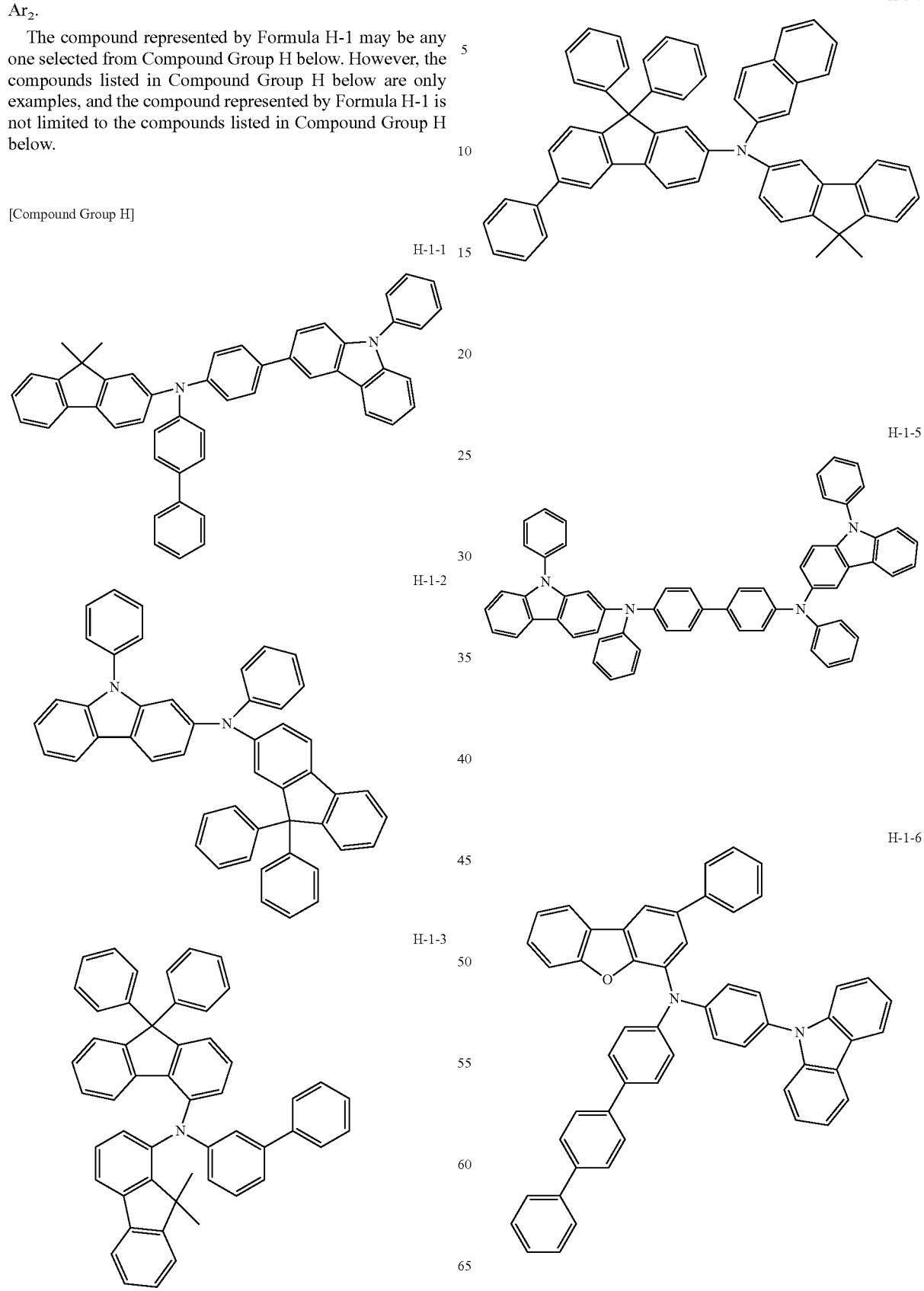

H-1-7
H-1-8
H-1-9
H-1-10
H-1-11
H-1-12
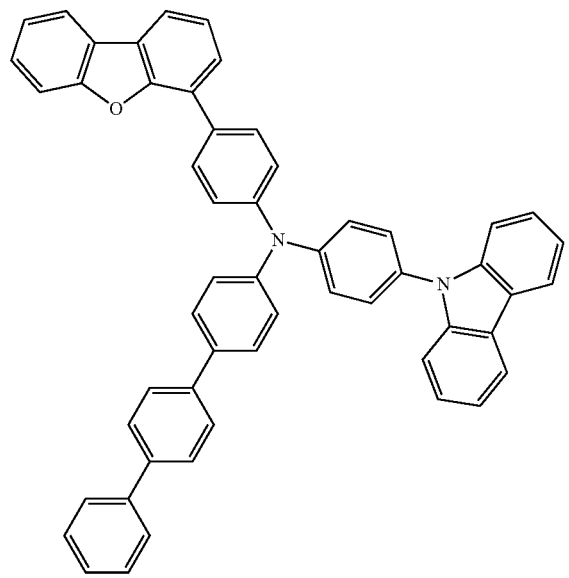
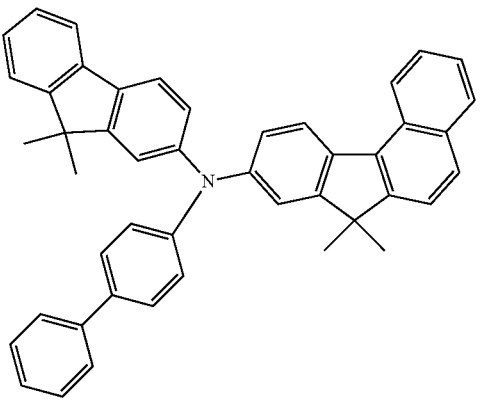
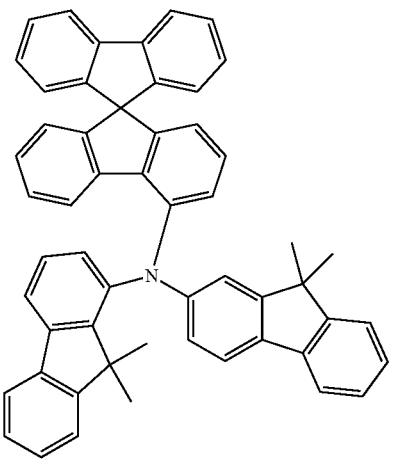

-continued
H-1-13
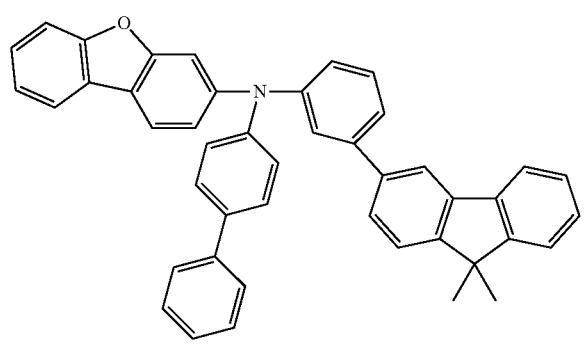
H-1-14
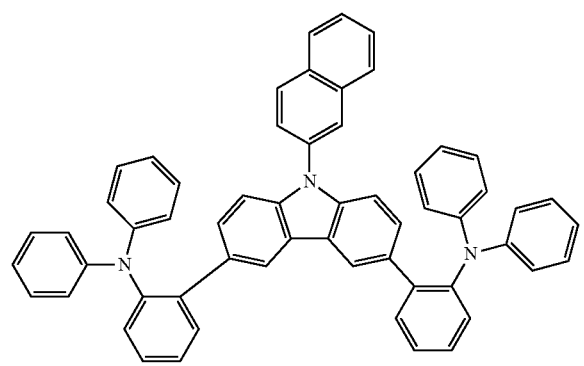
H-1-15
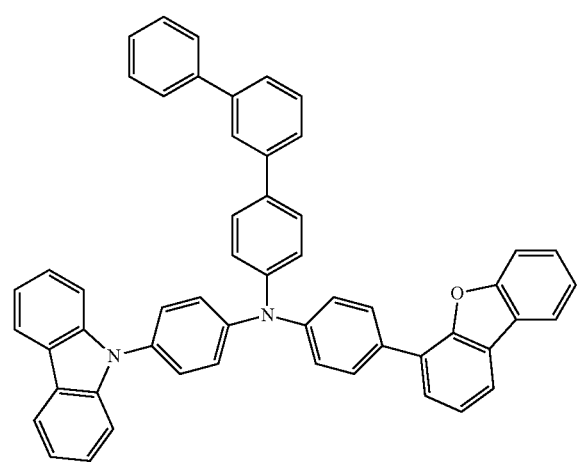
-continued
H-1-16
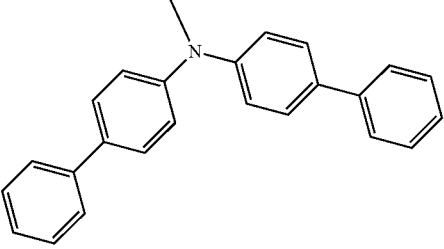
H-1-17
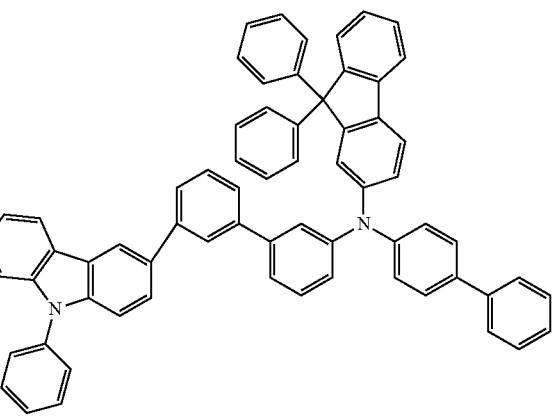
H-1-18
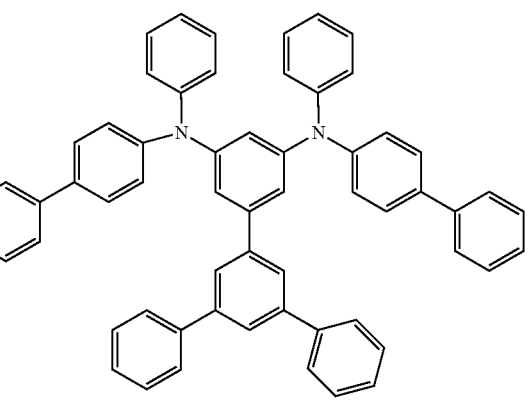

-continued

H-1-19

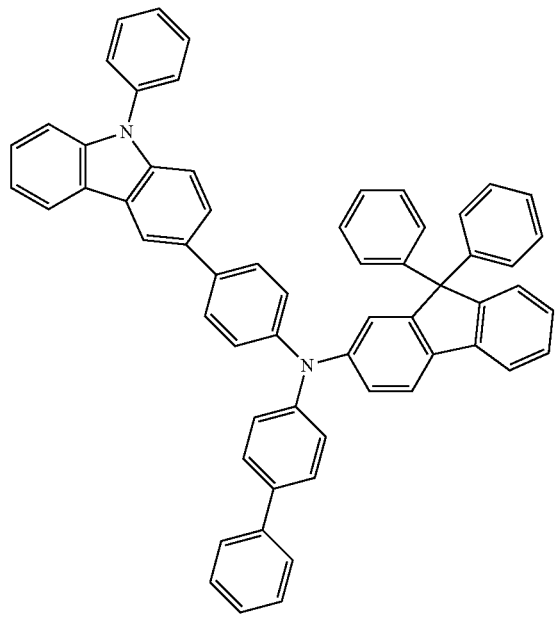

The hole transport region HTR may include a phthalocyanine compound such as copper phthalocyanine, $N^1,N^{1'}$-([1,1'-biphenyl]-4,4'-diyl)bis(N1-phenyl-N4,N4-di-m-tolylbenzene-1,4-diamine) (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N-di(naphthalene-1-yl)-N,N'-diphenyl-benzidine (NPB), triphenylamine-containing polyetherketone (TPAPEK), 4-isopropyl-4'-methyldiphenyliodonium[tetrakis(pentafluorophenyl) borate], dipyrazino[2,3-f: 2',3'-h]quinoxaline-2,3,6,7,10,11-hexacarbonitrile (HATCN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris (N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of the hole injection layer HIL, the hole transport layer HTL, and the electron blocking layer EBL.

The hole transport region HTR may have a thickness in a range of about 100 Å to about 10,000 Å. For example, the hole transport region HTR may have a thickness in a range of about 100 Å to about 5,000 Å. When the hole transport region HTR includes a hole injection layer HIL, the hole injection layer HIL may have a thickness, for example, in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness, for example, in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, and cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h]quinoxaline-2,3,6, 7,10,11-hexacarbonitrile (HATCN) and 4-[[2,3-bis[cyano-(4-cyano-2,3,5,6-tetrafluorophenyl)methylidene] cyclopropylidene]-cyanomethyl]-2,3,5,6-tetrafluorobenzonitrile, etc., but is not limited thereto.

As described above, the hole transport region HTR may further include at least one of a buffer layer (not shown) and an electron blocking layer EBL in addition to the hole injection layer HIL and the hole transport layer HTL. The buffer layer (not shown) may compensate for a resonance distance according to wavelengths of light emitted from an emission layer EML, and may thus increase luminous efficiency. Materials which may be included in the hole transport region HTR may be used as materials included in the buffer layer (not shown). The electron blocking layer EBL may prevent electrons from being injected from the electron transport region ETR to the hole transport region HTR.

The emission layer EML is provided on the hole transport region HTR. The emission layer EML may have, for example, a thickness in a range of about 100 Å to about 1,000 Å. For example, emission layer EML may have a thickness in a range of about 100 Å to about 300 Å. The emission layer EML may have a layer formed of a single material, a layer formed of different materials, or a multi-layer structure having layers formed of different materials.

In the light emitting device ED according to an embodiment, the emission layer EML may include a polycyclic compound represented by Formula 1 below.

[Formula 1]

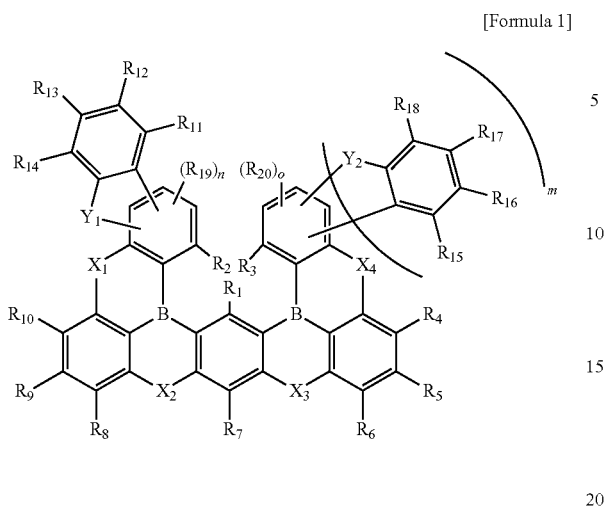

[Formula 2-1]

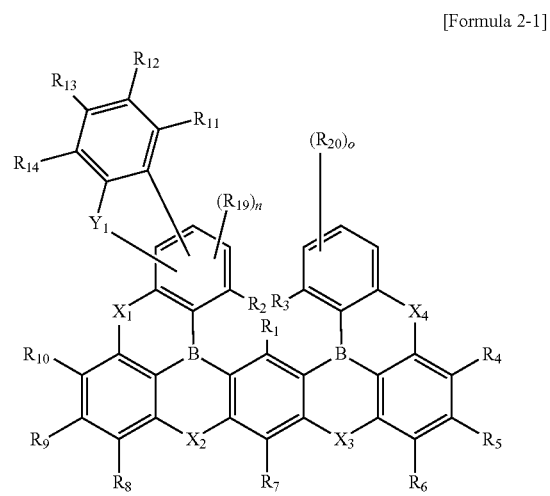

[Formula 2-2]

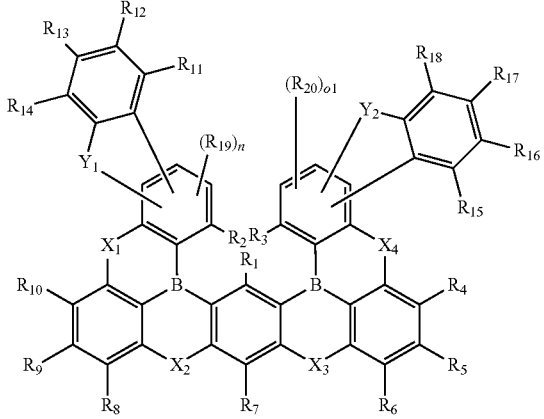

In Formula 1, m and n may each independently be 0 or 1.

In Formula 1, o may be an integer from 0 to 3. When m is 0, o may be an integer from 0 to 3, and when m is 1, o may be 0 or 1.

In Formula 1, $X_1$ to $X_4$ may each independently be N(Ra), C(Rb)(Rc), O, or S. $X_1$ to $X_4$ may be the same or different. For example, all of $X_1$ to $X_4$ may be the same, all of $X_1$ to $X_4$ may be different, or at least one of $X_1$ to $X_4$ may be different from the others. In an embodiment, at least one of $X_1$ to $X_4$ may be N(Ra), and Ra may be a substituted or unsubstituted phenyl group, a substituted or unsubstituted biphenyl group, or a substituted or unsubstituted terphenyl group.

In Formula 1, $Y_1$ and $Y_2$ may each independently be N(Rd), O, or S. $Y_1$ and $Y_2$ may be the same or different. In an embodiment, at least one of $Y_1$ and $Y_2$ may be N(Rd), and Rd may be a substituted or unsubstituted phenyl group.

In Formula 1, $R_1$ to $R_{20}$, and Ra to Rd may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms. All of $R_1$ to $R_{20}$ may be the same, or at least one may be different from the others. In an embodiment, $R_1$ to $R_{20}$ may each be a deuterium atom. In an embodiment, at least one of $R_1$ to $R_{20}$ may be an unsubstituted phenyl group. In an embodiment, at least one of $R_1$ to $R_{20}$ may be a substituted amine group.

In an embodiment, the polycyclic compound represented by Formula 1 may be represented by Formula 2-1 or Formula 2-2.

Formula 2-1 represents a case where m is 0 in Formula 1, and Formula 2-2 represents a case where m is 1 in Formula 1. In Formula 2-1 and Formula 2-2, n, o, $X_1$ to $X_4$, $Y_1$, $Y_2$, and $R_1$ to $R_{20}$ may be the same as defined in connection with Formula 1. In Formula 2-2, of may be 0 or 1.

In an embodiment, the polycyclic compound represented by Formula 1 may be represented by any one of Formulas 3-1 to 3-3 below.

[Formula 3-1]

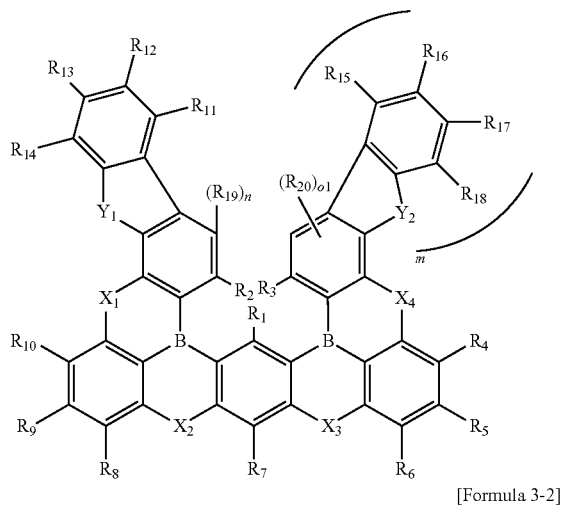

[Formula 3-2]

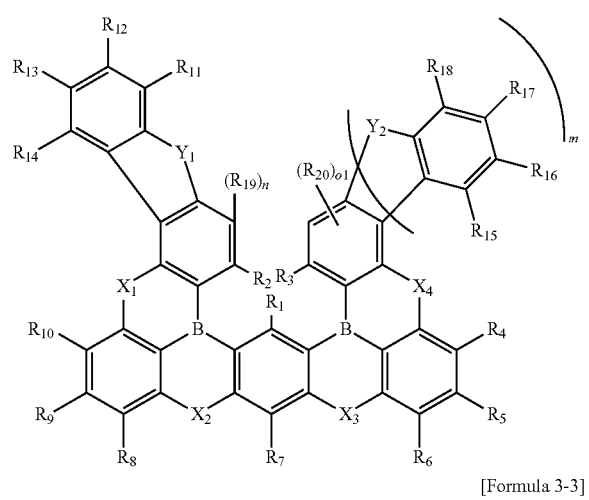

[Formula 3-3]

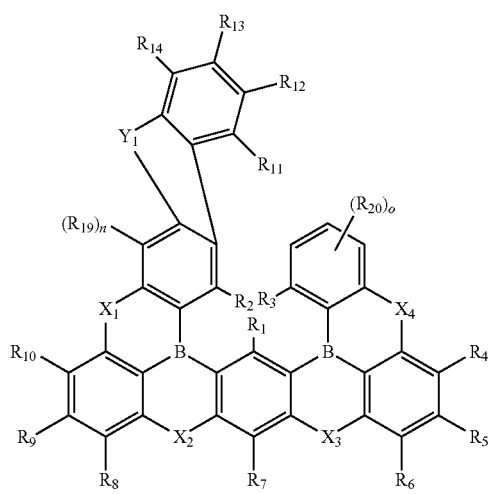

In Formula 3-1, $Y_1$ and $X_1$ are at an ortho-position, and $Y_2$ and $X_4$ are at an ortho-position. In Formula 3-2, $Y_1$ and $X_1$ are at a meta-position, $(R_{19})_n$ and $X_1$ are at a para-position, and $Y_2$ and $X_4$ are at a meta-position. In Formula 3-3, m is 0, $Y_1$ and $X_1$ are at a meta-position, and $(R_{19})_n$ and $X_1$ are at an ortho-position. In Formulas 3-1 to 3-3, m to o, $X_1$ to $X_4$, $Y_1$, $Y_2$, and $R_1$ to $R_{20}$ may be the same as defined in connection with Formula 1. In Formulas 3-1 and 3-1, o1 may be 0 or 1.

In an embodiment, in Formula 3-1 above, at least one of $R_{11}$ to $R_{18}$ may be an unsubstituted phenyl group. For example, any one of $R_{11}$ to $R_{18}$ may be an unsubstituted phenyl group, two of $R_{11}$ to $R_{18}$ may be an unsubstituted phenyl group, three of $R_{11}$ to $R_{18}$ may be an unsubstituted phenyl group, or all of $R_{11}$ to $R_{18}$ may be an unsubstituted phenyl group.

In an embodiment, the polycyclic compound represented by Formula 1 above may be represented by any one of Formulas 4-1 to 4-3 below.

[Formula 4-1]

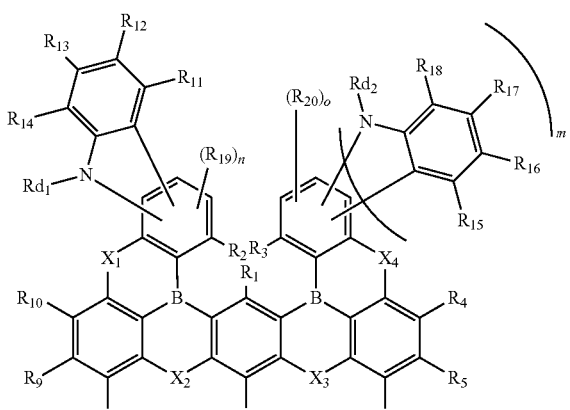

[Formula 4-2]

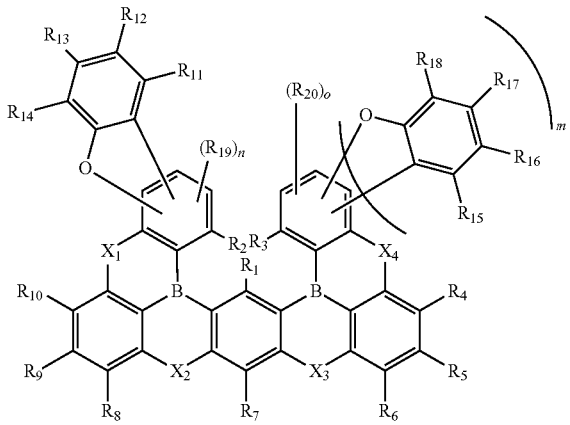

-continued

[Formula 4-3]

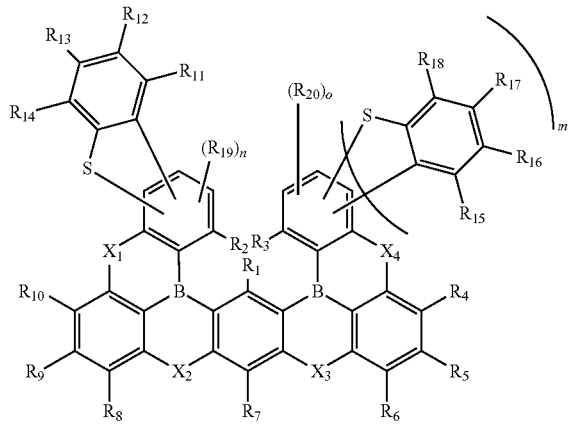

Formula 4-1 above represents a case in Formula 1 where $Y_1$ is $N(Rd_1)$ and $Y_2$ is $N(Rd_2)$, Formula 4-2 represents a case in Formula 1 where $Y_1$ and $Y_2$ are each O. Formula 4-3 represents a case in Formula 1 where $Y_1$ and $Y_2$ are each S.

In Formulas 4-1 to 4-3 above, m to o, $X_1$ to $X_4$, and $R_1$ to $R_{20}$ may be the same as defined in connection with Formula 1, and $Rd_1$ and $Rd_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms. $Rd_1$ and $Rd_2$ may be the same or different.

In an embodiment, the emission layer EML may include a polycyclic compound represented by Formula 1A below.

[Formula 1A]

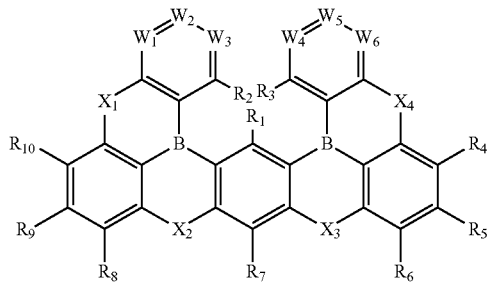

In Formula 1A above, among $W_1$ to $W_6$, at least one pair of a pair of adjacent two selected from $W_1$ to $W_3$ and a pair of adjacent two selected from $W_4$ to $W_6$ may be bonded to a groups represented by Formula 2, and the remainder of $W_1$ to $W_6$ may each independently C(Re).

In Formula 1A, $X_1$ to $X_4$ may each independently be N(Ra), C(Rb)(Rc), O, or S. In an embodiment, at least one of $X_1$ to $X_4$ may be N(Ra), and Ra may be a substituted or unsubstituted phenyl group, a substituted or unsubstituted biphenyl group, or a substituted or unsubstituted terphenyl group.

In Formula 1A, $R_1$ to $R_{10}$, Ra to Rc, and Re may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms. $X_1$ to $X_4$ may be the same or different from each other, and $R_1$ to $R_{10}$ may all be the same, or at least one may be different from the others. In an embodiment, all of $R_1$ to $R_{10}$ may be deuterium atoms. In an embodiment, at least one of $R_1$ to $R_{10}$ may be an unsubstituted phenyl group. In an embodiment, at least one of $R_1$ to $R_{10}$ may be a substituted amine group.

[Formula 2A]

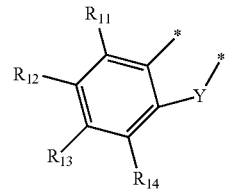

In Formula 2A above, Y may be N(Rd), O, or S.

In Formula 2A, $R_{11}$ to $R_{14}$, and Rd may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 carbon atoms. $R_{11}$ to $R_{14}$ may be the same or different. In Formula 2A,

/* represents a binding site to any one of $W_1$ to $W_6$ in Formula 1A.

In an embodiment, the group represented by Formula 2A may be represented by Formula 3A-1 or Formula 3A-2 below.

[Formula 3A-1]

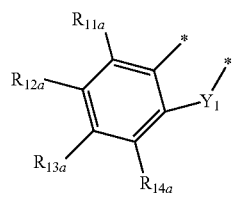

[Formula 3A-2]

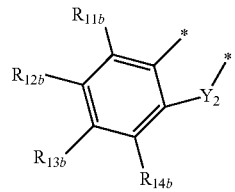

In Formula 3A-1, $Y_1$ may be $N(Rd_1)$, O, or S, and $Y_1$ may be bonded to $W_1$ or $W_2$. For example, $Y_1$ may be at an ortho-position or a meta-position with respect to $X_1$ in a benzene ring to which $R_2$ is bonded.

In Formula 3A-1, $R_{11a}$ to $R_{14a}$, and $Rd_1$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 carbon atoms. All of $R_{11a}$ to $R_{14a}$ may be the same, or at least one may be different from the others.

In Formula 3A-2, $Y_2$ may be $N(Rd_2)$, O, or S, and $Y_2$ may be bonded to $W_5$ or $W_6$. For example, $Y_2$ may be at an ortho-position or a meta-position with $X_4$ in a benzene ring to which $R_3$ is bonded.

In Formula 3A-2, $R_{11b}$ to $R_{14b}$, and $Rd_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 carbon atoms. All of $R_{11b}$ to $R_{14b}$ may be the same, or at least one may be different from the others.

In an embodiment, when a group represented by Formula 3A-1 is bonded to $W_1$ and $W_2$, a group represented by Formula 3A-2 above may be bonded to a $W_5$ and $W_6$, and when a group represented by Formula 3A-2 is bonded to $W_2$ and $W_3$, a group represented by Formula 3A-2 above may not be bonded to $W_4$ to $W_6$.

In an embodiment, $Y_1$ in Formula 3A-1 and $Y_2$ in Formula 3A-2 may be the same. For example, both $Y_1$ and $Y_2$ may be N(Rd), both may be O, or both may be S.

In an embodiment, the group represented by Formula 2A may be represented by one of Formulas 4A-1 to 4A-3 below.

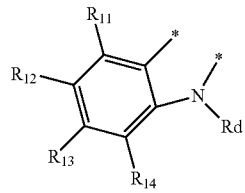

[Formula 4A-1]

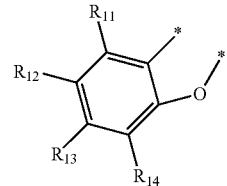

[Formula 4A-2]

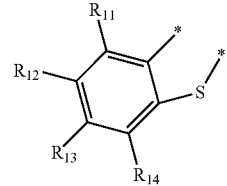

[Formula 4A-3]

Formula 4A-1 represents a case in Formula 2A where Y is N(Rd), Formula 4A-2 represents a case in Formula 2A where Y is O, and Formula 4A-3 represents a case in Formula 2A where Y is S.

In an embodiment, the emission layer EML may include at least one compound selected from Compound Group 1 below.

[Compound Group 1]

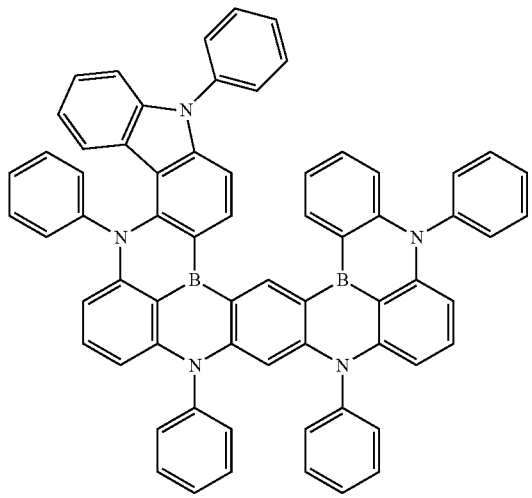

A-1

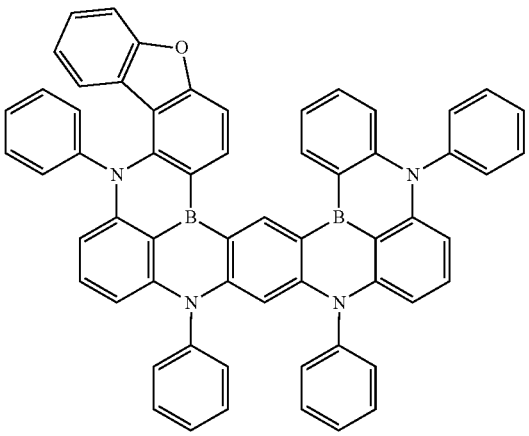

A-2

-continued
A-3
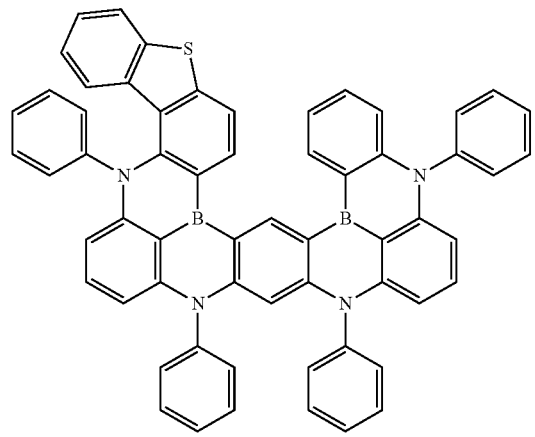
A-4
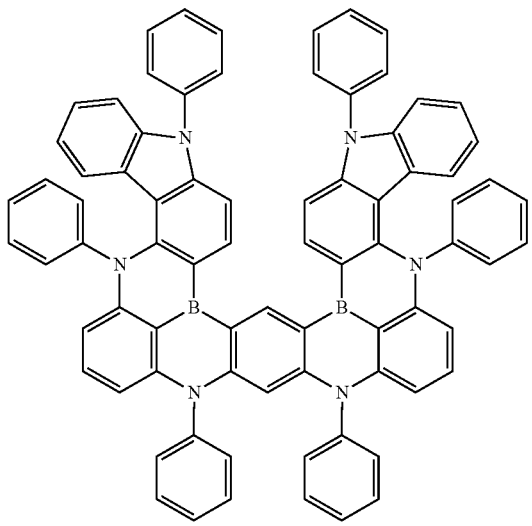
A-5
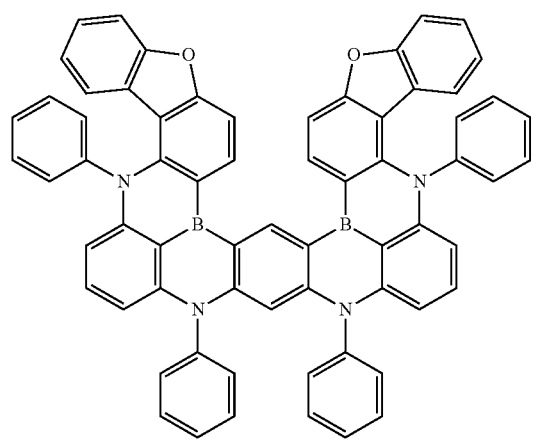
A-6
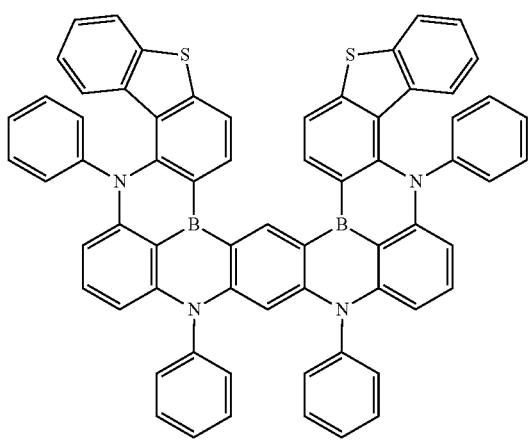
A-7
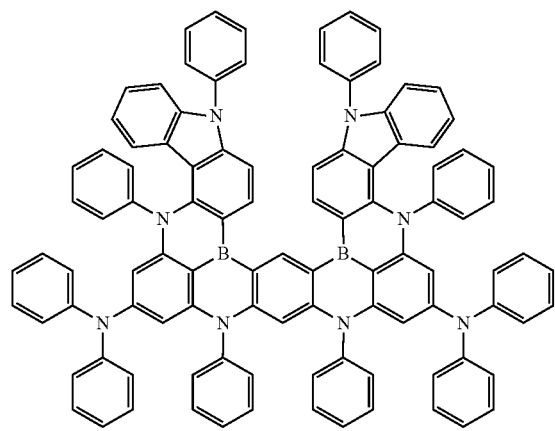
A-8
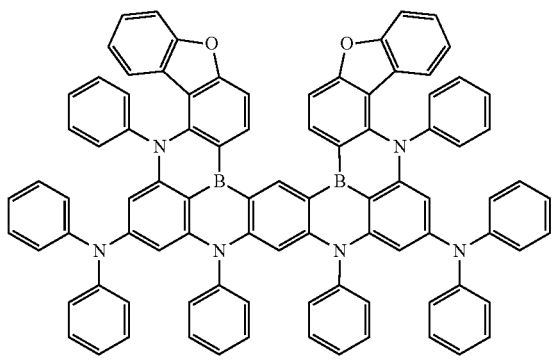

-continued
A-9
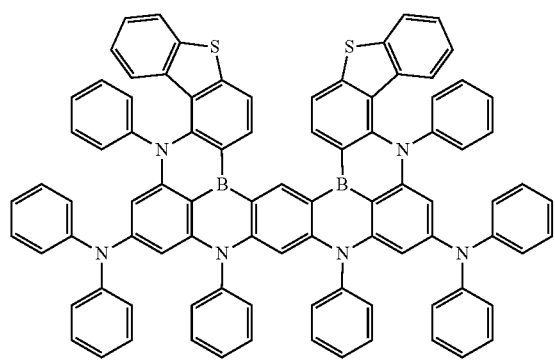
A-10
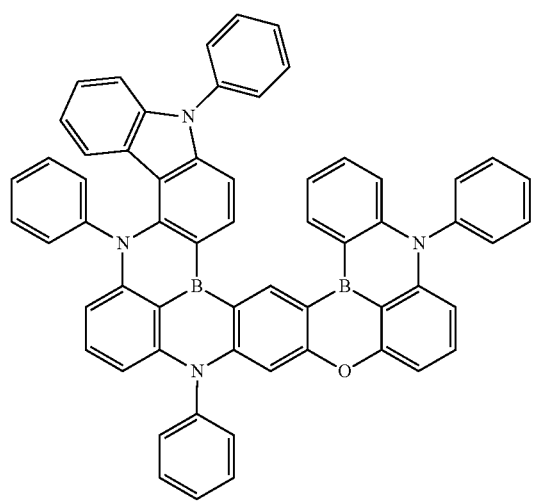
A-11
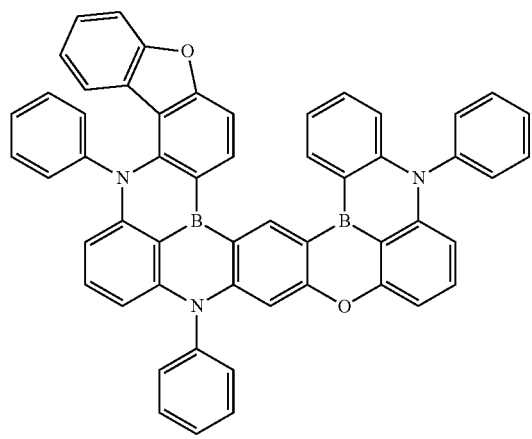
A-12
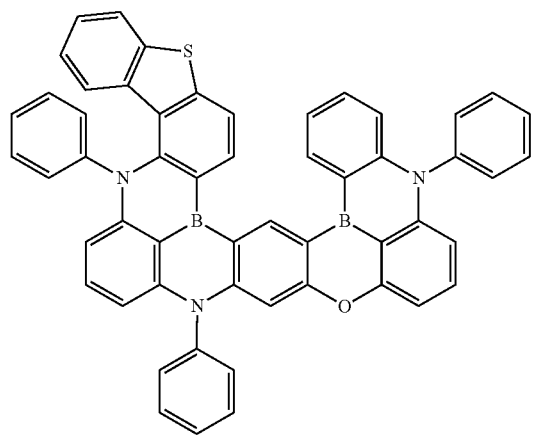
A-13
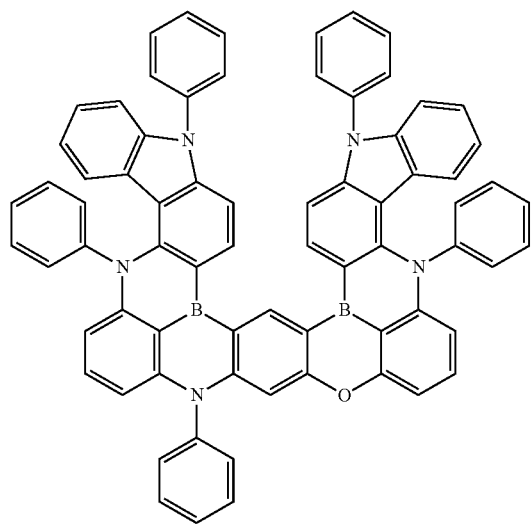
A-14
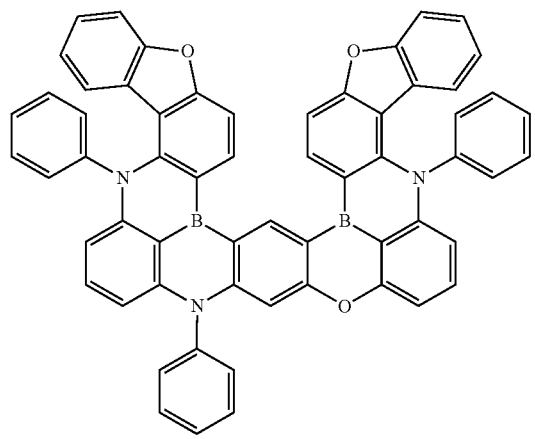

-continued
A-15
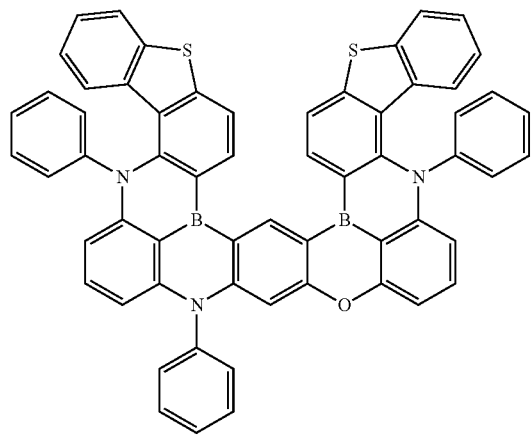
A-16
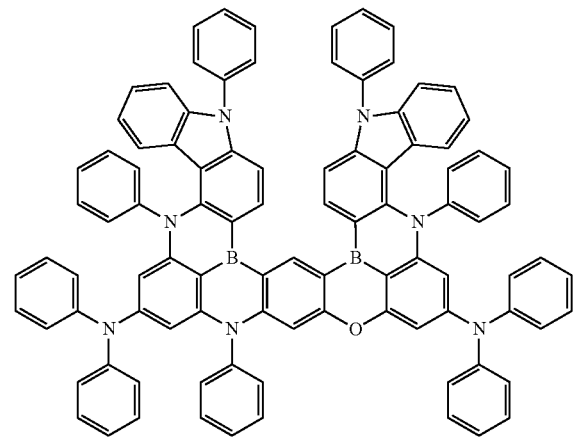
A-17
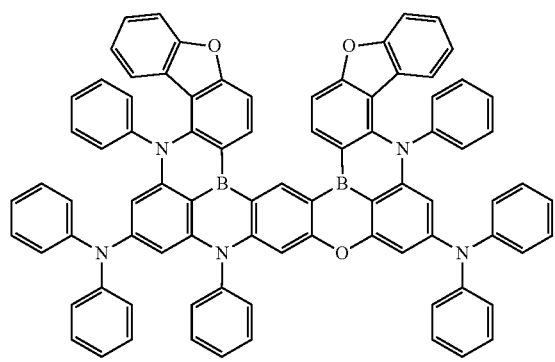
A-18
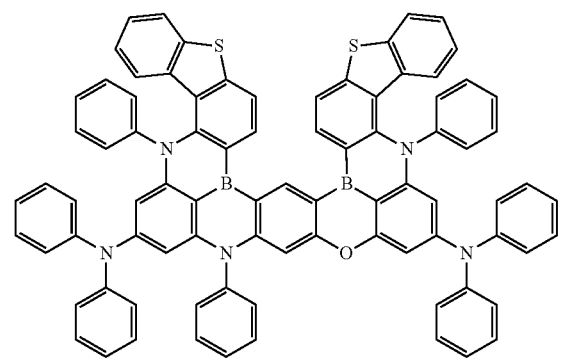
A-19
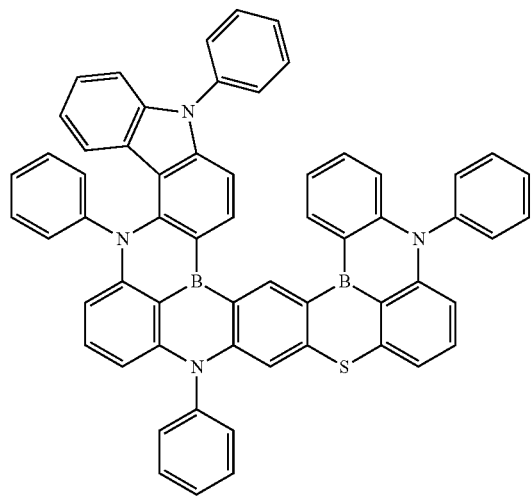
A-20
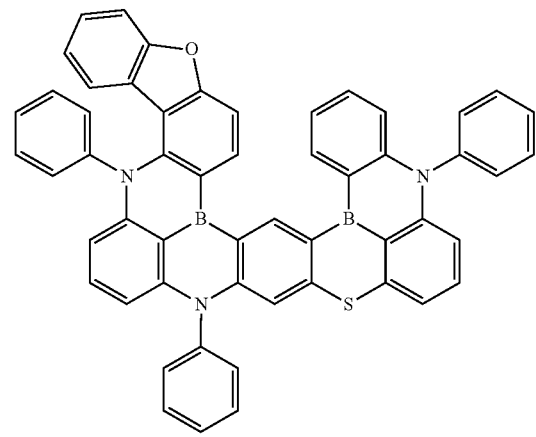

-continued
A-21
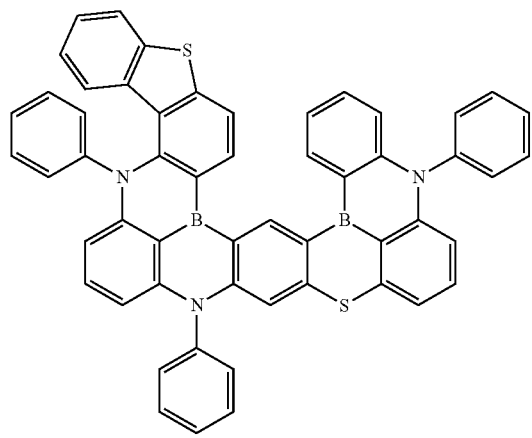
A-22
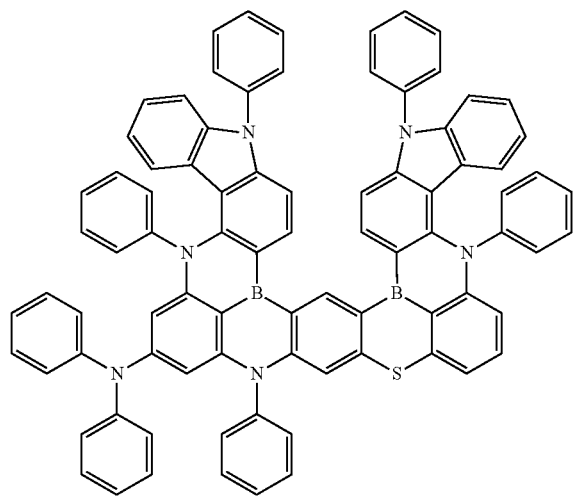
A-23
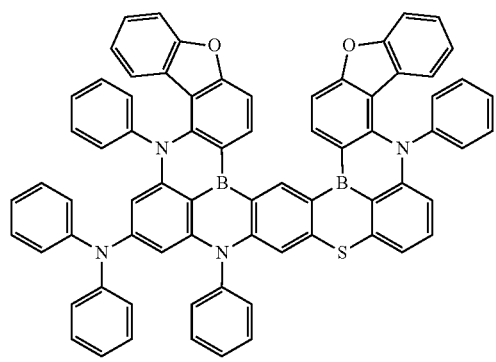
A-24
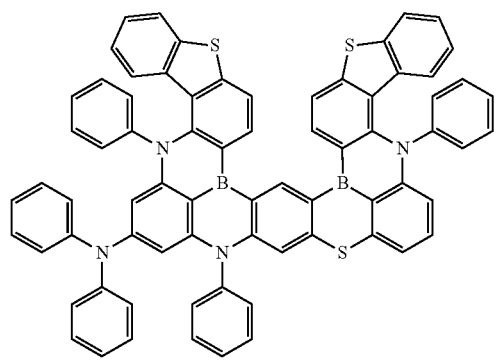
A-25
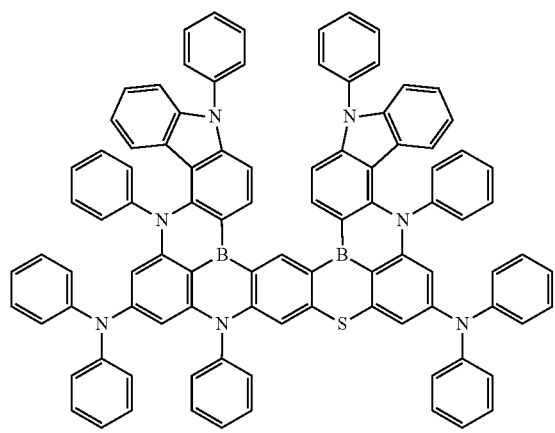
A-26
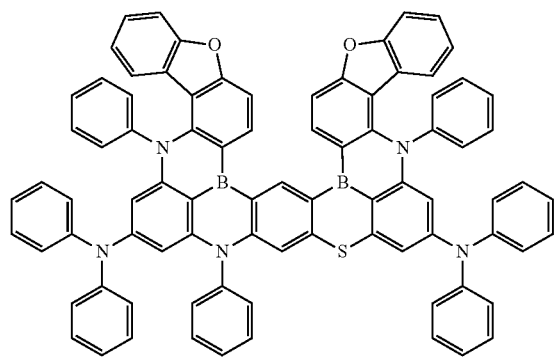

-continued
A-27
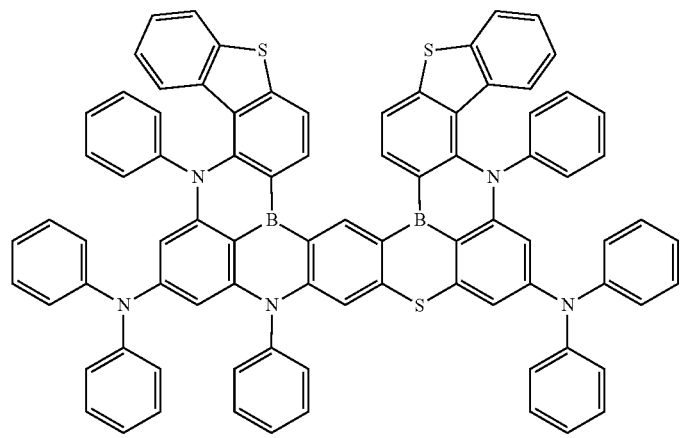
A-28
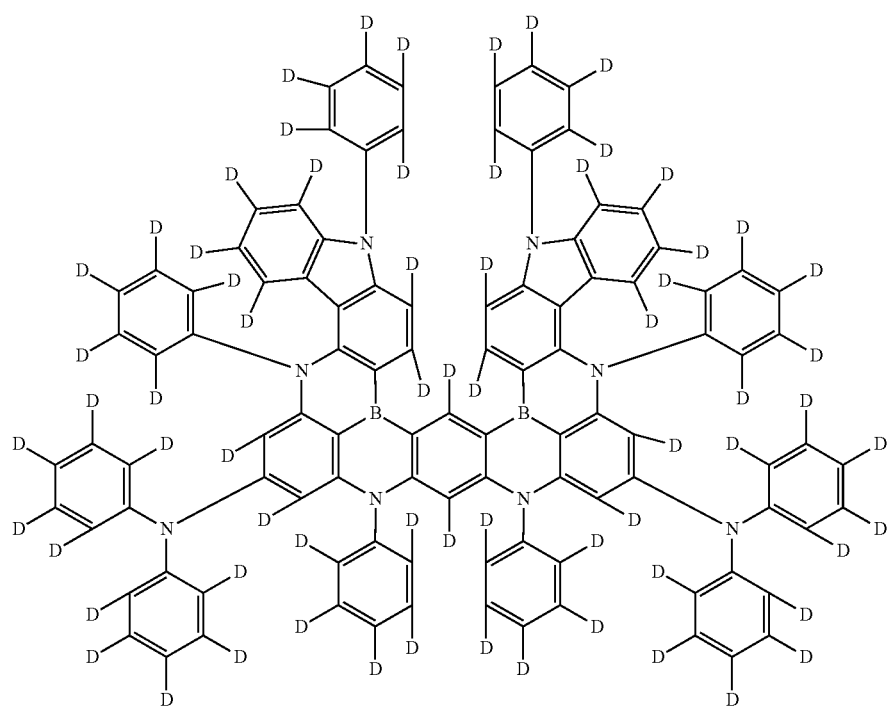

-continued
A-29
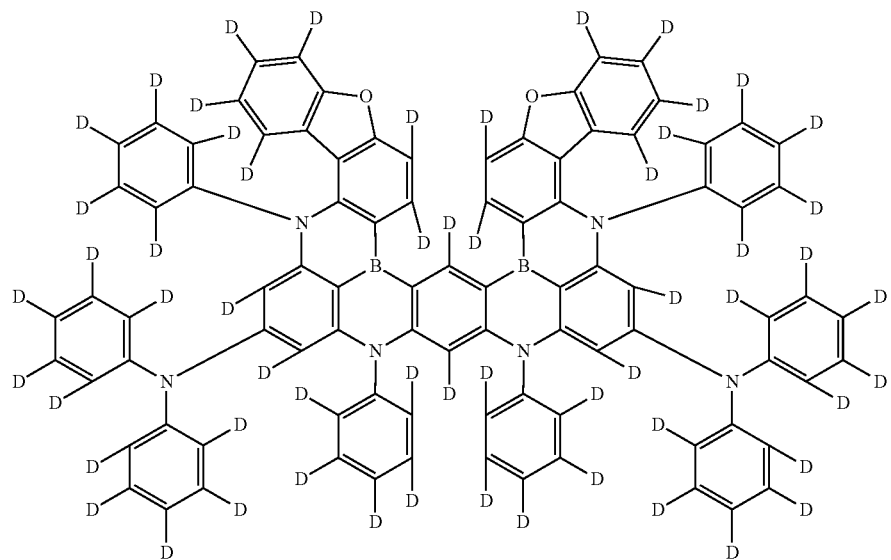
A-30
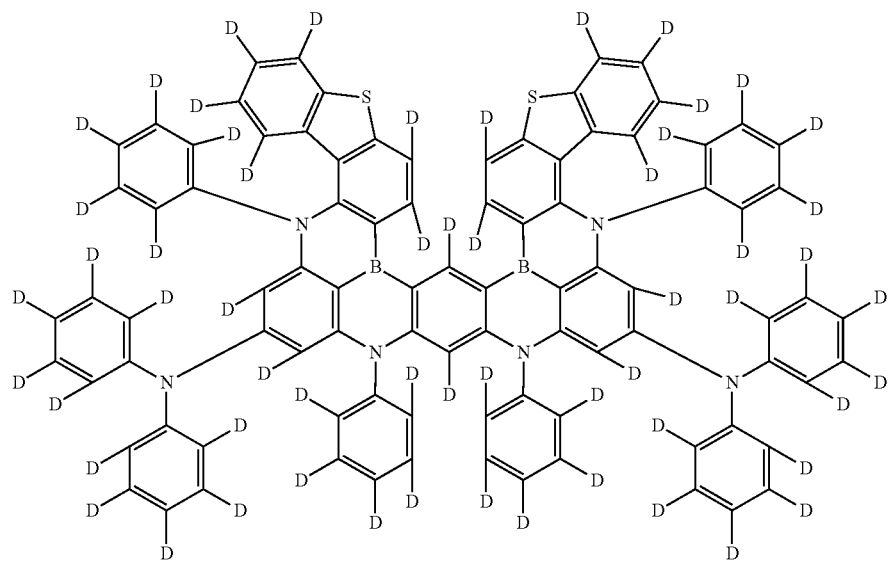
A-31
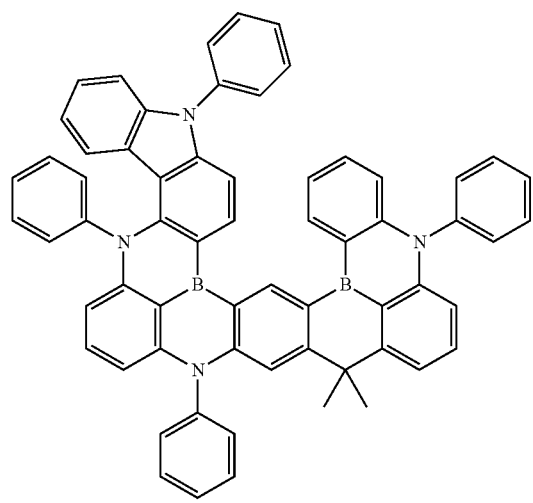
A-32
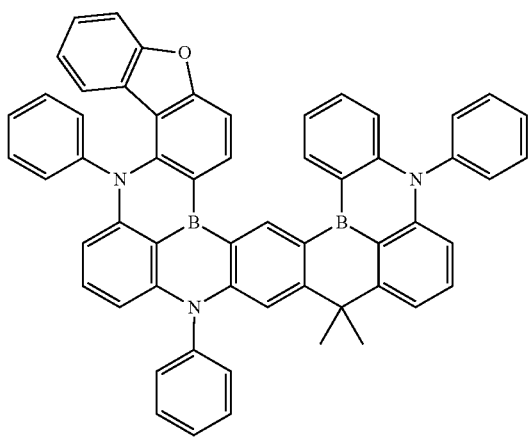

-continued
A-33
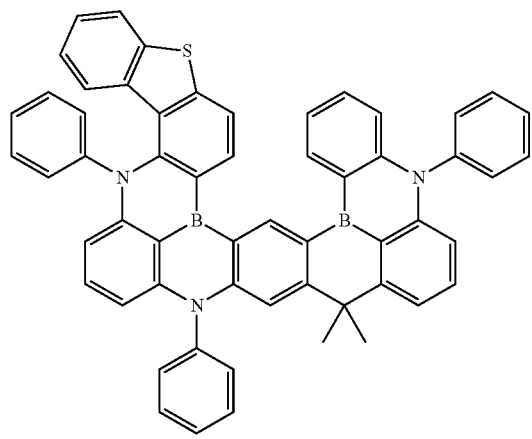
A-34
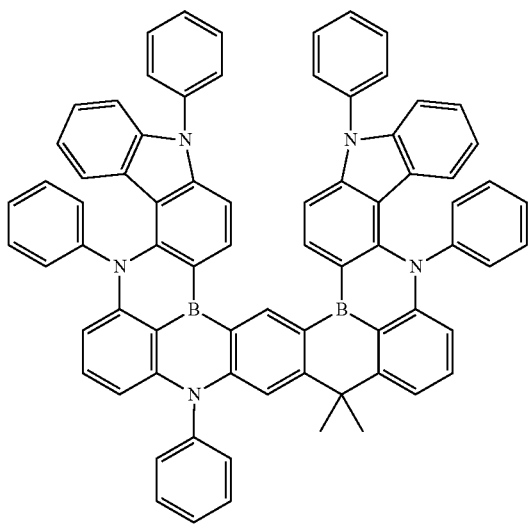
A-35
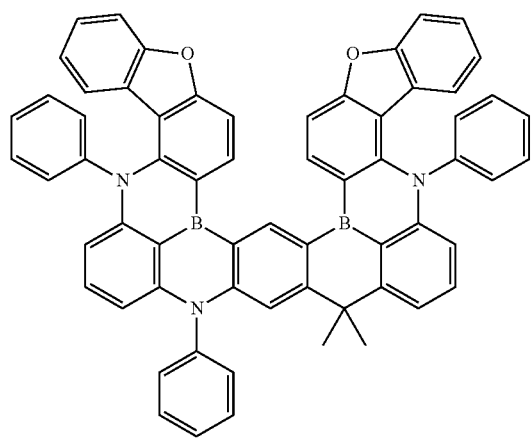
A-36
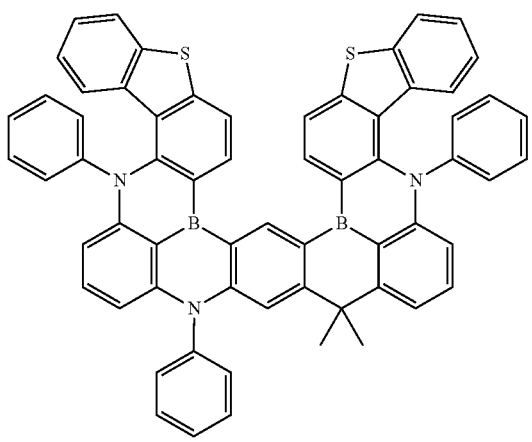
A-31
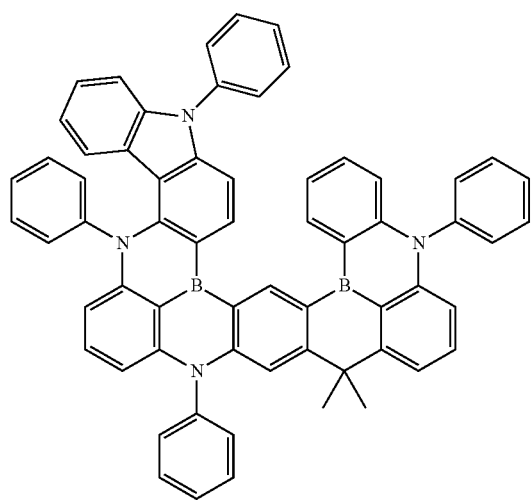
A-32
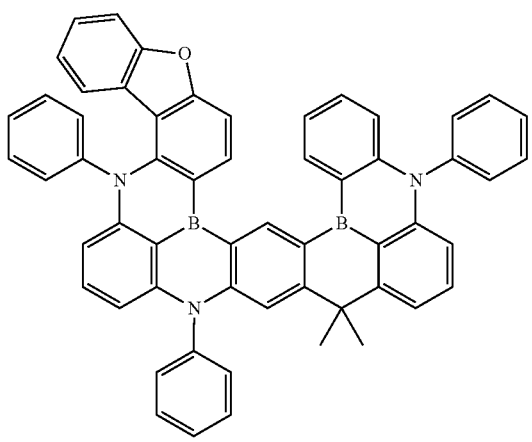

-continued
A-33
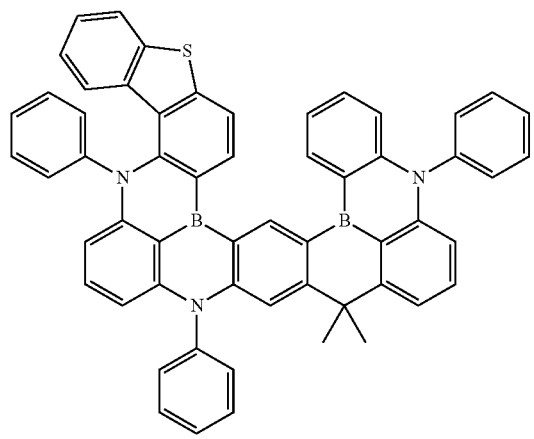
A-34
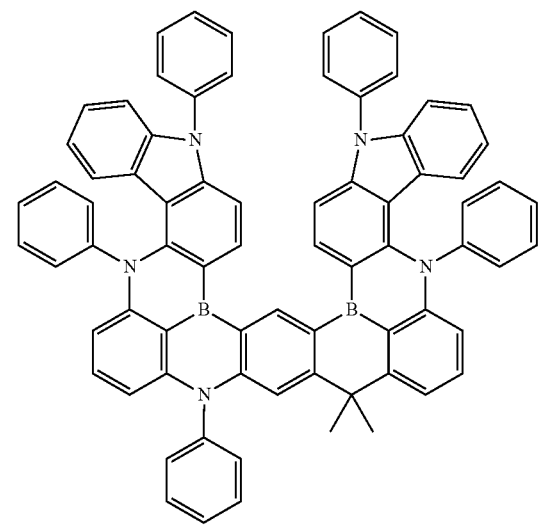
A-35
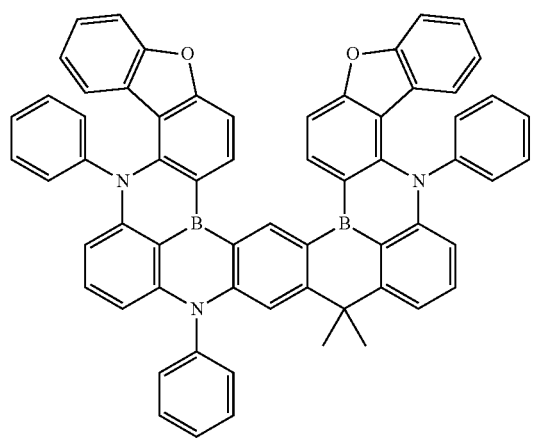
A-36
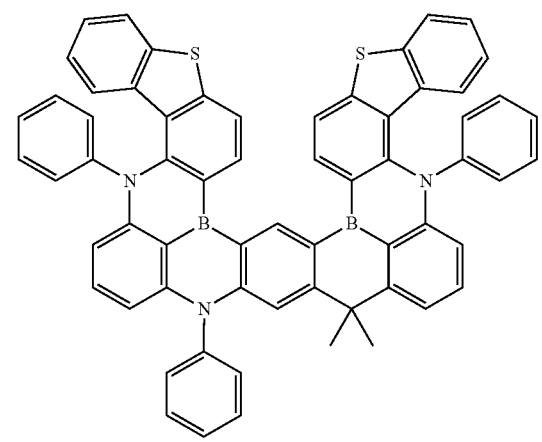
A-37
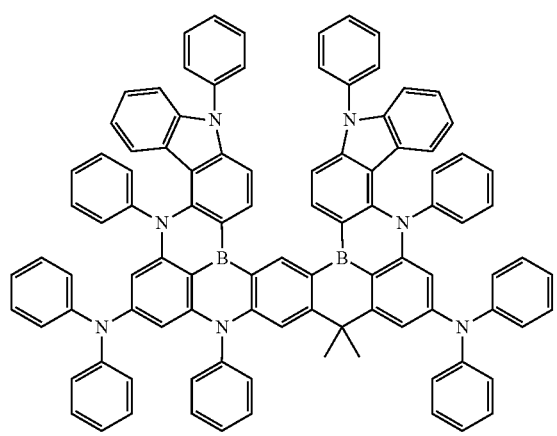
A-38
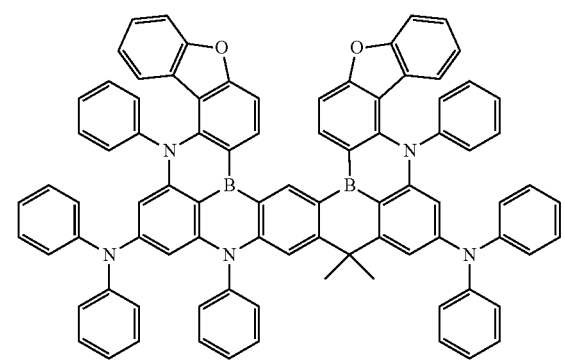

-continued
A-39
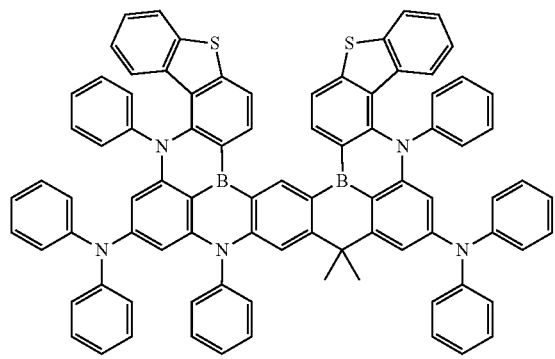
A-40
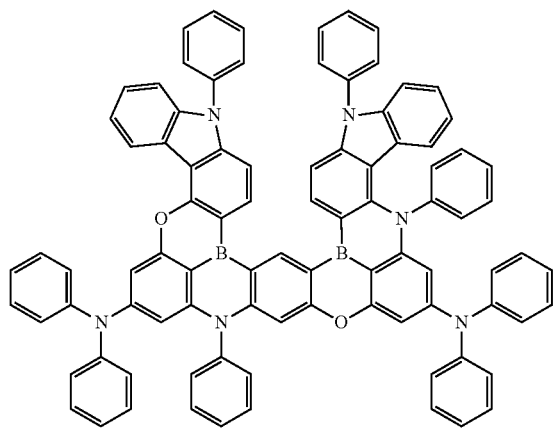
A-41
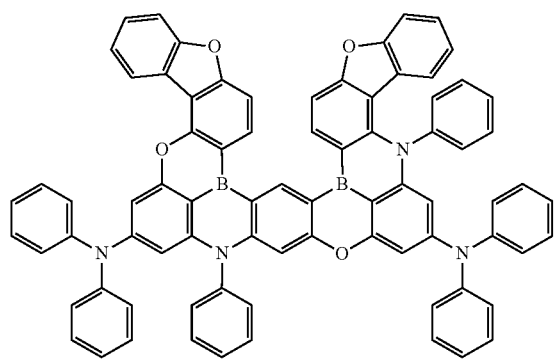
A-42
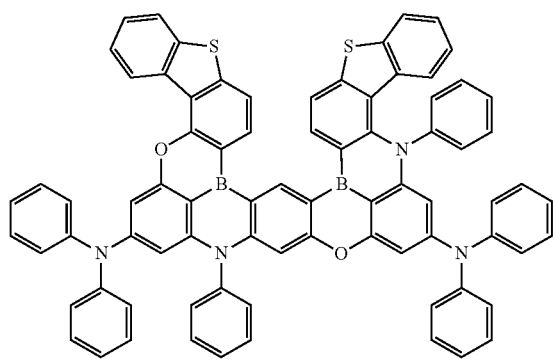
A-43
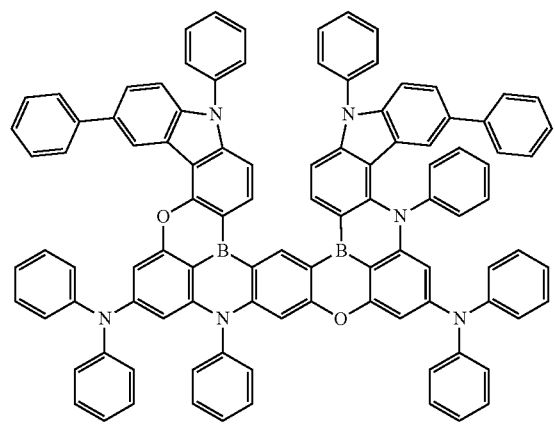
A-44
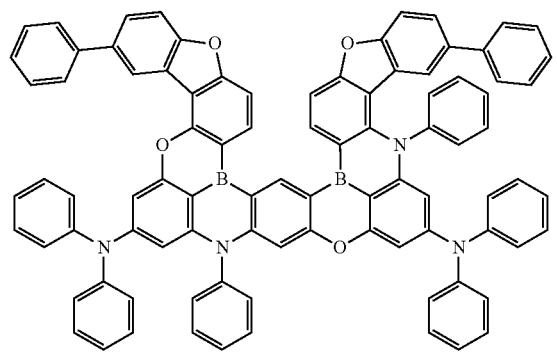

A-45
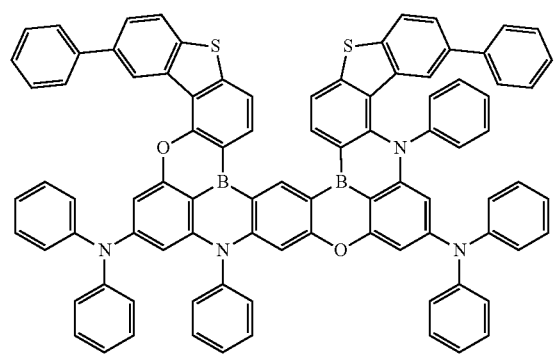
B-1
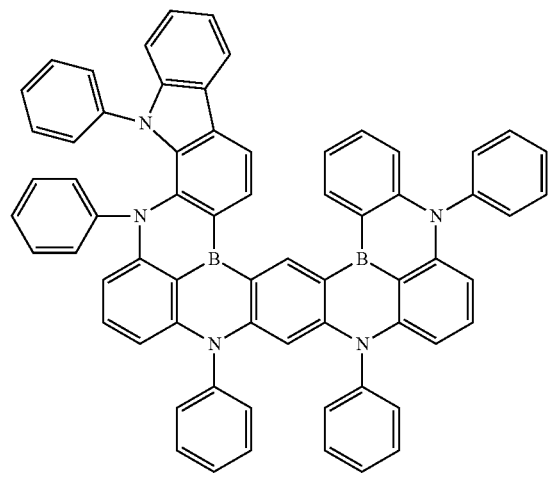
B-2
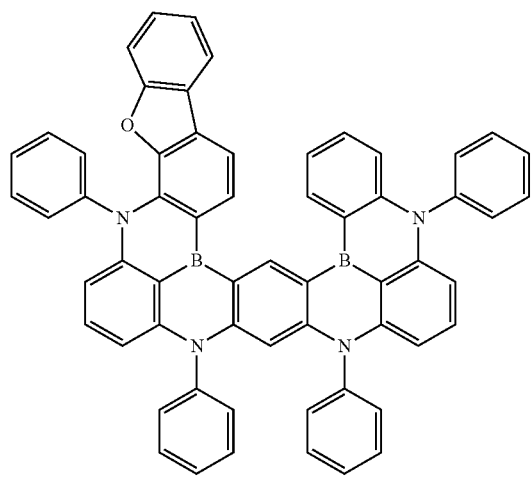
B-3
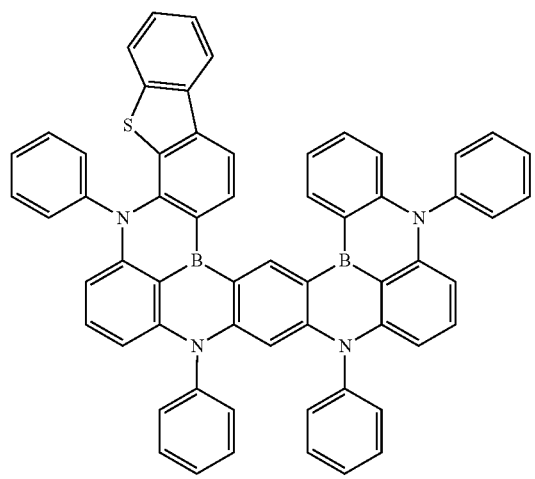
B-4
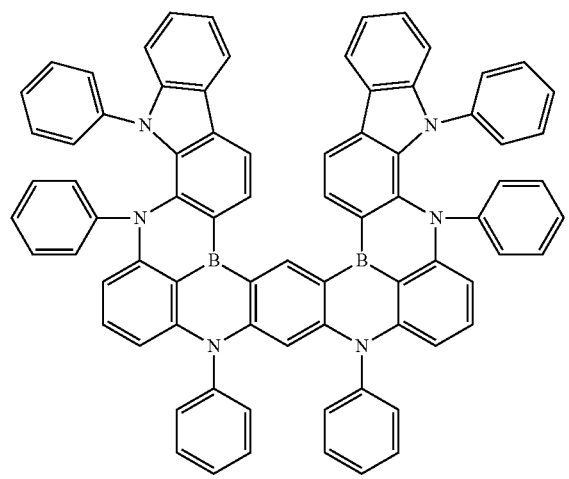
B-5
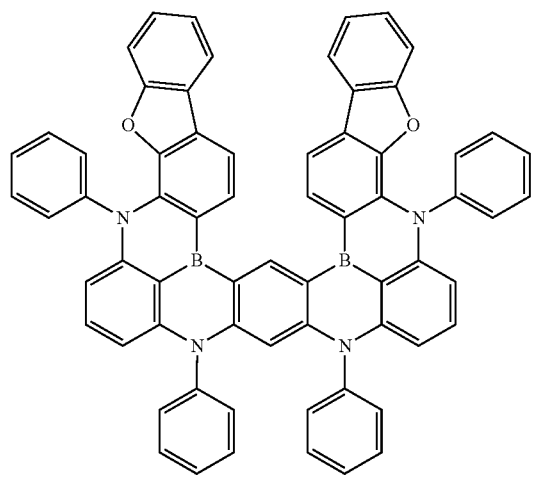

B-6
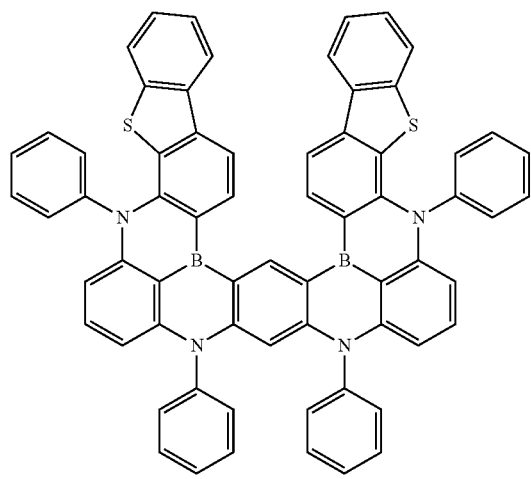
B-7
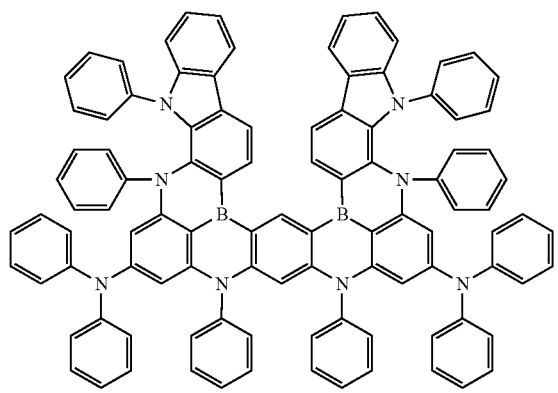
B-8
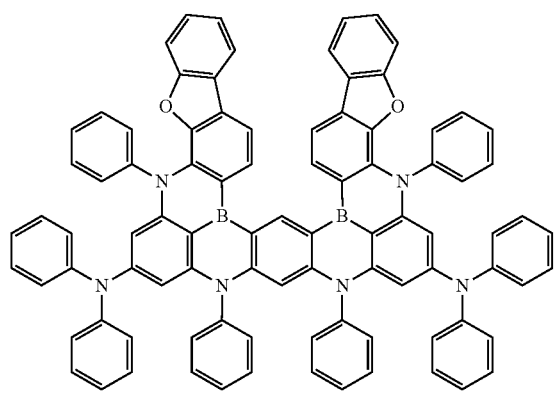
B-9
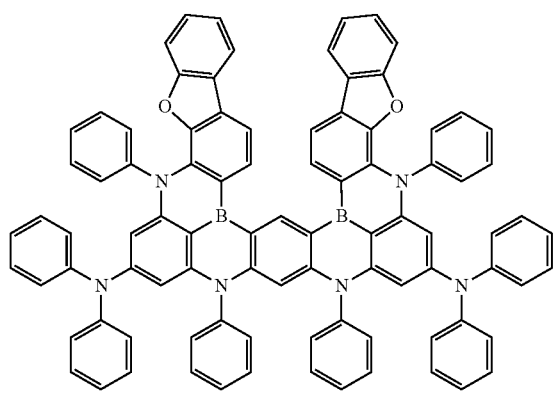
B-10
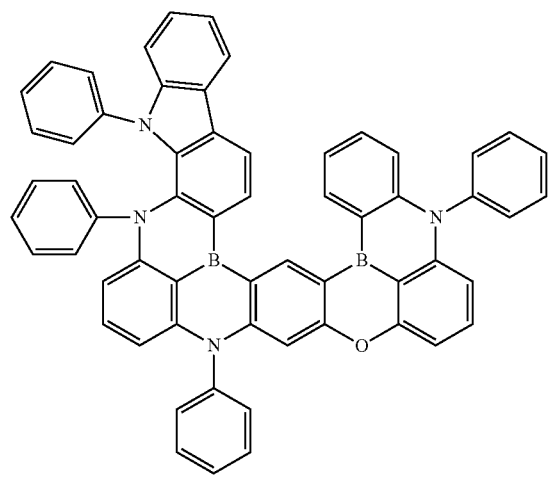
B-11
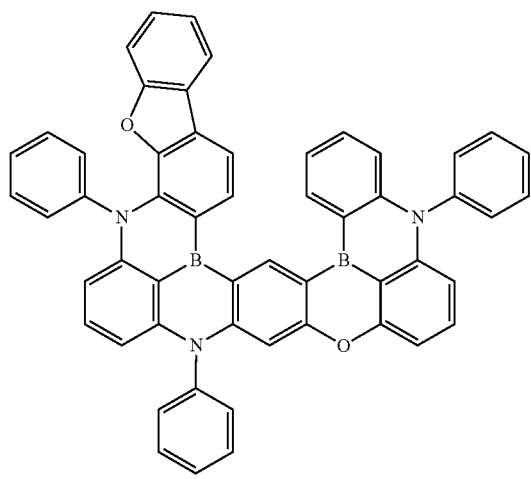

-continued
B-12
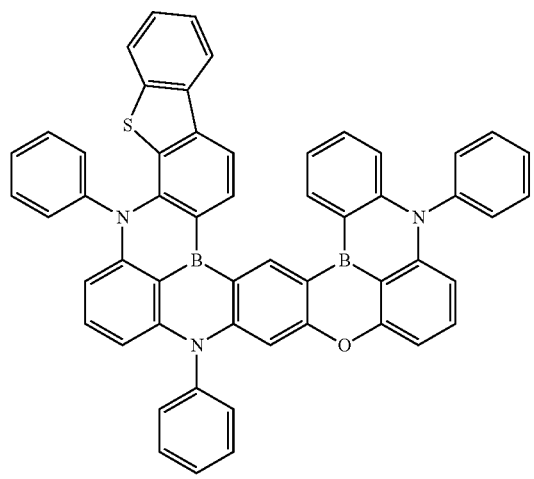
B-13
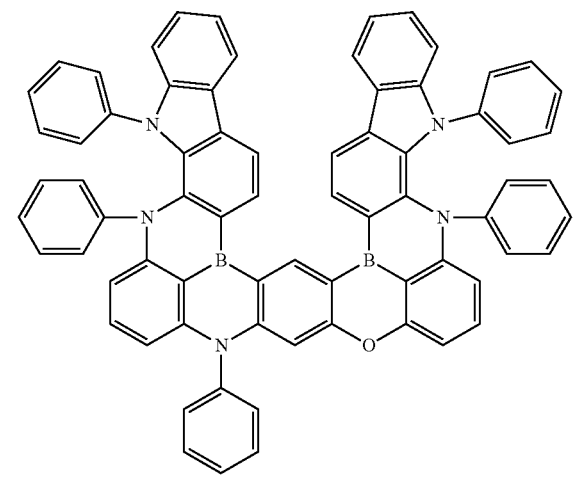
B-14
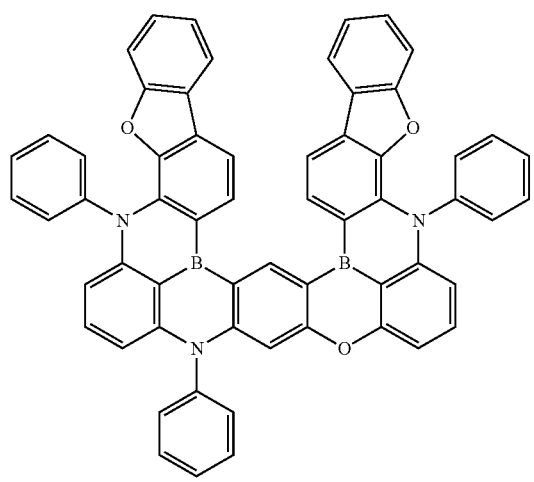
B-15
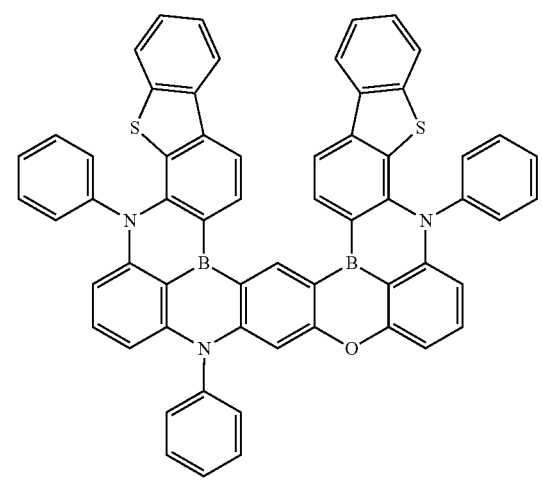
B-16
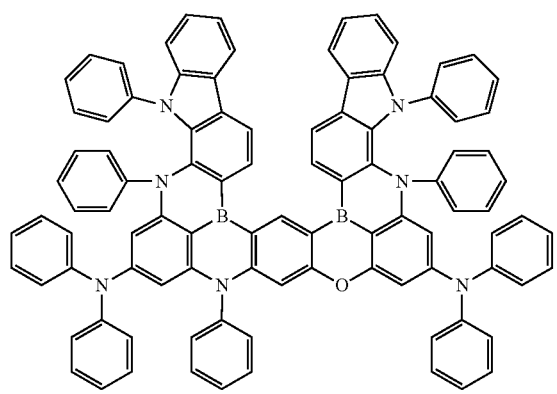
B-17
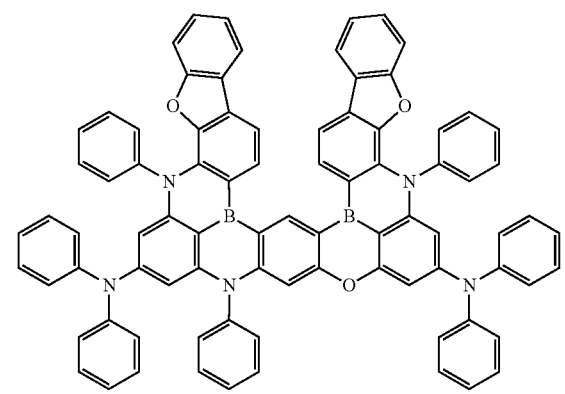

-continued
B-18
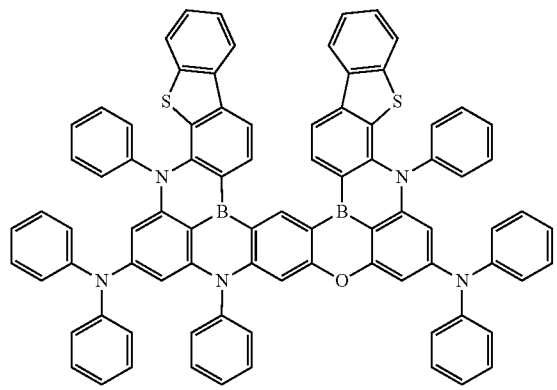
B-19
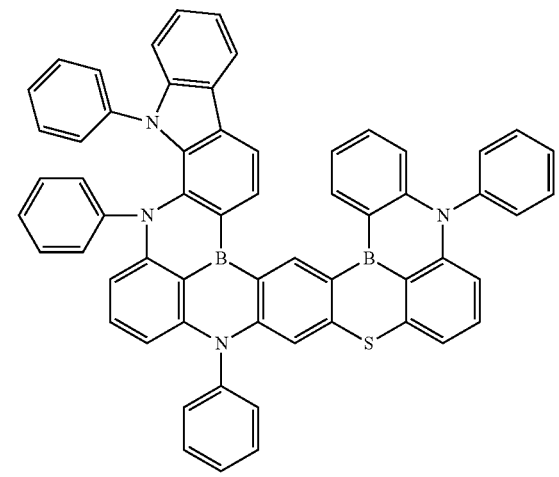
B-20
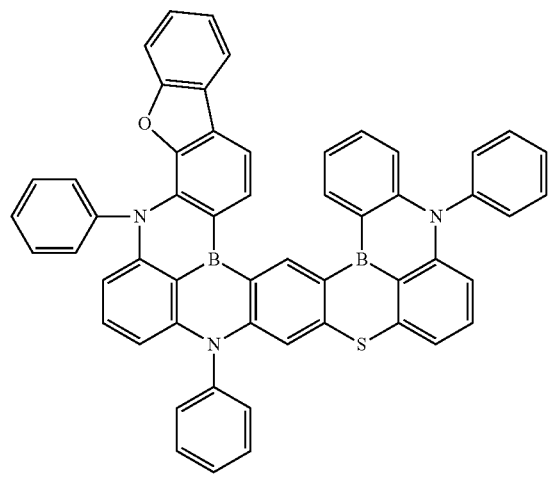
B-21
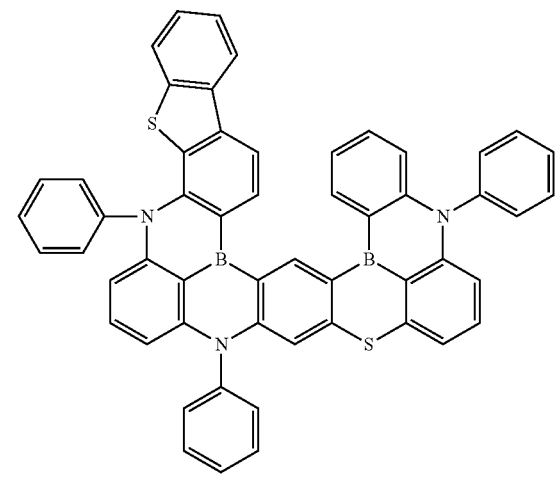
B-22
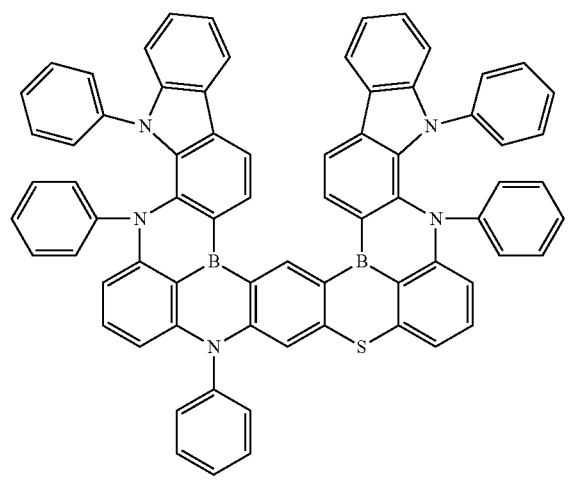
B-23
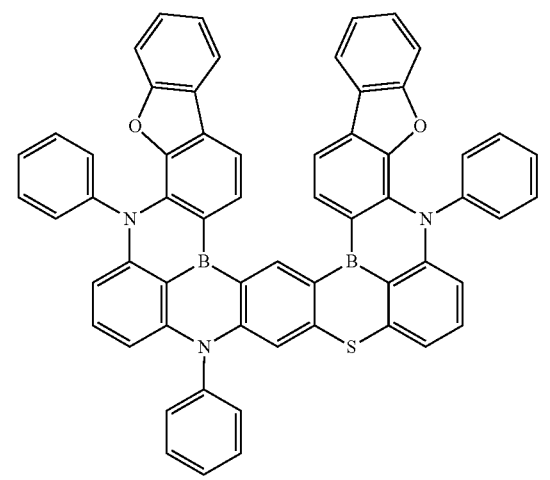

-continued
B-24
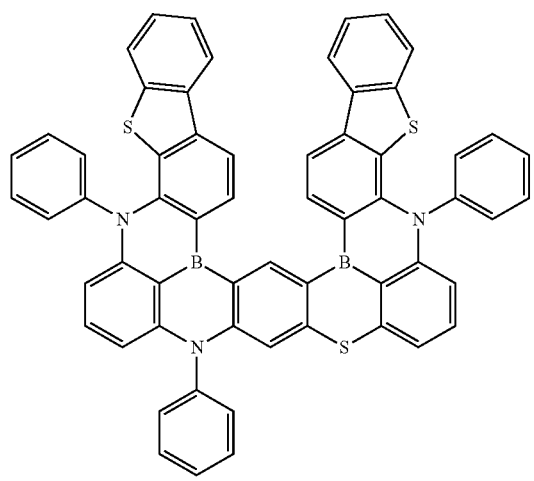
B-25
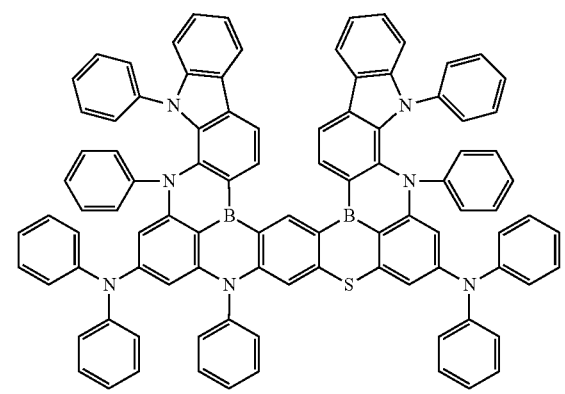
B-26
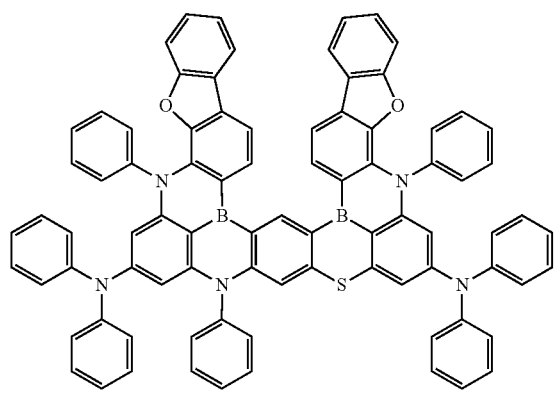
B-27
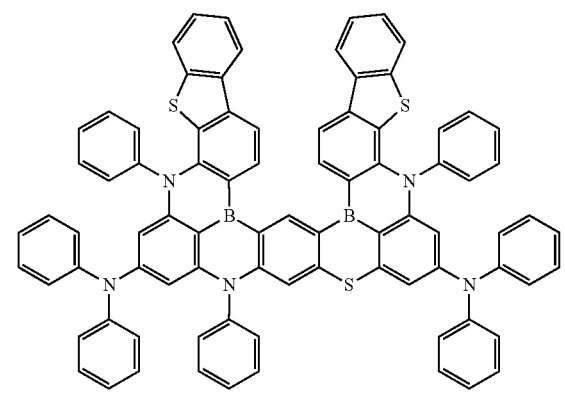
B-28
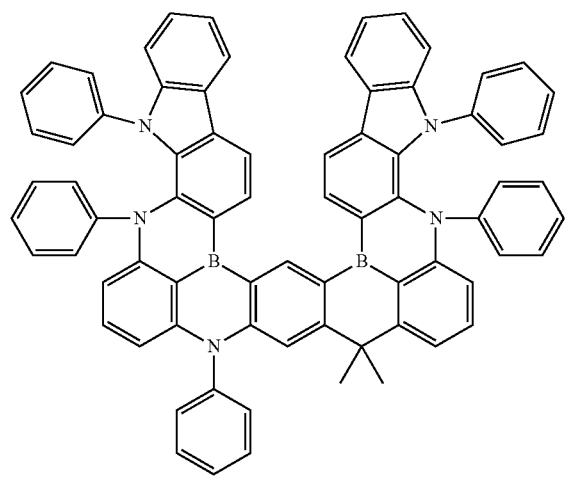
B-29
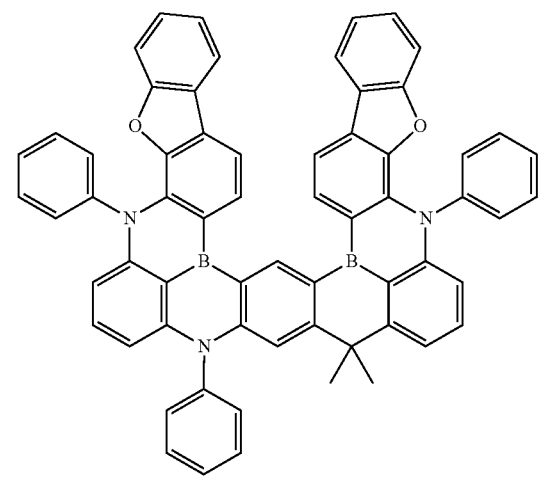

-continued
B-30
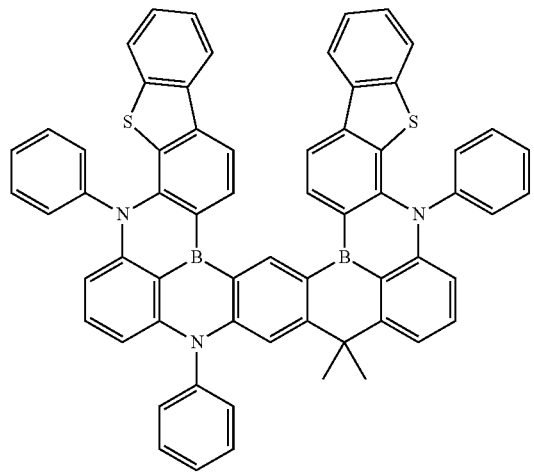
B-31
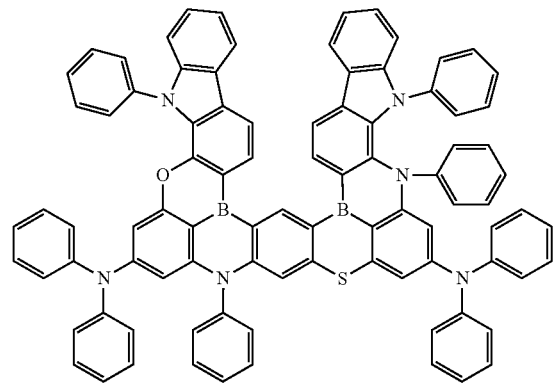
B-32
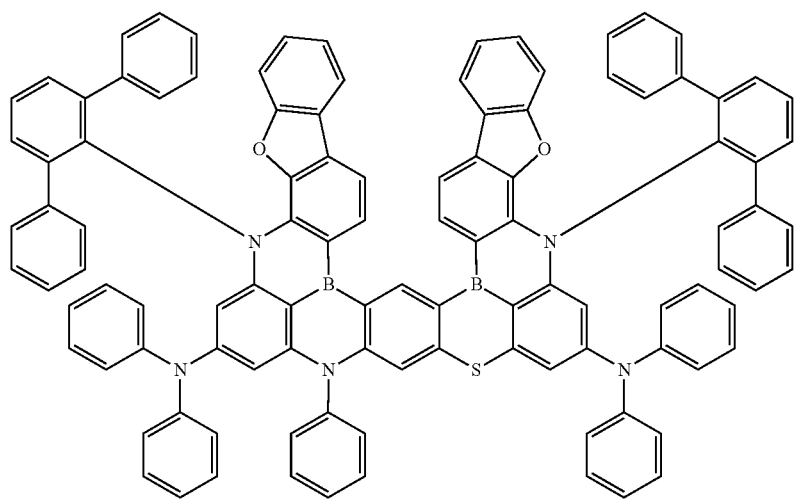
B-33
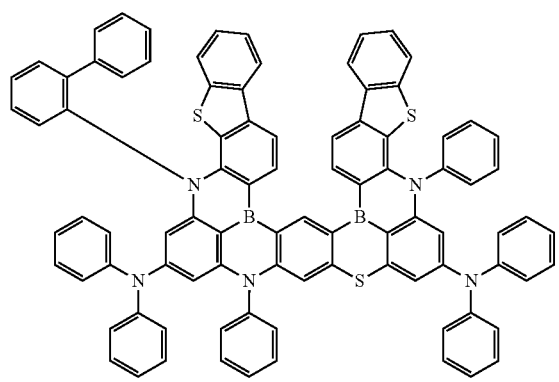
B-34
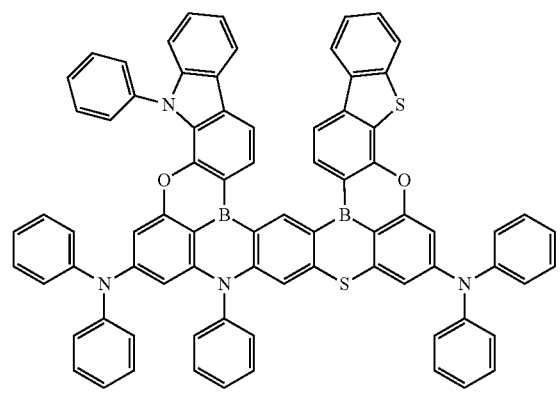

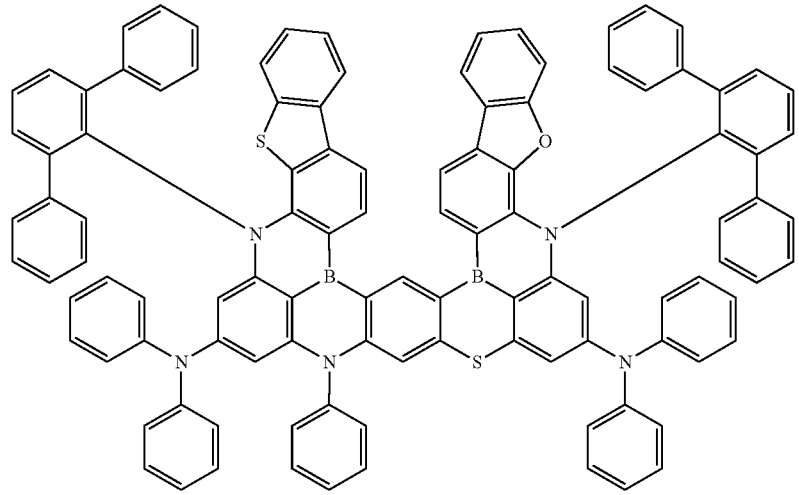
B-35
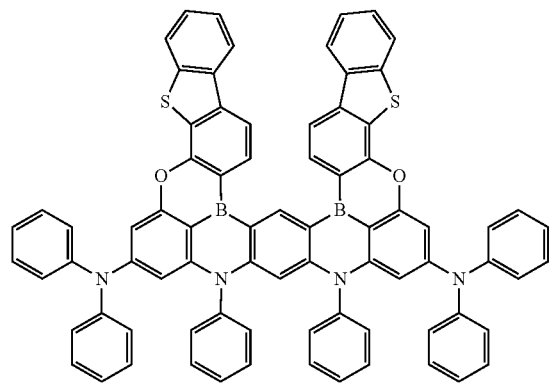
B-36
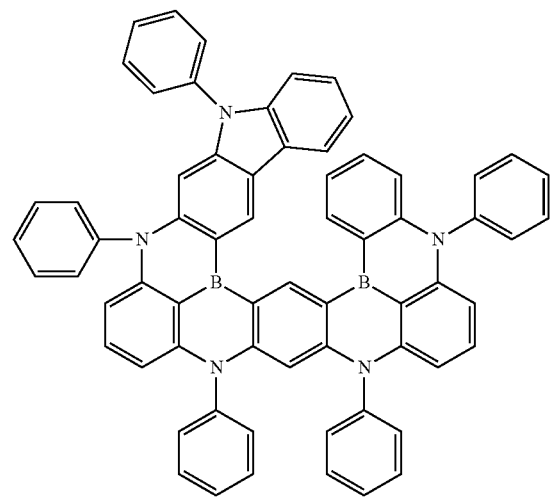
C-1
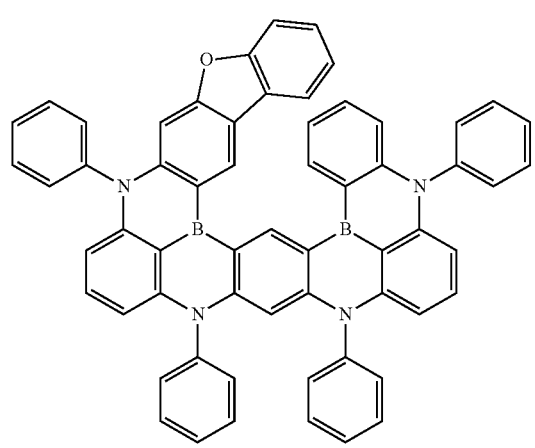
C-2
C-3

-continued
C-4
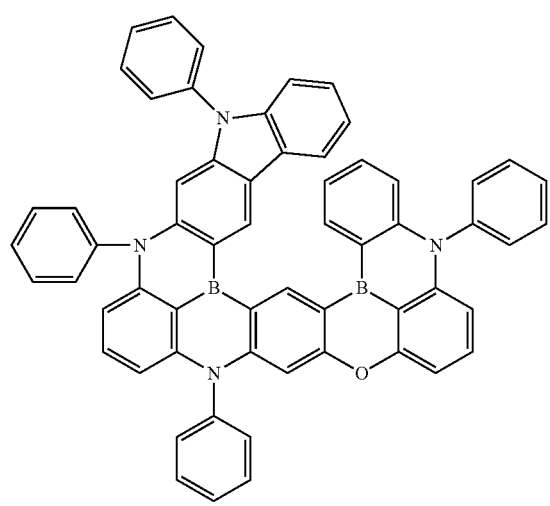
C-5
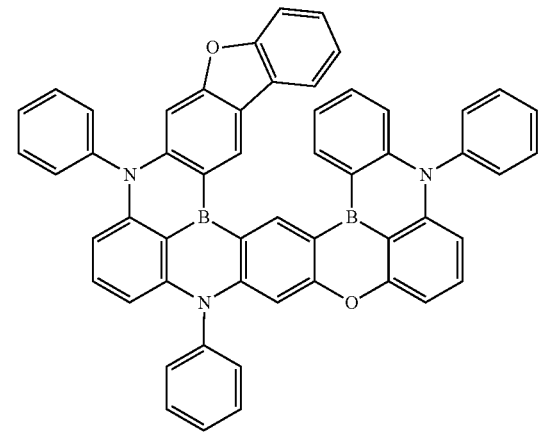
C-6
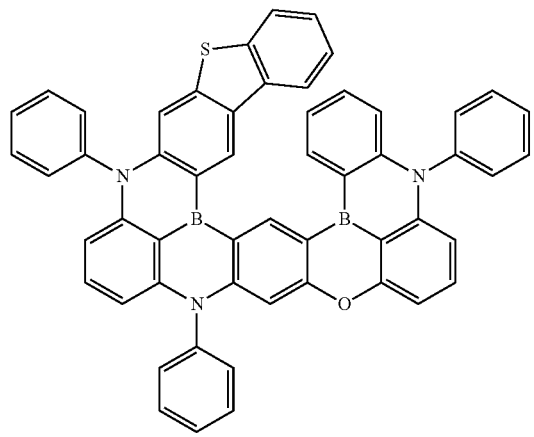
C-7
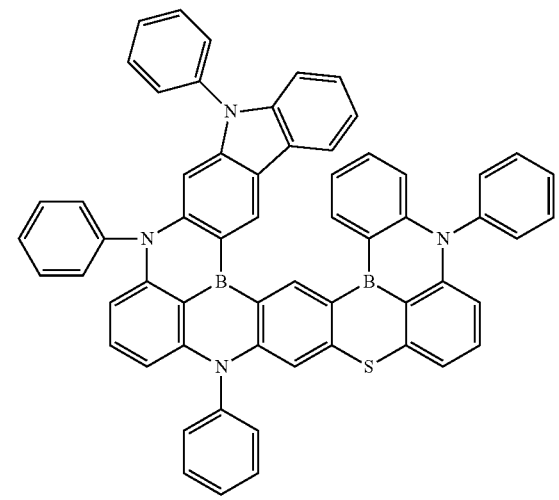
C-8
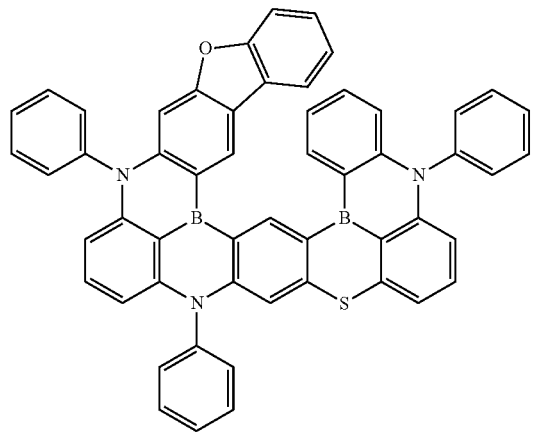
C-9
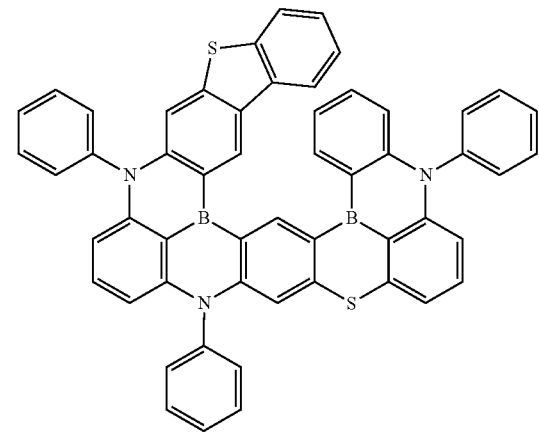

-continued
C-10
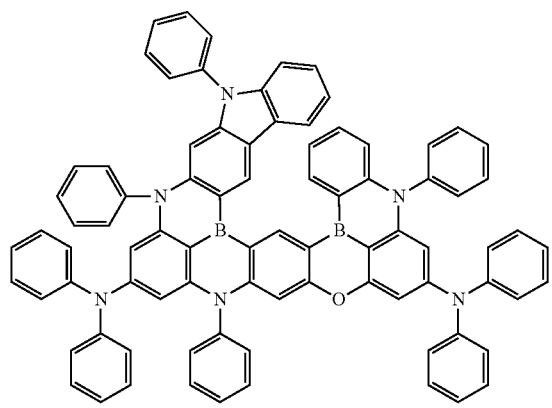
C-11
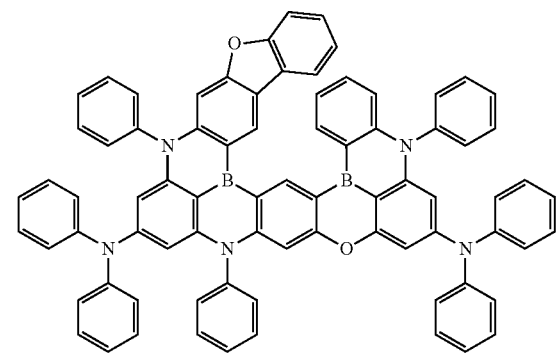
C-12
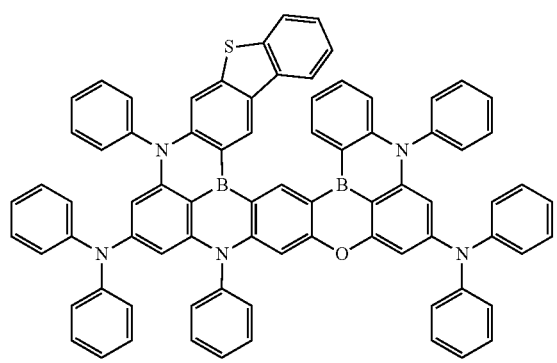
C-13
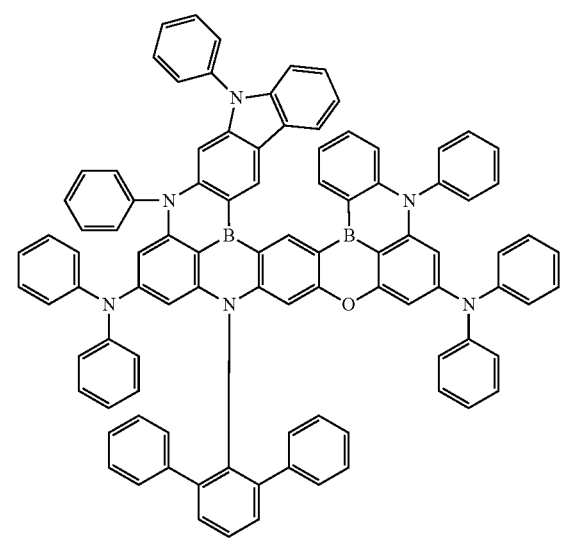
C-14
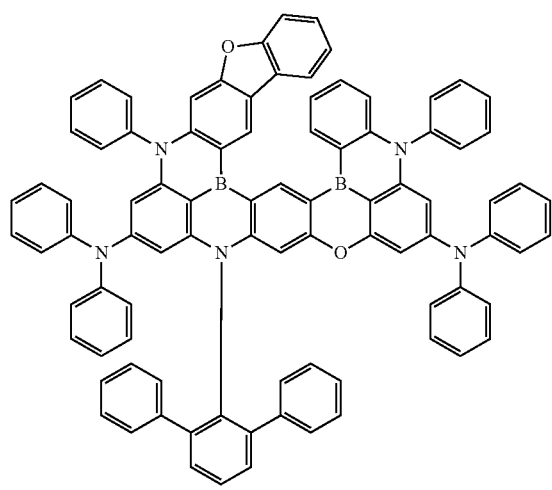
C-15
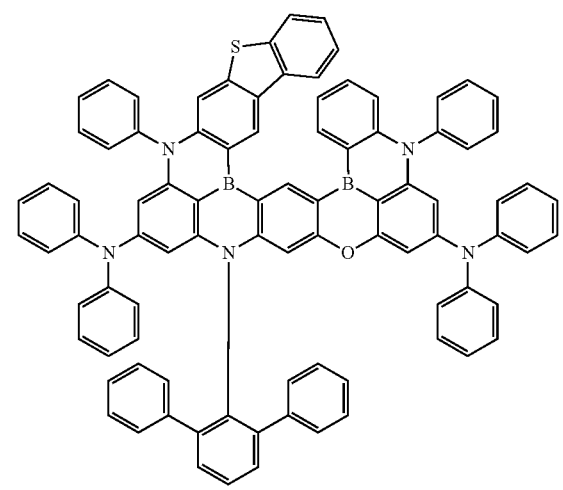

-continued

C-16

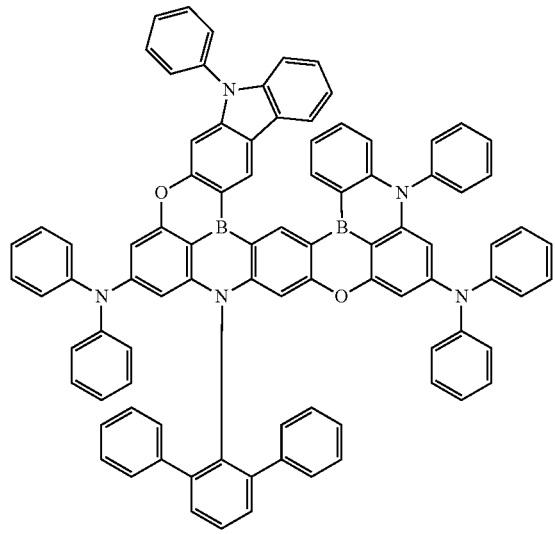

C-17

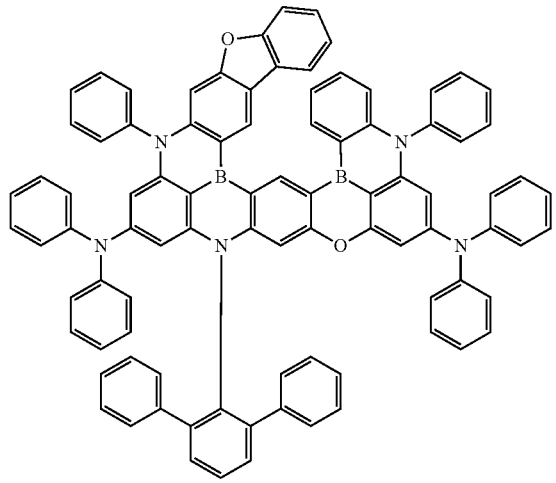

C-18

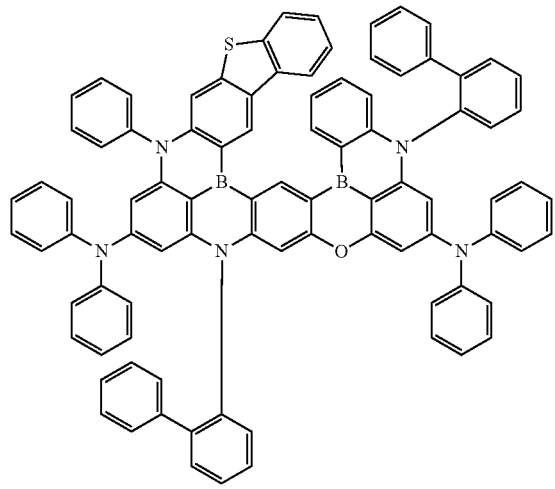

In an embodiment, the polycyclic compound represented by Formula 1 may emit blue light.

In the light emitting device ED shown in FIGS. 3 to 6, the emission layer EML may include a host and a dopant. The dopant may include the polycyclic compound according to an embodiment. For example, the polycyclic compound according to an embodiment may be used as a dopant material for an emission layer that emits thermally activated delayed fluorescence. In an embodiment, the emission layer containing the polycyclic compound of an embodiment may emit light having a central emission wavelength in a range of about 430 nm to about 490 nm.

The emission layer EML may further include emission layer materials that will be described below in addition to the polycyclic compound according to an embodiment.

The emission layer EML may further include a compound represented by Formula E-1 below. The compound represented by Formula E-1 below may be used as a fluorescent host material.

[Formula E-1]

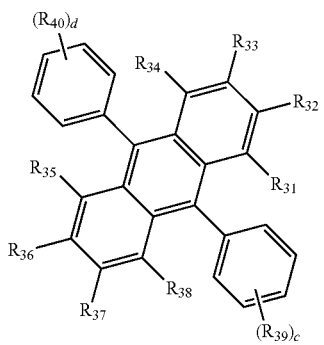

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or unsaturated hydrocarbon ring.

In Formula E-1, c and d may each independently be an integer from 0 to 5.

The compound represented by Formula E-1 may be any one selected from Compounds E1 to E19 below.

E1

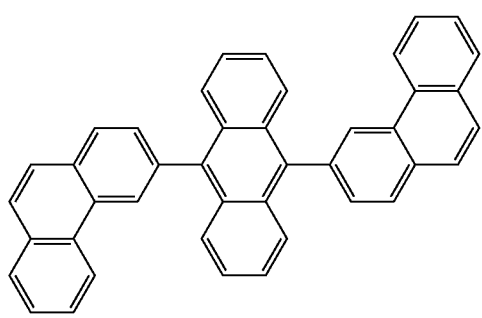

E2

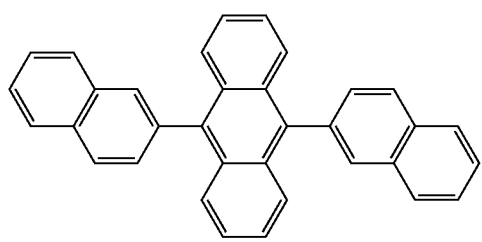

E3

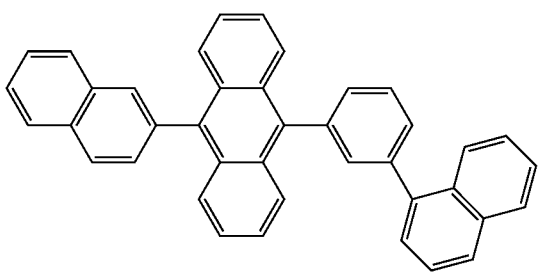

E4

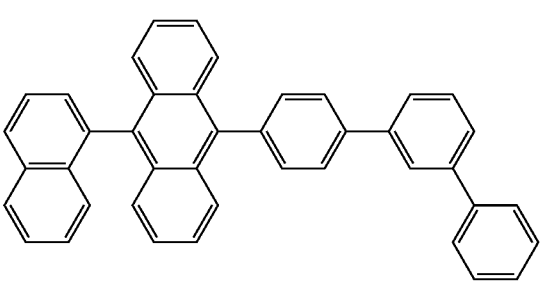

E5

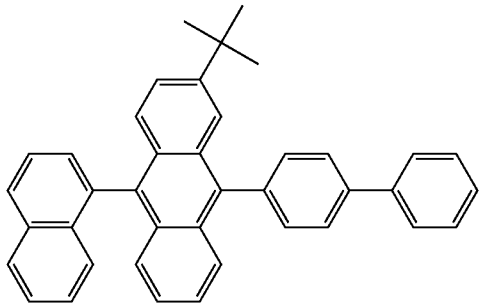

E6

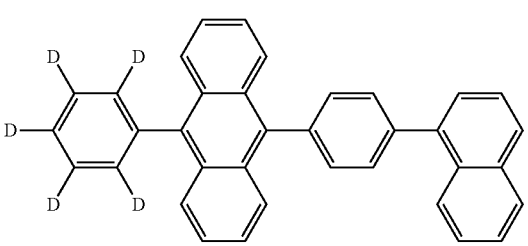

E7

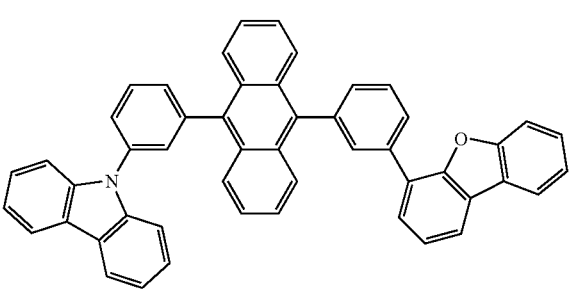

E8

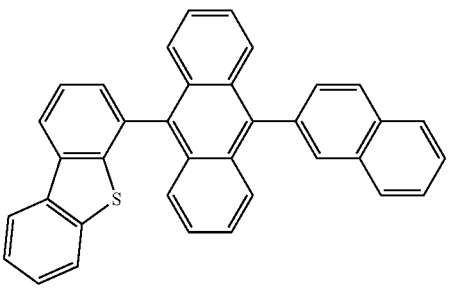

E9

E10
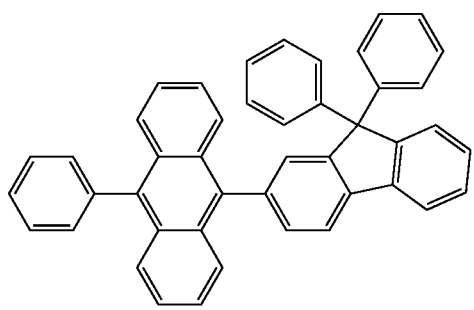
E11
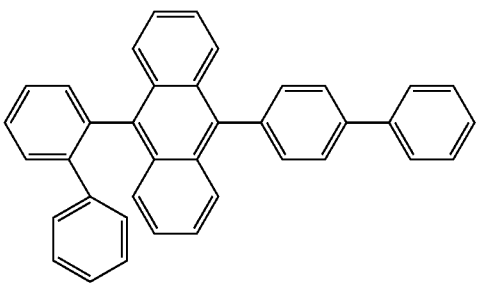
E12
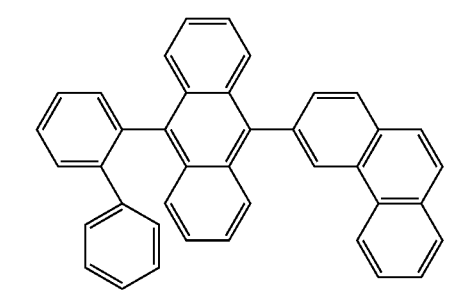
E13
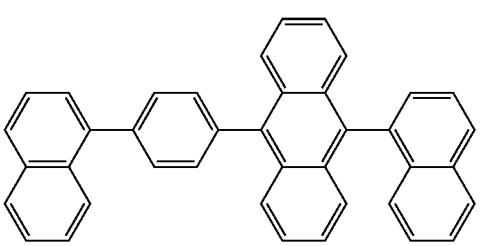
E14
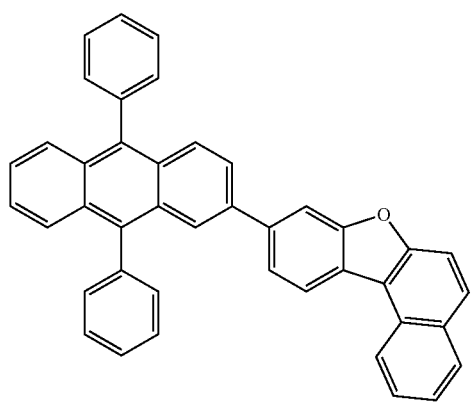
E15
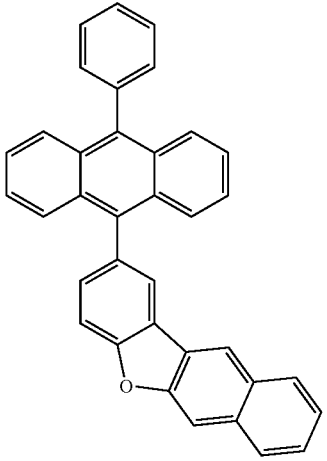
E16
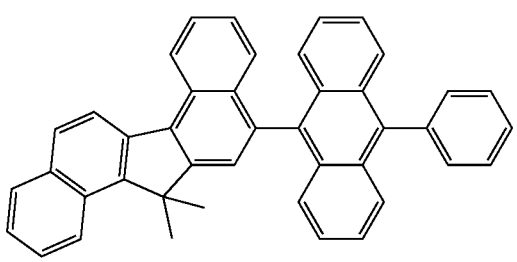
E17
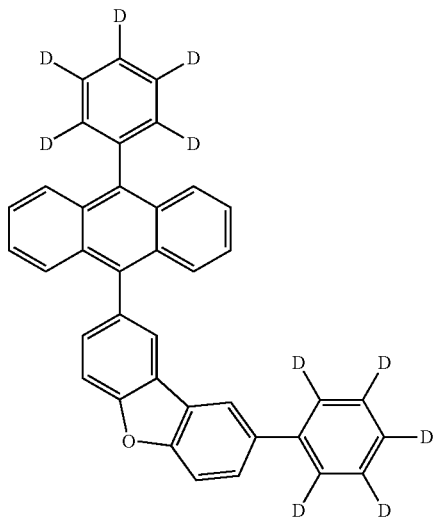
E18
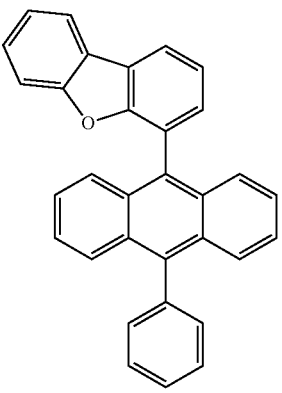

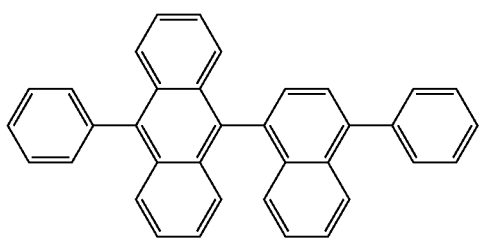

E19

In an embodiment, the emission layer EML may further include a compound represented by Formula E-2a or Formula E-2b. The compound represented by Formula E-2a or Formula E-2b may be used as a phosphorescent host material.

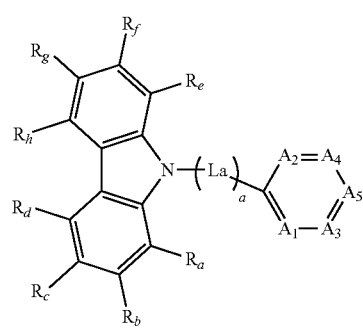

[Formula E-2a]

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. In Formula E-2a, $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $R_a$ to $R_i$ may be bonded to an adjacent group to form a hydrocarbon ring or a hetero ring containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

(Cbz1)—(—$L_b$—)$_b$—(Cbz2)

In Formula E-2b, Cbz1 and Cbz2 may each independently be an unsubstituted carbazole group or a carbazole group substituted with an aryl group having 6 to 30 ring-forming carbon atoms. In Formula E-2b, $L_b$ may be a direct linkage, a substituted or unsubstituted arylene group having 6 to 30 ring-forming carbon atoms, or a substituted or unsubstituted heteroarylene group having 2 to 30 ring-forming carbon atoms, and b may be an integer from 0 to 10. When b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2 below. However, the compounds listed in Compound Group E-2 below are only examples, and the compound represented by Formula E-2a or Formula E-2b is not limited to the compounds listed in Compound Group E-2 below.

[Compound Group E-2]

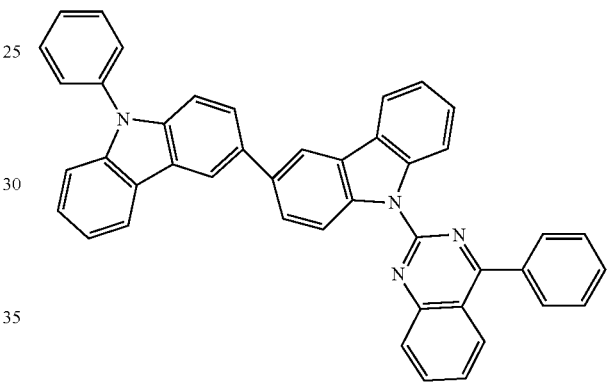

E-2-1

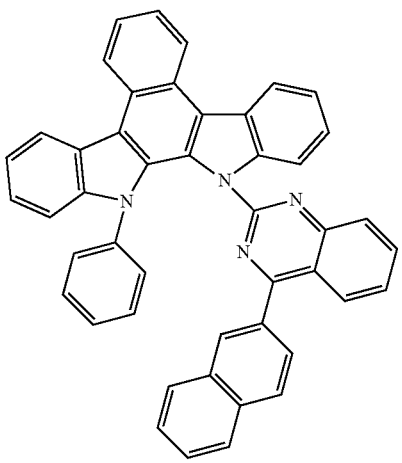

E-2-2

E-2-3
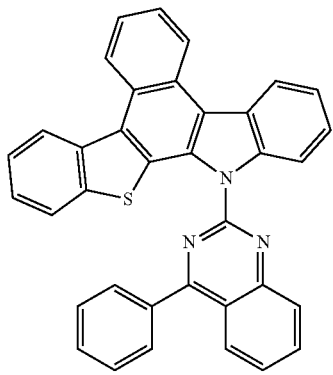
E-2-4
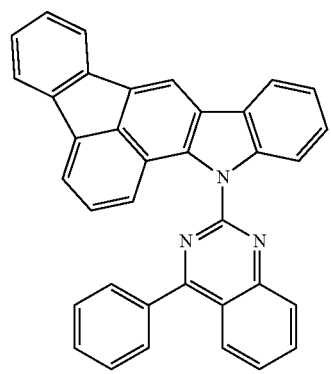
E-2-5
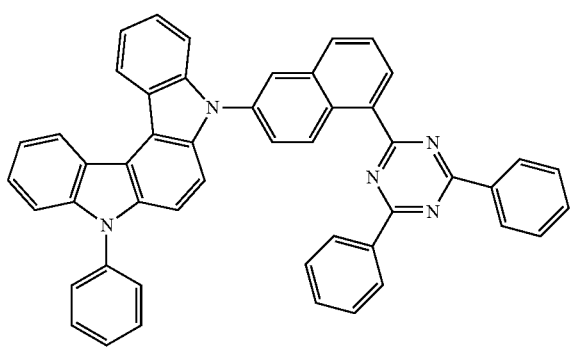
E-2-6
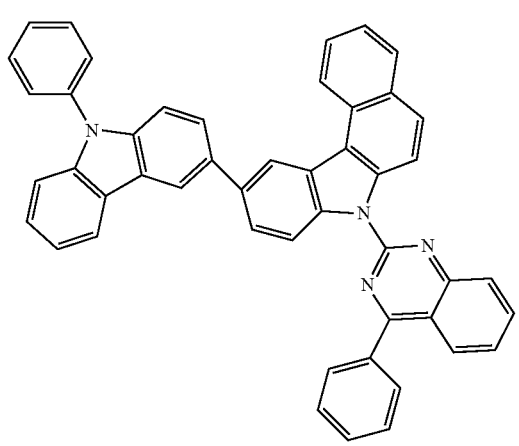
E-2-7
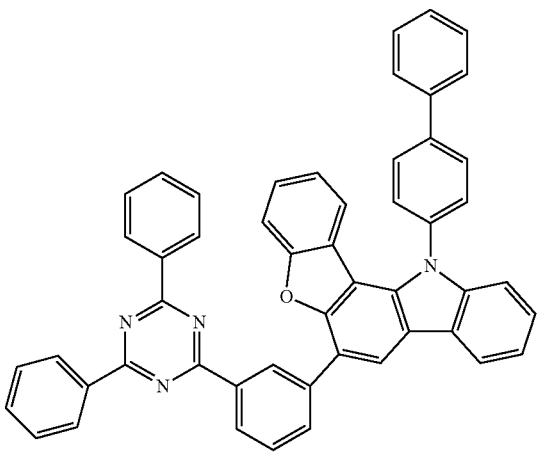
E-2-8
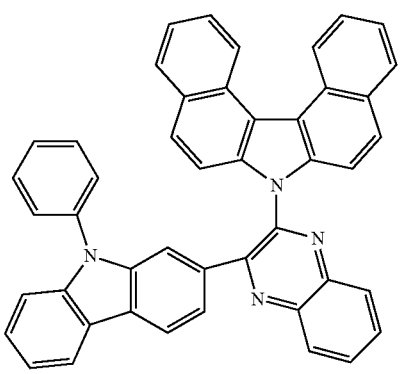
E-2-9
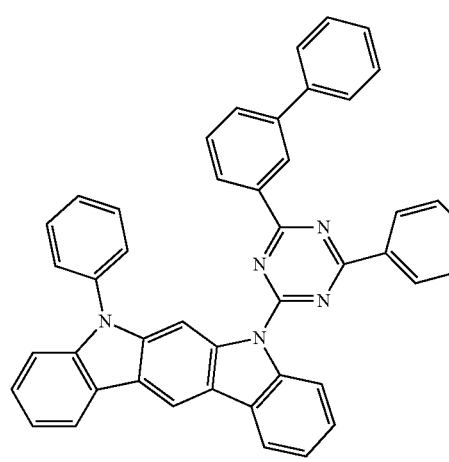

E-2-10
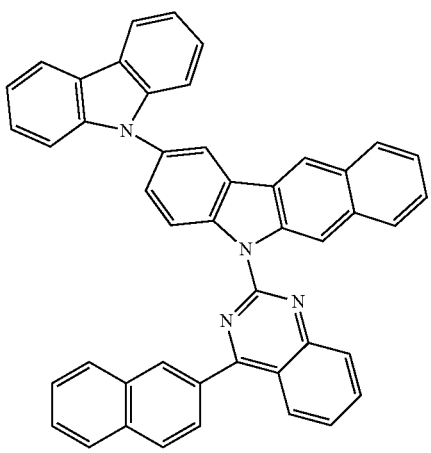
E-2-11
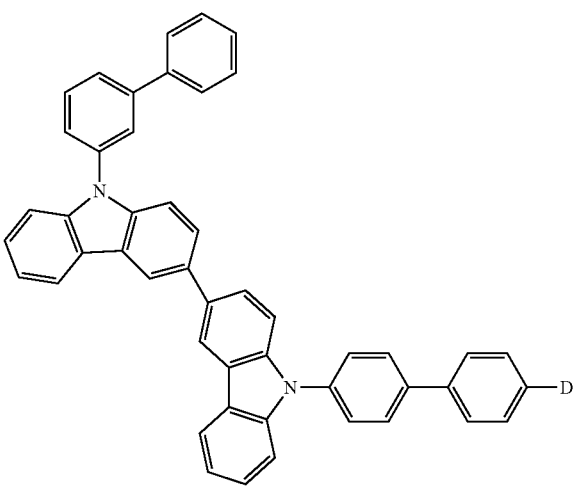 no wait
E-2-13
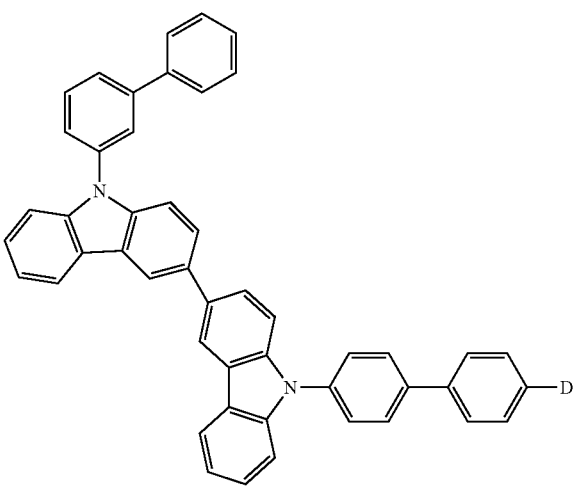
E-2-14
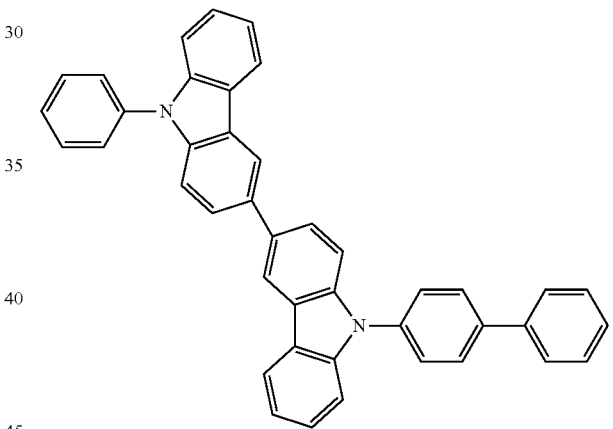
E-2-12
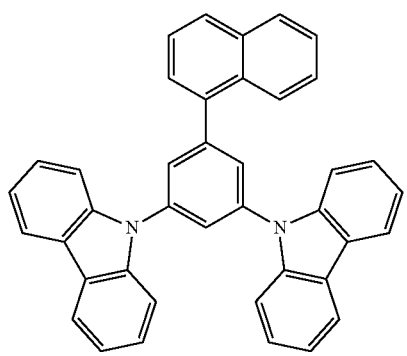
E-2-15
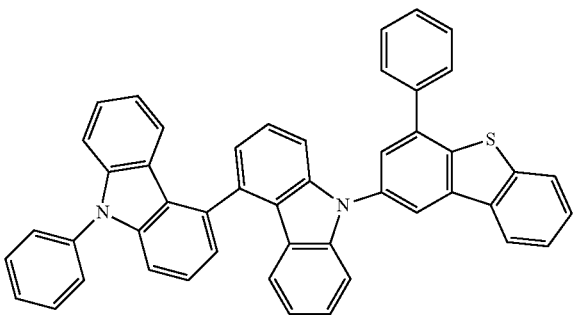

E-2-16
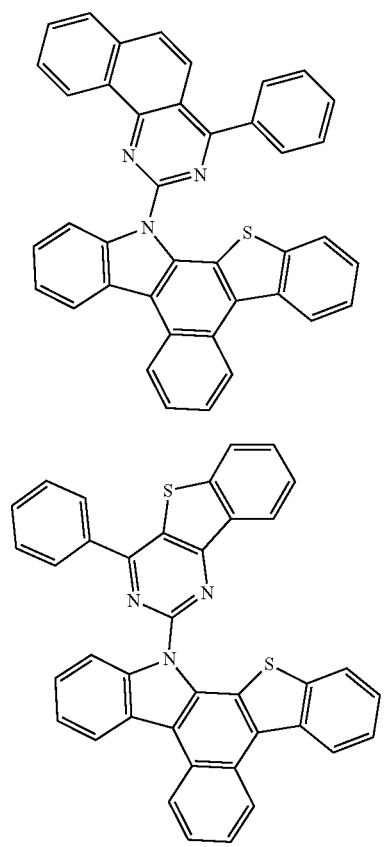
E-2-17
E-2-18
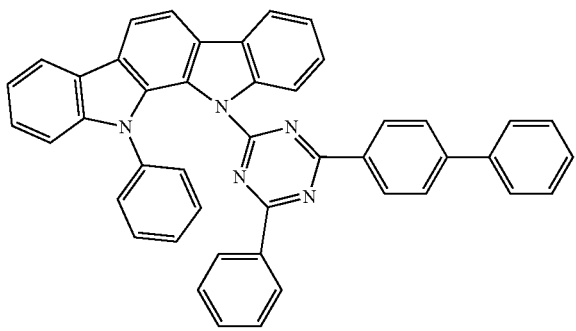
E-2-19
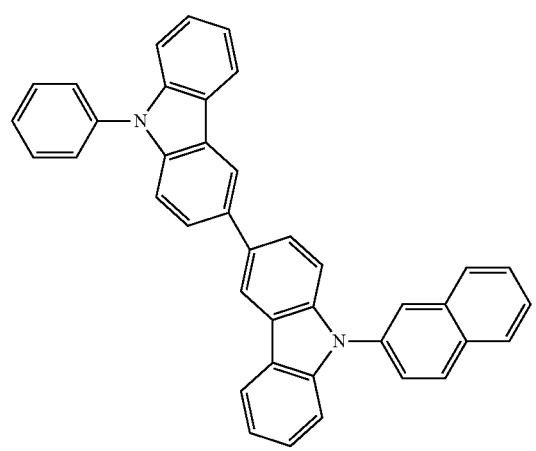
E-2-20
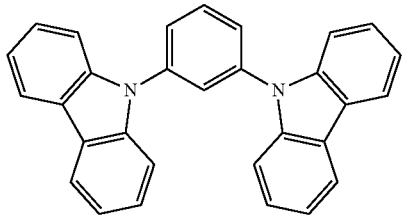
E-2-21
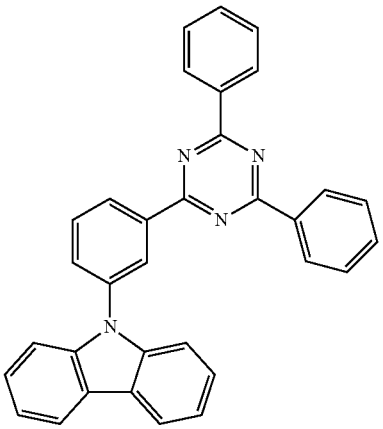
E-2-22
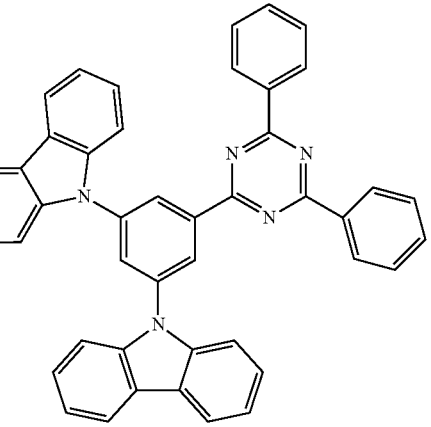
E-2-23
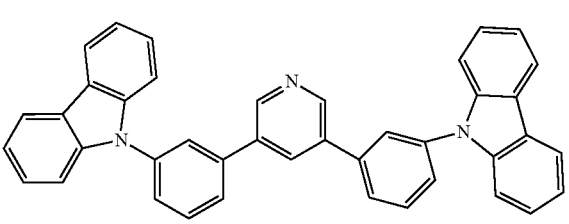

E-2-24

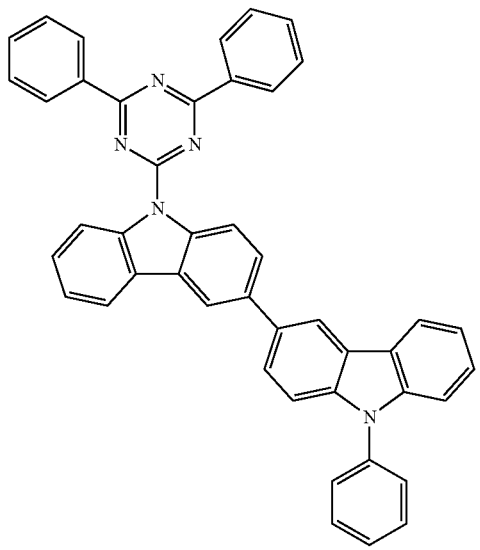

The emission layer EML may further include a general material in the art as a host material. For example, the emission layer EML may include, as a host material, at least one of bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl) benzene (TPBi). However, embodiments are not limited thereto, and for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol sol-9-yl)triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. may be used as a host material.

The emission layer EML may further include a compound represented by Formula M-a or Formula M-b below. The compound represented by Formula M-a or Formula M-b below may be used as a phosphorescent dopant material.

[Formula M-a]

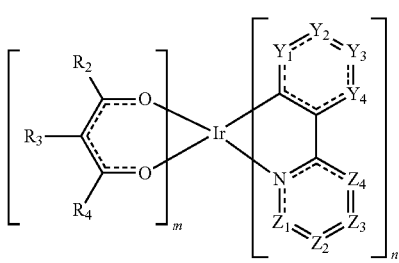

In Formula M-a above, $Y_1$ to $Y_4$, and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescent dopant or a green phosphorescent dopant.

The compound represented by Formula M-a may be any one selected from Compounds M-a1 to M-a19 below. However, Compounds M-a1 to M-a19 below are only examples, and the compound represented by Formula M-a is not limited to Compounds M-a1 to M-a19 below.

M-a1

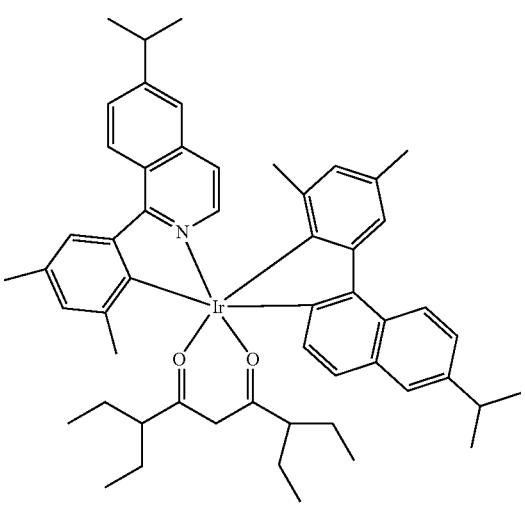

M-a2

-continued
M-a3
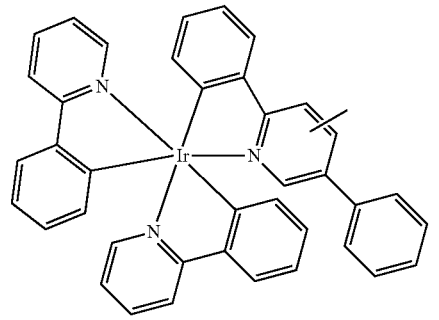
M-a4
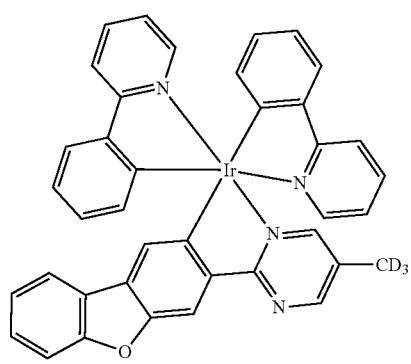
M-a5
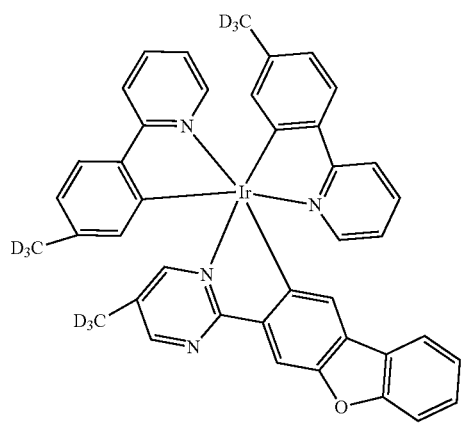
M-a6
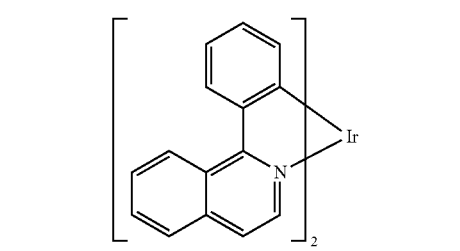
M-a7
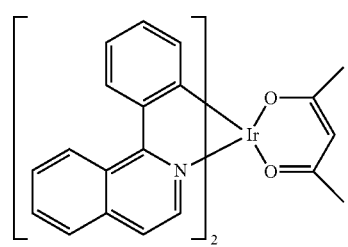
-continued
M-a8
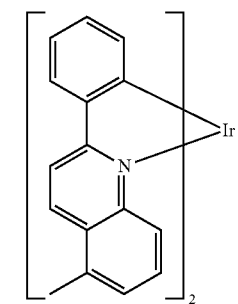
M-a9
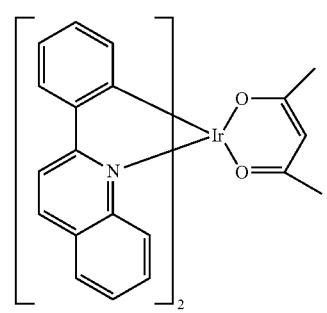
M-a10
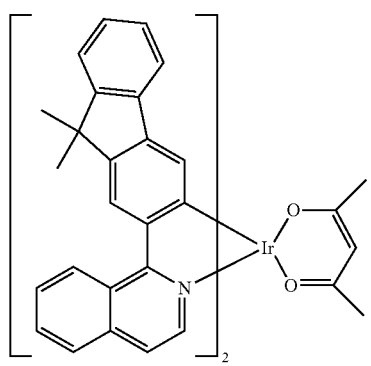
M-a11
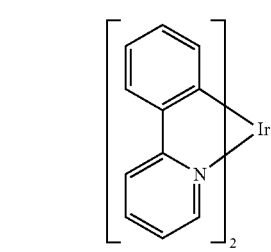
M-a12
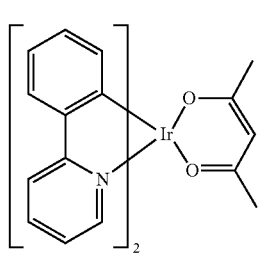

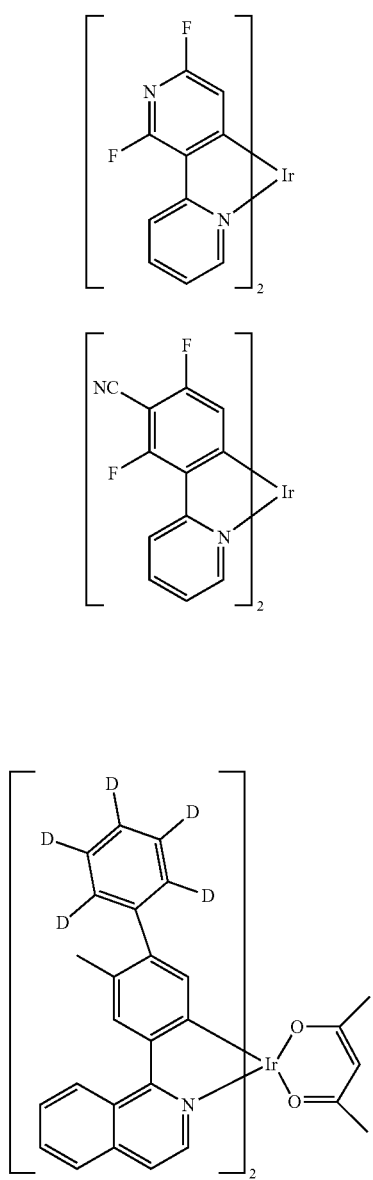

M-a13

M-a14

M-a15

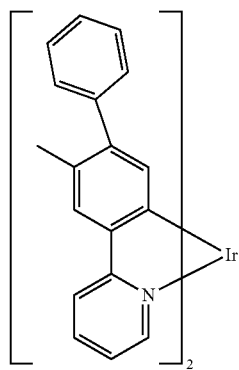

M-a16

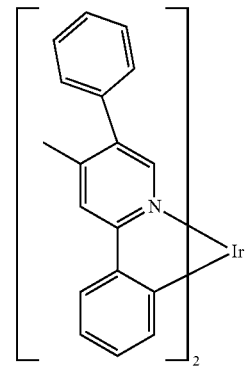

M-a17

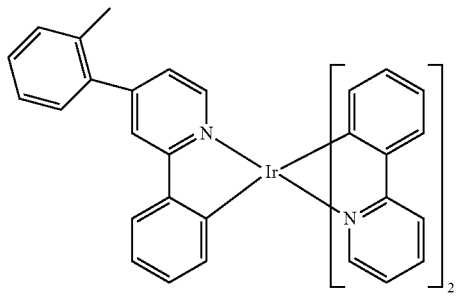

M-a18

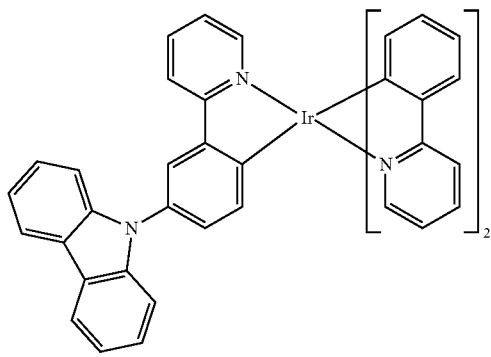

M-a19

Compound M-a1 and Compounds M-a2 may be used as a red dopant material, and Compounds M-a3 to M-a5 may be used as a green dopant material.

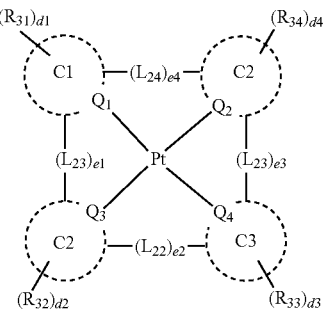

[Formula M-b]

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage, *—O—*, *—S—*,

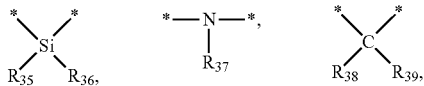

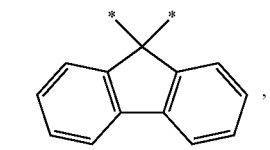

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or a green phosphorescent dopant.

The compound represented by Formula M-b may be any one selected from the compounds below. However, the compounds below are only example, and the compound represented by Formula M-b is not limited to the compounds below.

M-b-1

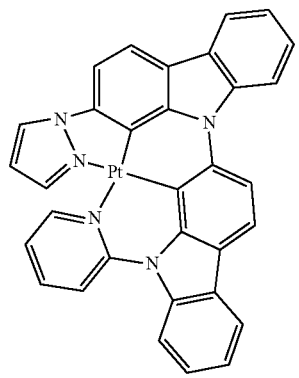

M-b-2

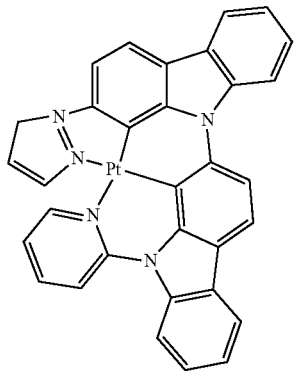

M-b-3

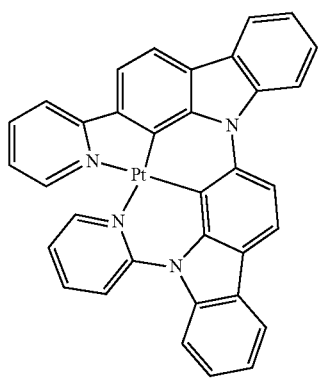

M-b-4

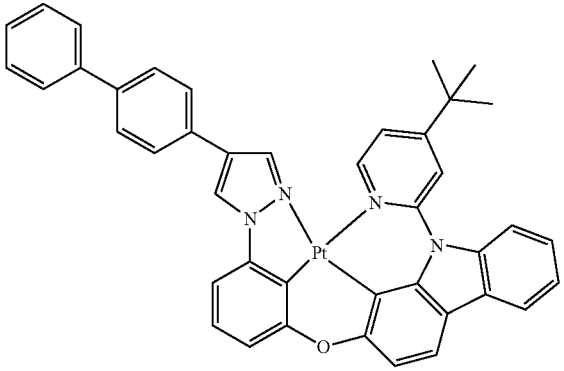

M-b-5

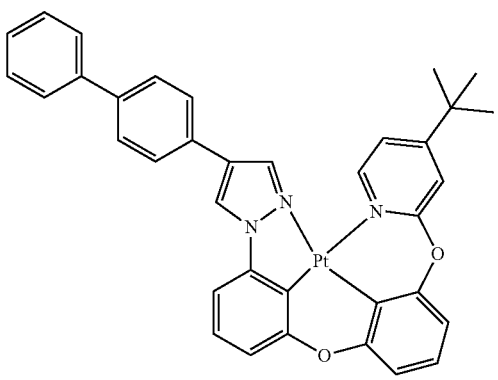

M-b-6

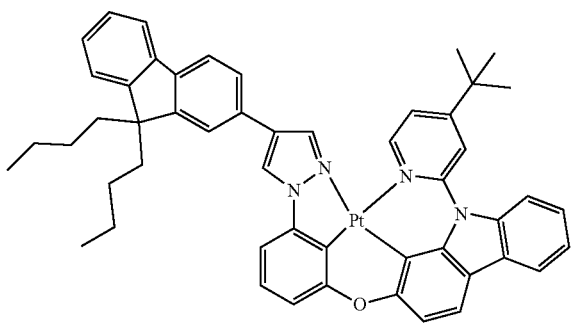

M-b-7

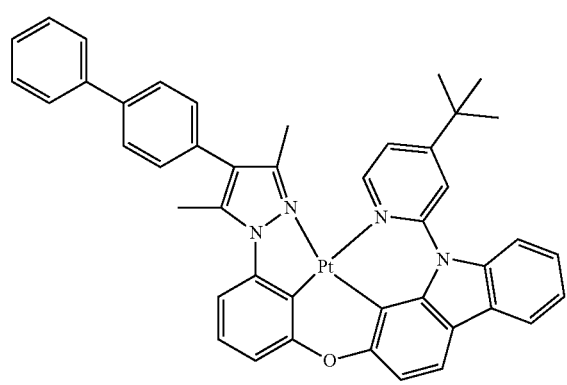

M-b-8

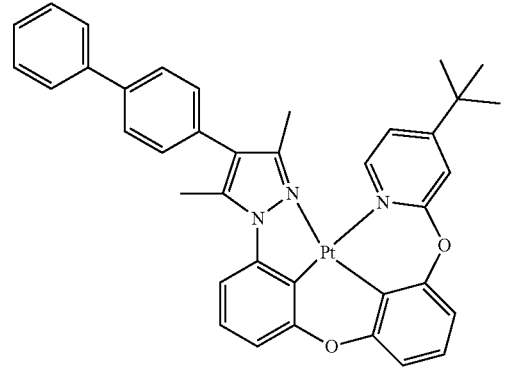

M-b-9

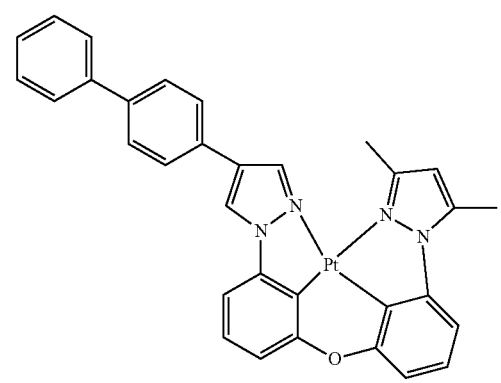

M-b-10

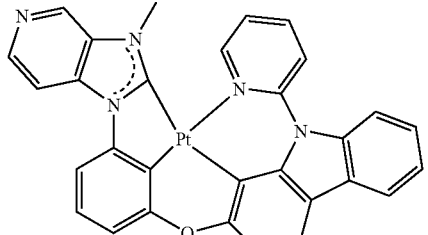

M-b-11

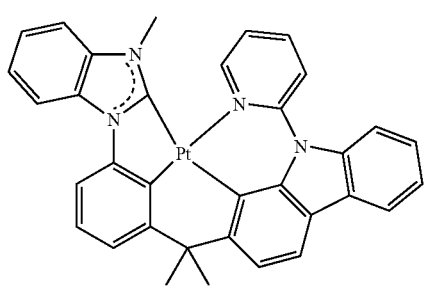

M-b-12

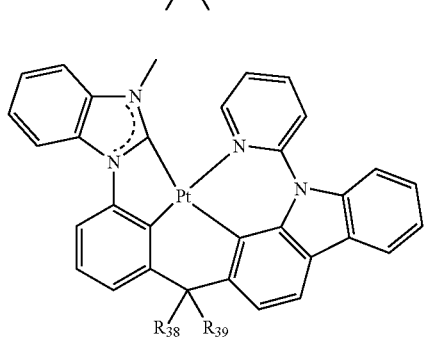

M-b-13

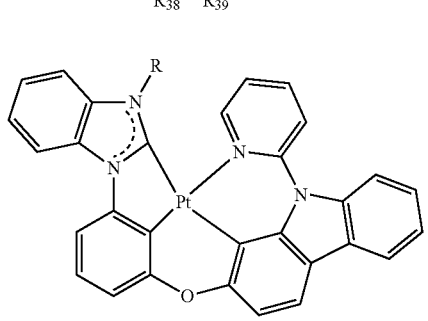

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formulas F-a to F-c below. The compounds represented by Formulas F-a to F-c may be used as a fluorescent dopant material.

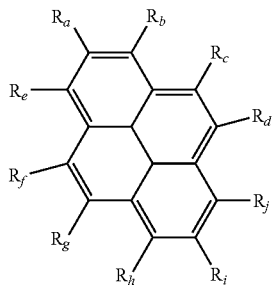

[Formula F-a]

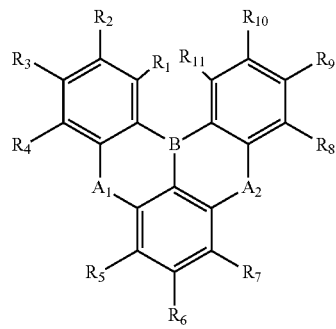

[Formula F-c]

In Formula F-a above, two selected from $R_a$ to $R_j$ may each independently be substituted with *—$NAr_1Ar_2$. The remainder of $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group containing O or S as a ring-forming atom.

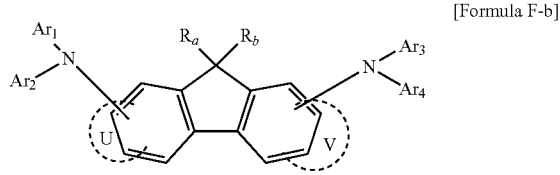

[Formula F-b]

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at the part indicated by U or V, and when the number of U or V is 0, a condensed ring may not be present at the part indicated by U or V. When the number of U is 0 and the number of V is 1, or when the number of U is 1 and the number of V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

In Formula F-c, $A_1$ to $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be combined with substituents of neighboring rings to form a condensed ring. For example, when $A_1$ and $A_2$ are each $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. In an embodiment, Firpic(iridium(III) bis(4,6-difluorophenylpyridinato-N,C2)picolinate), bis(2,4-difluorophenylpyridinato)-tetrakis(1-pyrazolyl)borate iridium(III) (Fir6), platinum octaethyl porphyrin (PtOEP), etc. may be used as a phosphorescent dopant. However, embodiments are not limited thereto.

The emission layer EML may include a quantum dot material. The core of a quantum dot may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of gZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or any mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in particles in a uniform concentration distribution, or may be present in particles in a partially different concentration distribution. The quantum dot may have a core/shell structure in which one quantum dot surrounds another quantum dot. The core/shell structure may have a concentration gradient in which the concentration of an element present in the shell decreases towards the core.

In embodiments, the quantum dot may have a core/shell structure including a core having nano-crystals, and a shell surrounding the core, which are described above. The shell of the quantum dot may be a protection layer to prevent the chemical deformation of the core so as to maintain semiconductor properties, and/or may be a charging layer to impart electrophoretic properties to the quantum dot. The shell may have a single layer or multiple layers. Examples of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

A quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be enhanced within the above ranges. Light emitted through such a quantum dot may be emitted in all directions, and thus a wide viewing angle may be improved.

The quantum dot is not particularly limited and may be selected from forms commonly used in the art. For example, the quantum dot may have a spherical, a pyramidal, a multi-arm, or a cubic shape, or the quantum dot may be in the form of nanoparticles, nanotubes, nanowires, nanofibers, nanoplatelets, etc.

The quantum dot may control the color of emitted light according to the particle size thereof, and thus the quantum dot may have various light emission colors such as blue, red, green, etc.

In the light emitting device ED of an embodiment shown in FIGS. 3 to 6, an electron transport region ETR is provided on the emission layer EML. The electron transport region ETR may include at least one of a hole blocking layer HBL, an electron transport layer ETL, and an electron injection layer EIL, but embodiments are not limited thereto.

The electron transport region ETR may have a layer formed of a single material, a layer formed of different materials, or a multilayer structure having layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/an electron injection layer EIL, or a hole blocking layer HBL/an electron transport layer ETL/an electron injection layer EIL are stacked in order from the emission layer EML, but is not limited thereto. The electron transport region ETR may have a thickness, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below.

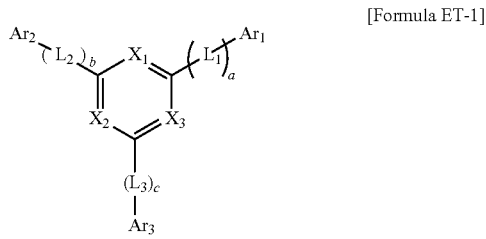

[Formula ET-1]

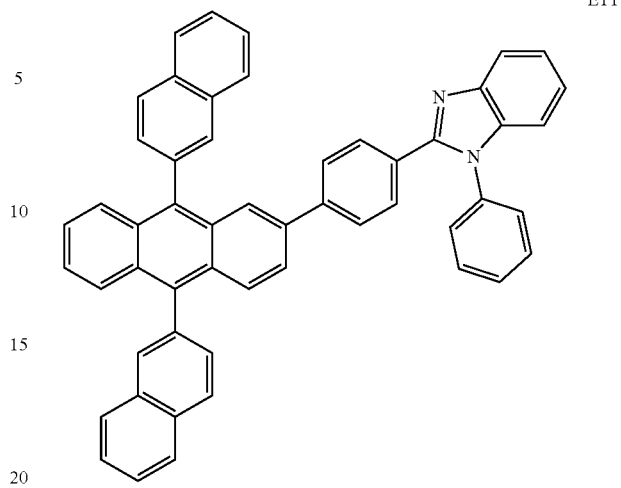

ET1

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula E-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

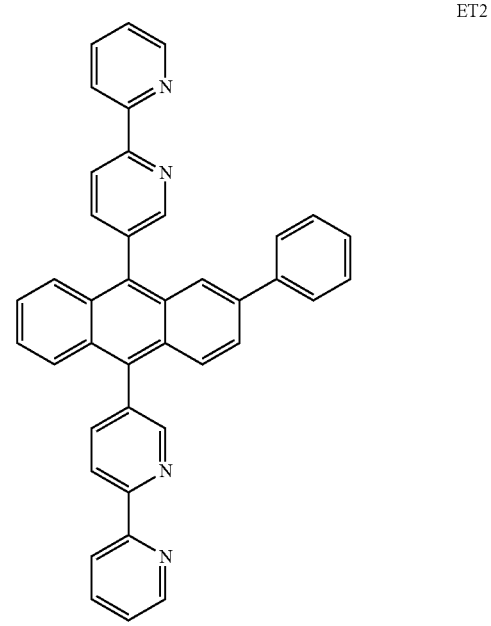

ET2

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), or a mixture thereof.

The electron transport region ETR may include at least one compound selected from Compounds ET1 to ET36 below.

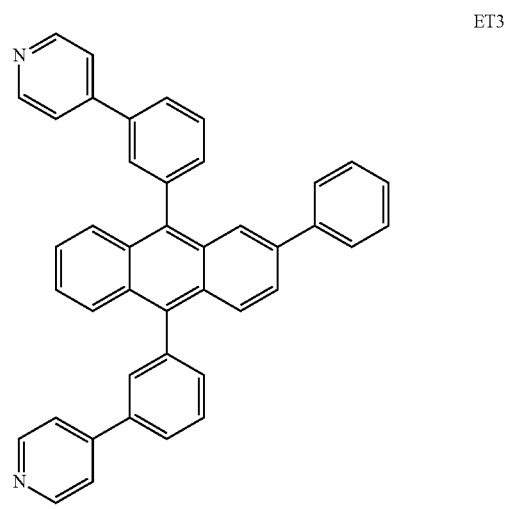

ET3

ET4
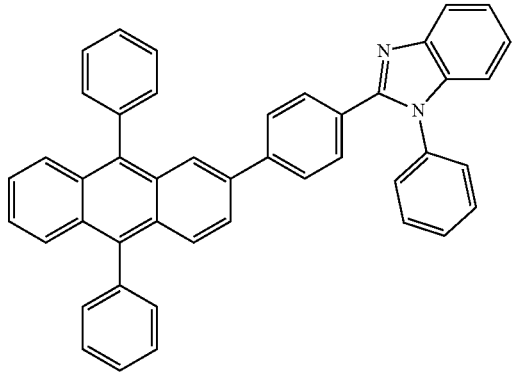
ET5
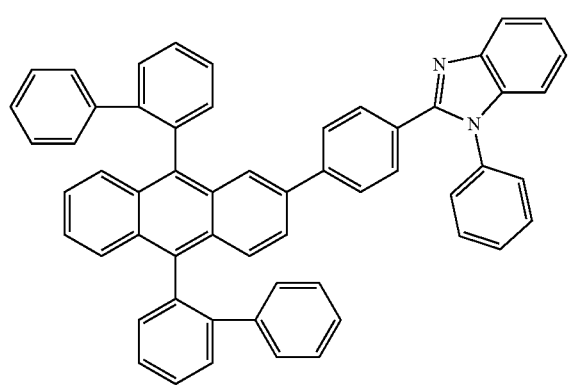
ET6
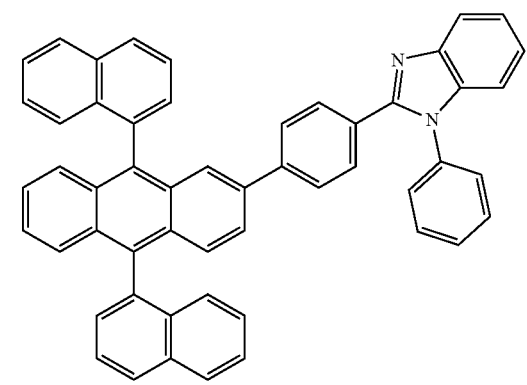
ET7
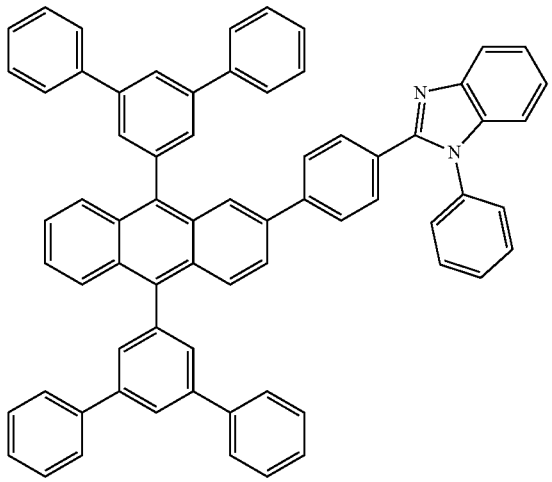
ET8
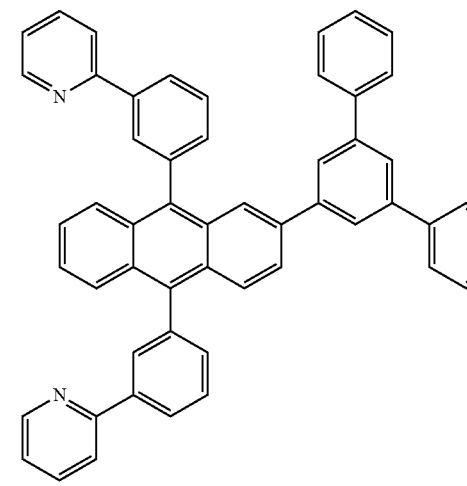
ET9
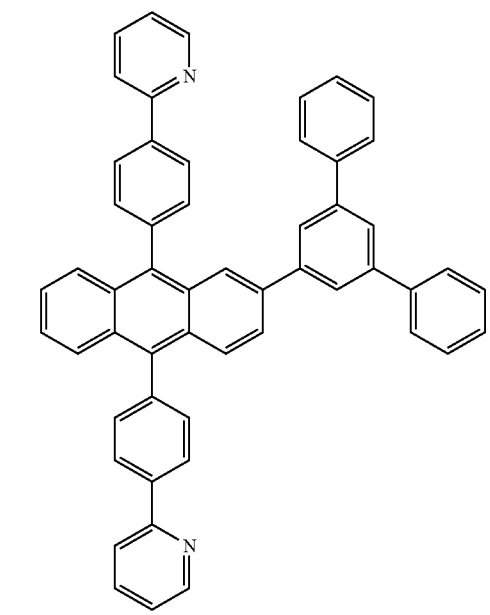

103
-continued
ET10
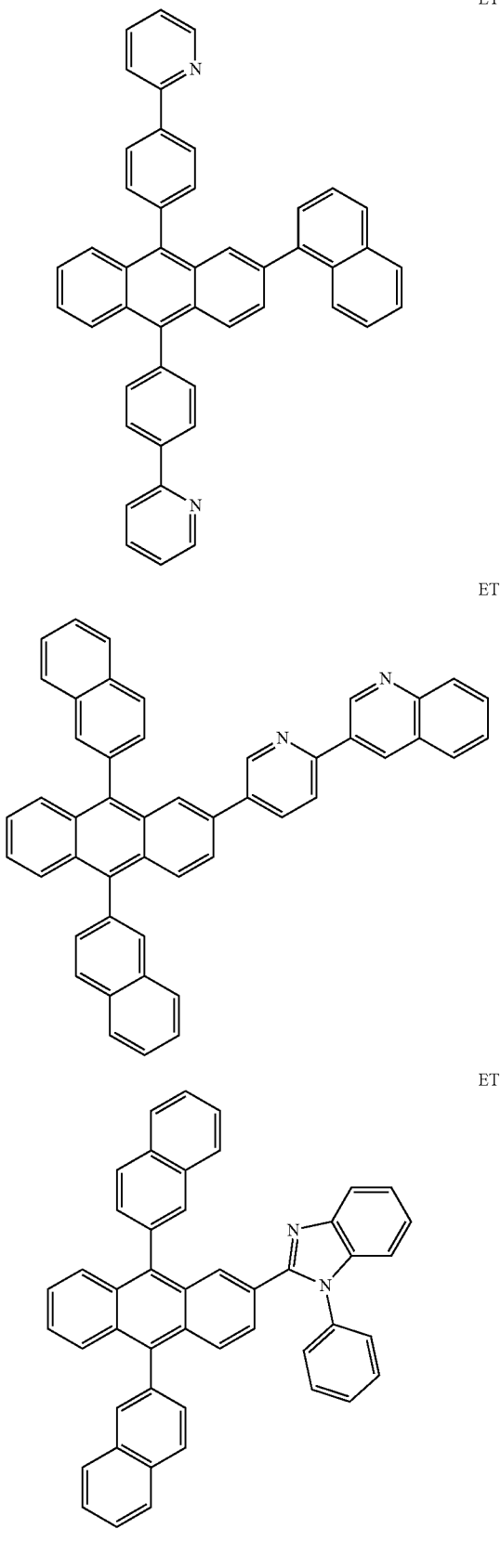
ET11
ET12
104
-continued
ET13
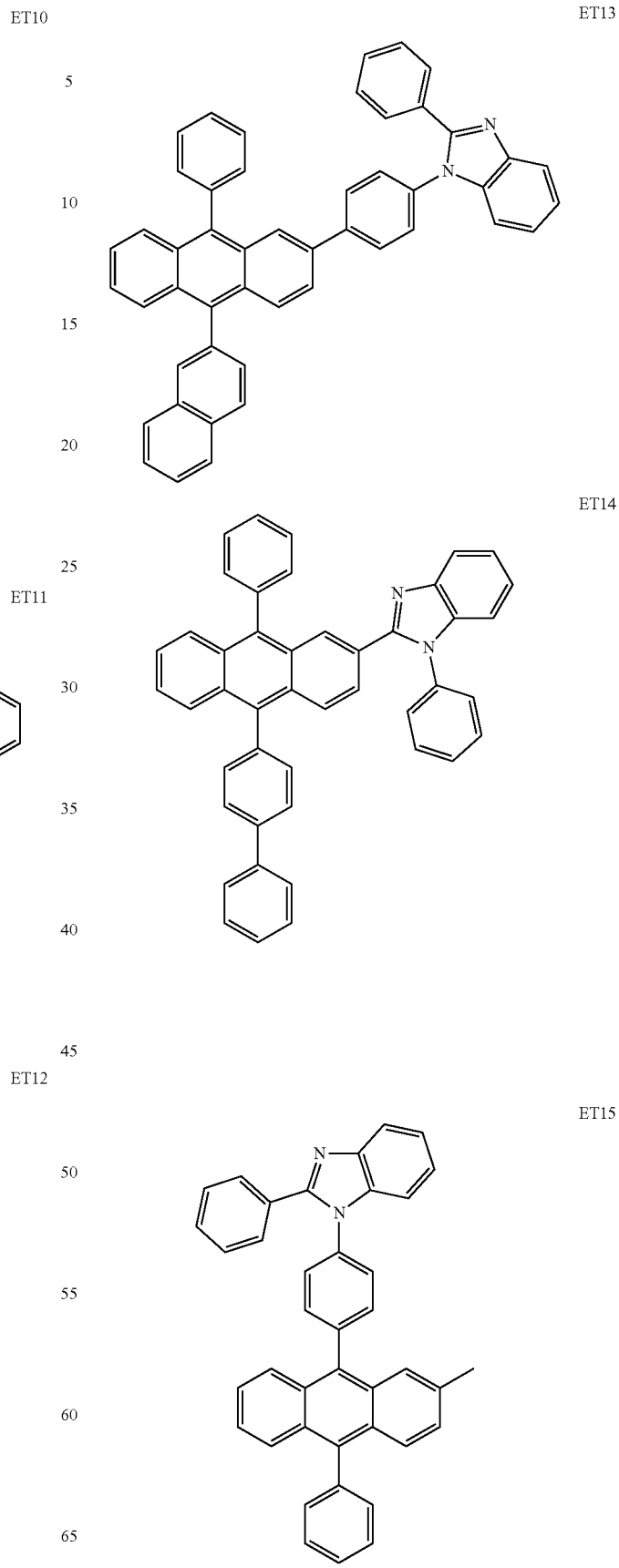
ET14
ET15

ET16
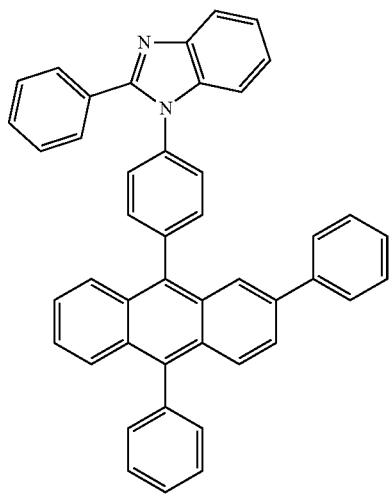
ET17
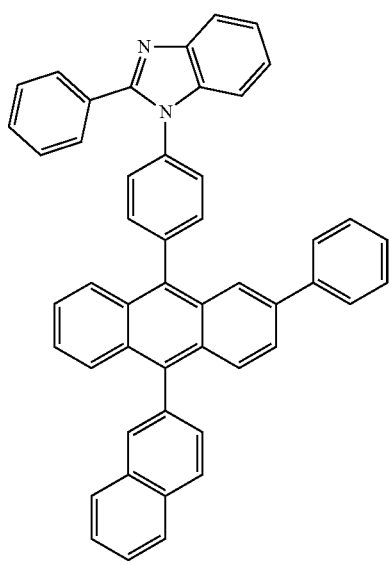
ET18
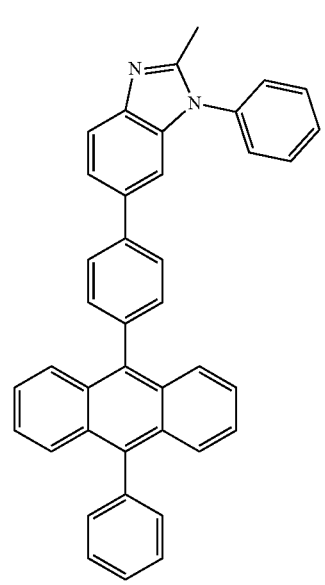
ET19
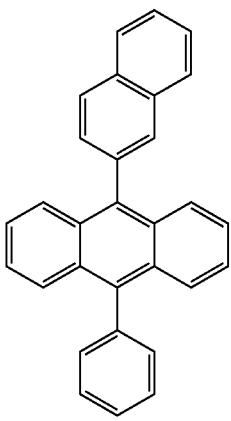
ET20
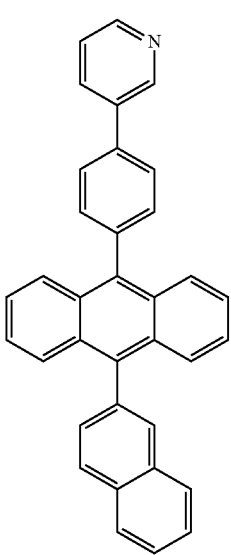
ET21
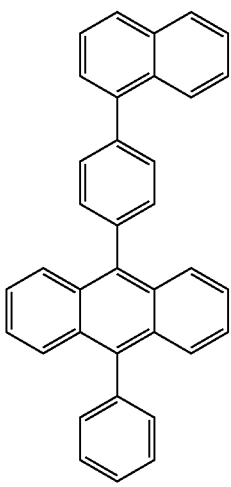

ET22
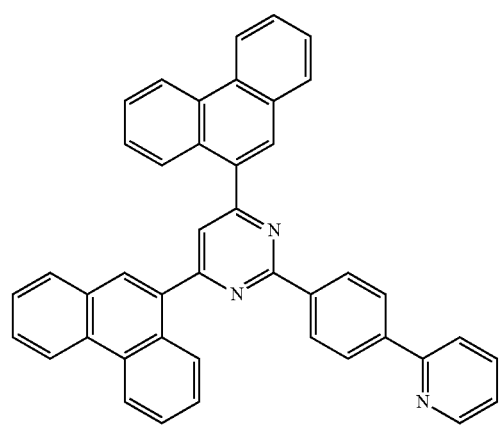
ET23
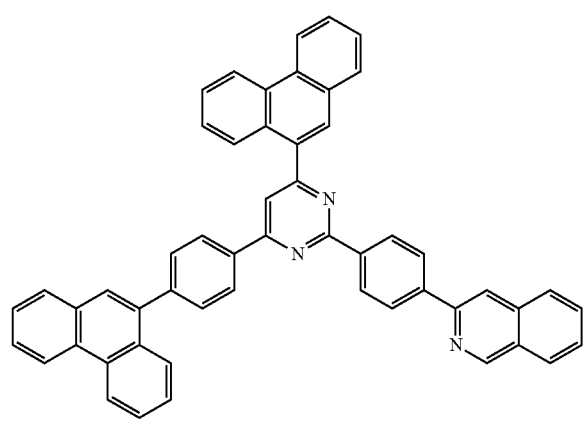
ET24
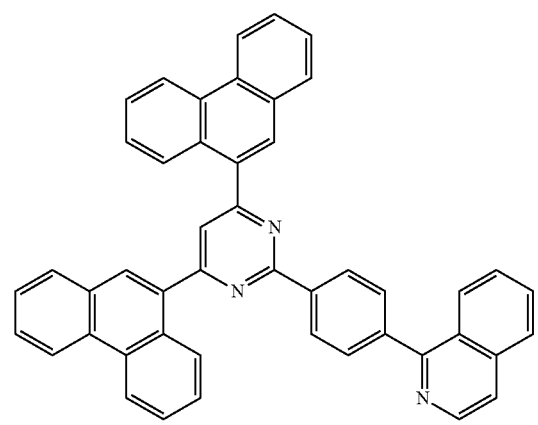
ET25
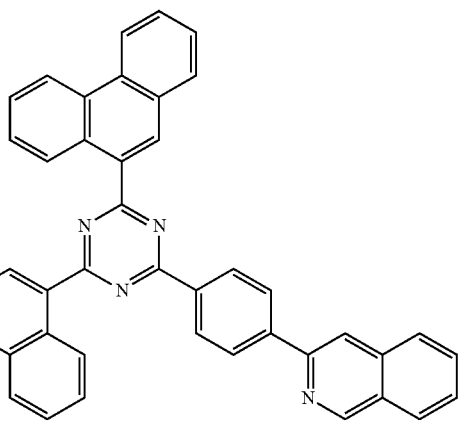
ET26
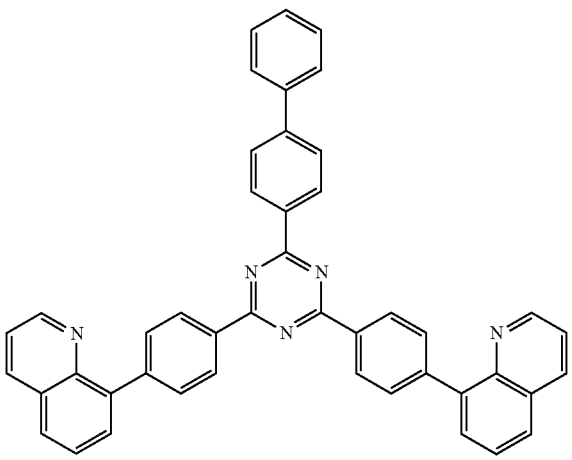
ET27
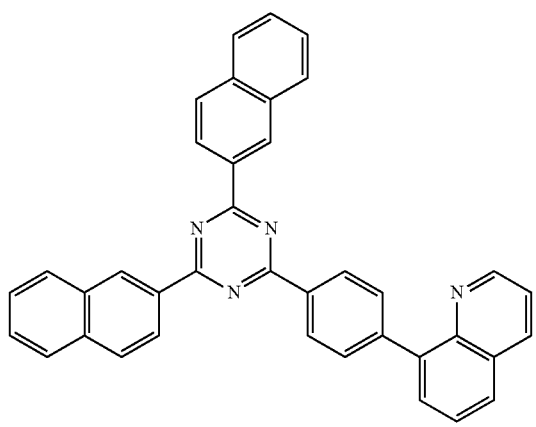

ET28
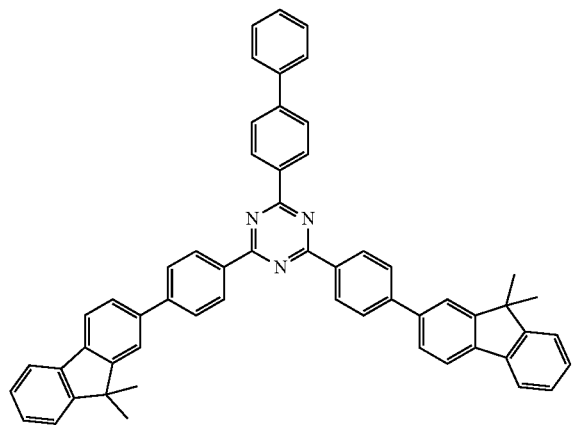
ET29
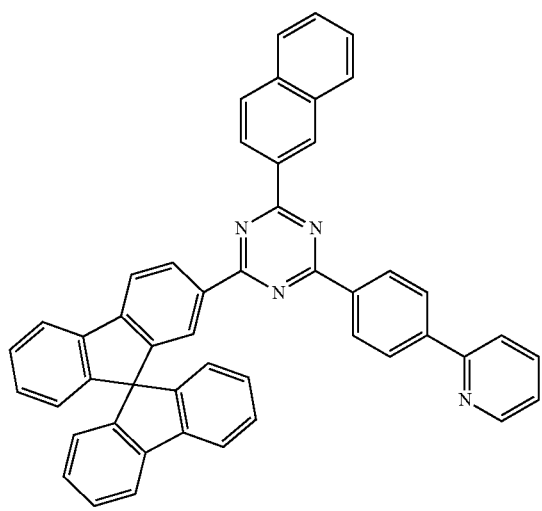
ET30
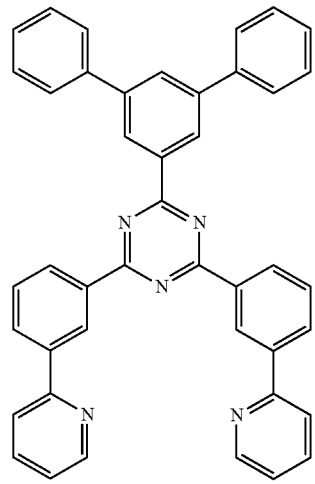
ET31
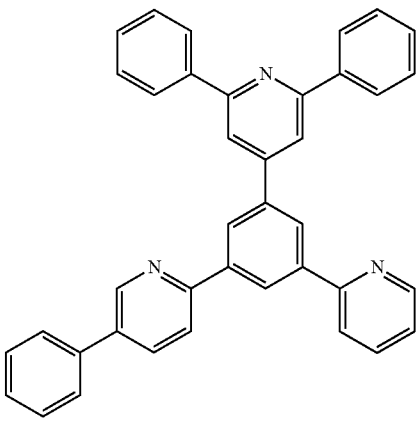
ET32
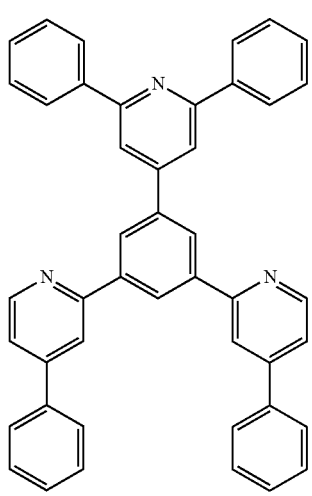
ET33
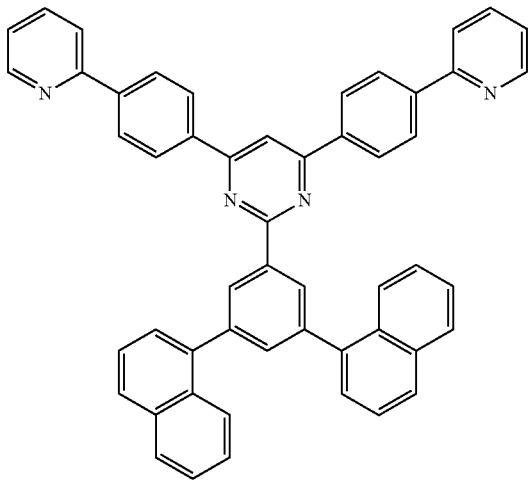

ET34

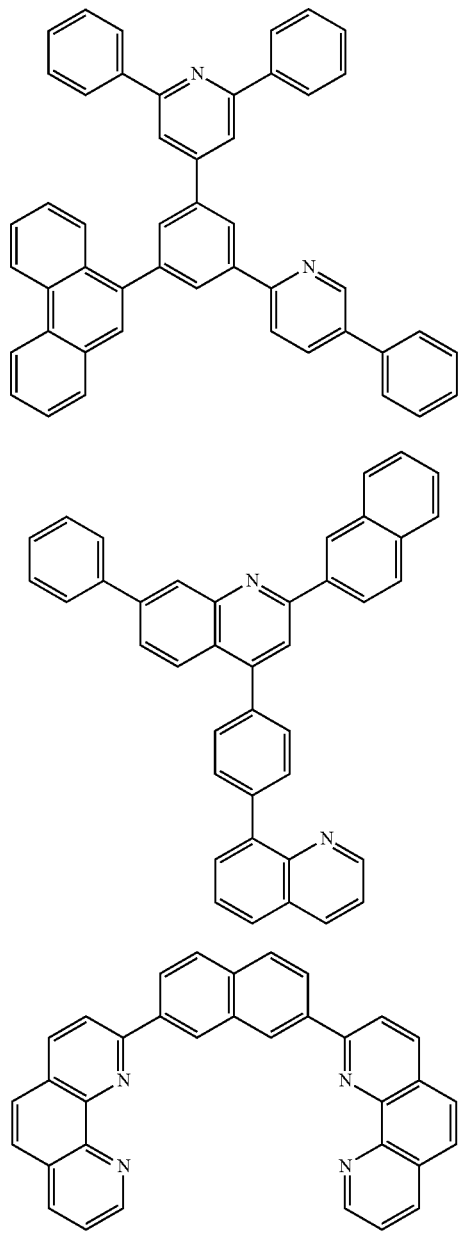

ET35

ET36

The electron transport region ETR may include a halogenated metal such as LiF, NaCl, CsF, RbCl, RbI, CuI, and KI, a lanthanide such as Yb, or a co-deposited material of a halogenated metal and a lanthanide. For example, the electron transport region ETR may include KI:Yb, RbI:Yb, etc. as a co-deposited material. The electron transport region ETR may include a metal oxide such as $Li_2O$ and BaO, or 8-hydroxyl-lithium quinolate (Liq), etc., but embodiments are not limited thereto. The electron transport region ETR may also be formed of a mixture of an electron transport material and an insulating organo-metal salt. The organo-metal salt may be a material having an energy band gap equal to or greater than about 4 eV. For example, the organo-metal salt may include metal acetates, metal benzoates, metal acetoacetates, metal acetylacetonates, or metal stearates.

The electron transport region ETR may further include, for example, at least one of 2,9-dimethyl-4,7-diphenyl-1,10-phenanthroline (BCP) and 4,7-diphenyl-1,10-phenanthroline (Bphen) in addition to the materials described above, but embodiments are not limited thereto.

The electron transport region ETR may include the compounds of the electron transport region described above in at least one of an electron injection layer EIL, an electron transport layer ETL, and a hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. When the thickness of the electron transport layer ETL satisfies the above-described ranges, satisfactory electron transport properties may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown, the second electrode EL2 may be electrically connected to an auxiliary electrode. When the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may include a multilayer or a single layer.

In an embodiment, the capping layer CPL may include an organic layer or an inorganic layer. For example, when the capping layer CPL includes an inorganic material, the inorganic material may include an alkali metal compound such as LiF, an alkaline earth metal compound such as MgF$_2$, SiON, SiN$_x$, SiOy, etc.

For example, when the capping layer CPL includes an organic material, the organic material may include α-NPD, NPB, TPD, m-MTDATA, Alq$_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., or may include an epoxy resin or an acrylate such as methacrylate. However, embodiments are not limited thereto, and the capping layer CPL may include one of Compounds P1 to P5 below.

P1

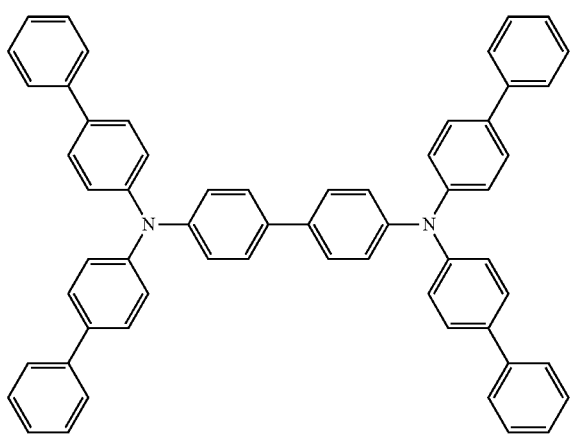

P2

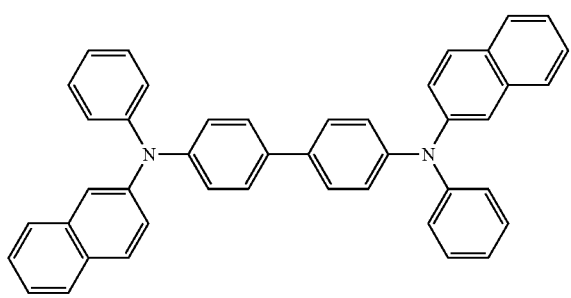

P3

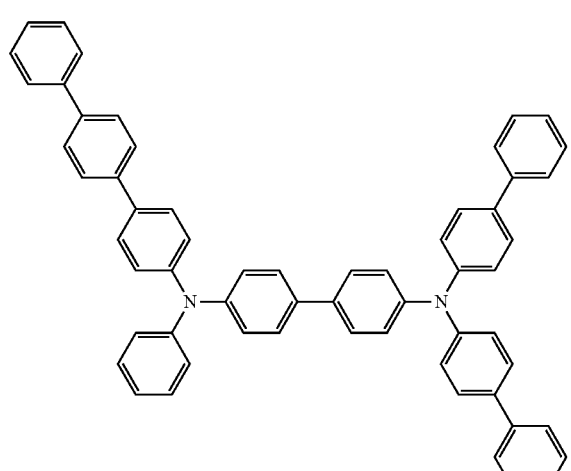

P4

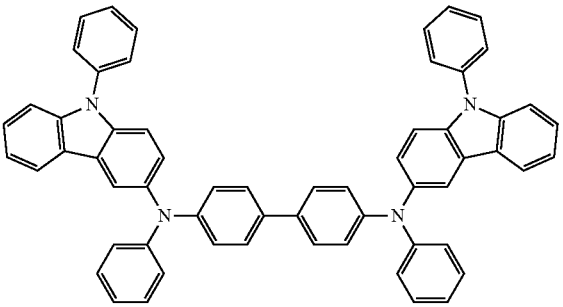

P5

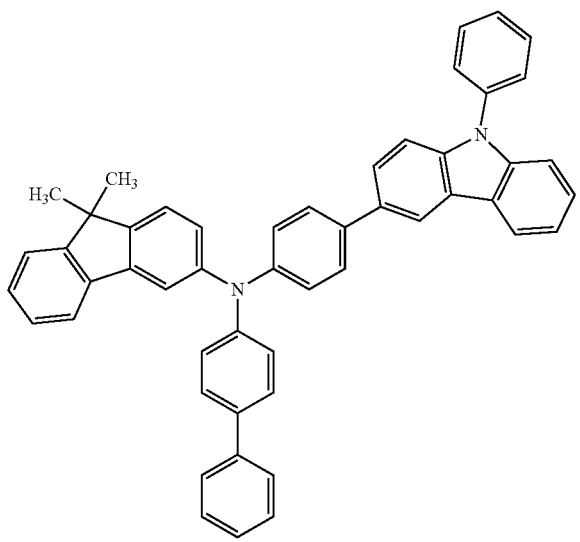

The capping layer CPL may have a refractive index equal to or greater than about 1.6. For example, the capping layer CPL may have a refractive index equal to or greater than about 1.6 with respect to light in a wavelength range of about 550 nm to about 660 nm.

Figure 7:
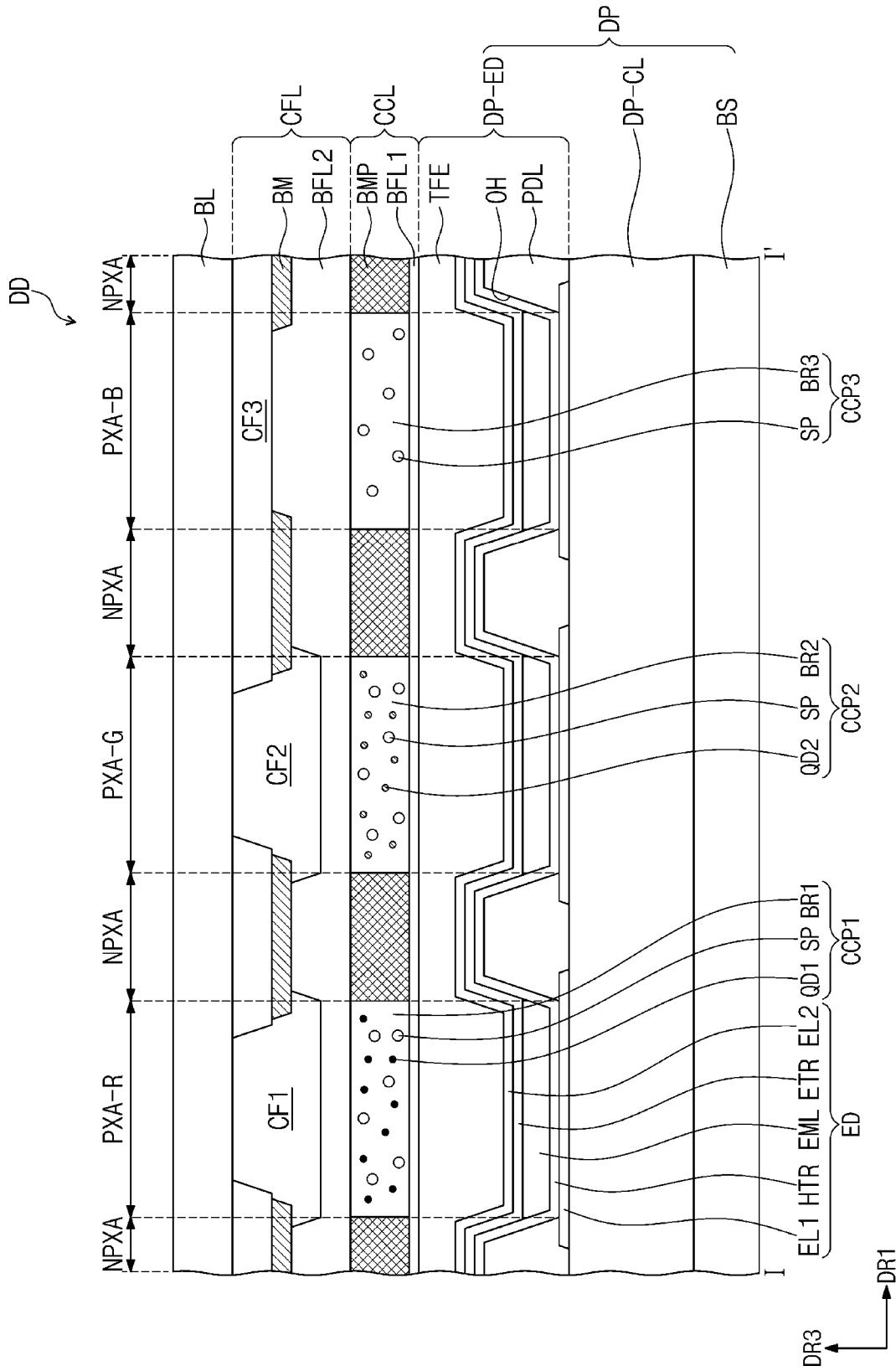
FIG. 7 is a schematic cross-sectional view of a display apparatus according to an embodiment.
Figure 8:
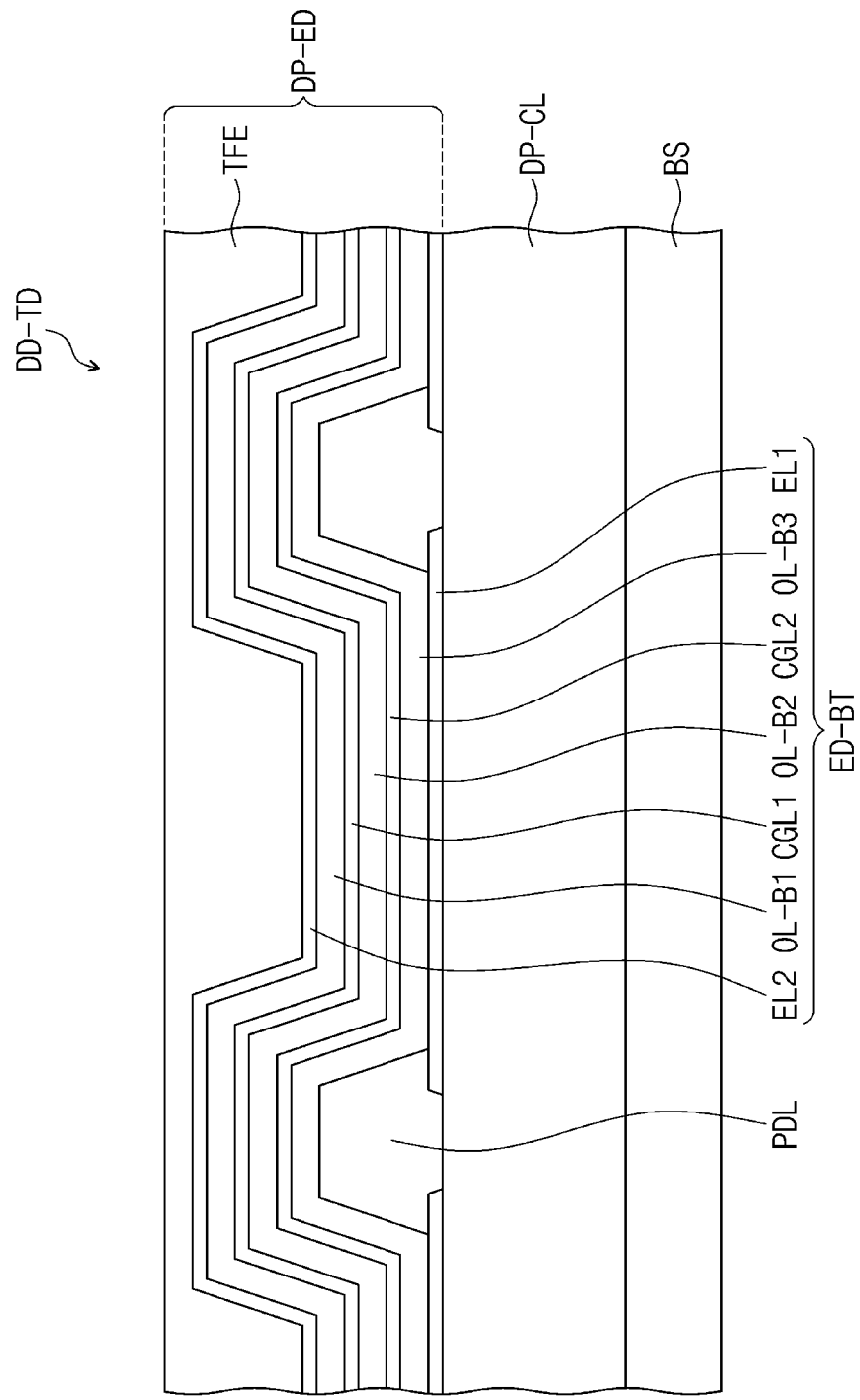
FIG. 8 is a schematic cross-sectional view of a display apparatus according to an embodiment.

FIGS. 7 and 8 are each a schematic cross-sectional view of a display apparatus according to an embodiment. Hereinafter, in the description of the display apparatus according to an embodiment with reference to FIGS. 7 and 8, content which overlaps with the descriptions of FIGS. 1 to 6 will not be described again, and the differing features will be described.

Referring to FIG. 7, a display apparatus DD according to an embodiment may include a display panel DP having a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and a display device layer DP-ED, and the element layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The light emitting device ED shown in FIG. 7 may have a same structure of a light emitting device as described in FIGS. 3 to 6.

Referring to FIG. 7, the emission layer EML may be disposed in the openings OH defined in the pixel defining film PDL. For example, the emission layer EML separated by the pixel defining film PDL and provided corresponding to each light emitting areas PXA-R, PXA-G, and PXA-B may emit light in a same wavelength range. In the display apparatus DD of an embodiment, the emission layer EML may emit blue light. Although not shown in the drawings, in an embodiment, the emission layer EML may be provided as a common layer for the light emitting areas PXA-R, PXA-G, and PXA-B.

The light control layer CCL may be disposed on the display panel DP. The light control layer CCL may include a photoconverter. The photoconverter may include a quantum dot or a phosphor. The photoconverter may convert the wavelength of received light and emit the resulting light. For example, the light control layer CCL may be a layer containing quantum dots or phosphors.

The light control layer CCL may include light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but embodiments are not limited thereto. In FIG. 7, the division pattern BMP is shown not to overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 that converts first color light provided from the light emitting device ED into second color light, a second light control unit CCP2 including a second quantum dot QD2 that converts first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting device ED. For example, the first quantum dot QD1 may be a red quantum dot and the second quantum dot QD2 may be a green quantum dot. The same descriptions above with respect to quantum dots may be applied to the quantum dots QD1 and QD2.

The light control layer CCL may further include a scatterer SP. The first light control unit CCP1 may include a first quantum dot QD1 and the scatterer SP, the second light control unit CCP2 may include a second quantum dot QD2 and the scatterer SP, and the third light control unit CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may include base resins BR1, BR2, and BR3 for dispersing the quantum dots QD1 and QD2 and the scatterer SP. In an embodiment, the first light control unit CCP1 may include the first quantum dot QD1 and the scatterer SP dispersed in the first base resin BR1, the second light control unit CCP2 may include the second quantum dot QD2 and the scatterer SP dispersed in the second base resin BR2, and the third light control unit CCP3 may include the scatterer SP dispersed in the third base resin BR3. The base resins BR1, BR2, and BR3 are mediums in which the quantum dots QD1 and QD2 and the scatterer SP are dispersed, and may be formed of various resin compositions, which may be generally referred to as a binder. For example, the base resins BR1, BR2, and BR3 may be an acrylic-based resin, a urethane-based resin, a silicone-based resin, an epoxy-based resin, etc. The base resins BR1, BR2, and BR3 may be a transparent resin. In an embodiment, the first base resin BR1, the second base resin BR2, and the third base resin BR3 each may be the same as or different from each other.

The light control layer CCL may include a barrier layer BFL1. The barrier layer BFL1 may serve to prevent moisture and/or oxygen (hereinafter referred to as 'moisture/oxygen') from reaching the display panel DP. The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. In an embodiment, the barrier layers BFL1 and BFL2 may further include an organic layer. The barrier layers BFL1 and BFL2 may be formed of a single layer or of multiple layers.

In the display apparatus DD of an embodiment, the color filter layer CFL may be disposed on the light control layer CCL. For example, the color filter layer CFL may be directly disposed on the light control layer CCL. In an embodiment, the barrier layer BFL2 may be omitted.

The color filter layer CFL may include a light blocking unit BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. The filters CF1, CF2, and CF3 may each include a photosensitive polymer resin, a pigment, or a dye. The first filter CF1 may include a red pigment or a red dye, the second filter CF2 may include a green pigment or a green dye, and the third filter CF3 may include a blue pigment or a blue dye. However, embodiments are not limited thereto, and the third filter CF3 may not include a pigment or a dye. The third filter CF3 may include a photosensitive polymer resin, but not include a pigment or a dye. The third filter CF3 may be transparent. The third filter CF3 may be formed of a transparent photosensitive resin.

In an embodiment, the first filter CF1 and the second filter CF2 may each be yellow filters. The first filter CF1 and the second filter CF2 may not be separated from each other and may be provided as a single body.

The light blocking unit BM may be a black matrix. The light blocking unit BM may be formed by including an organic light blocking material or an inorganic light blocking material including a black pigment or a black dye. The light blocking unit BM may prevent light leakage, and may separate boundaries between the adjacent filters CF1, CF2, and CF3. In an embodiment, the light blocking unit BM may be formed of a blue filter.

The first to third filters CF1, CF2, and CF3 may each be disposed corresponding to each of the red light emitting area PXA-R, green light emitting area PXA-G, and blue light emitting area PXA-B.

The base substrate BL may be disposed on the color filter layer CFL. The base substrate BL may provide a base surface on which the color filter layer CFL and the light control layer CCL are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view showing a portion of a display apparatus according to an embodiment. FIG. 8 illustrates a schematic cross-sectional view of a portion corresponding to the display panel DP of FIG. 7. In a display apparatus DD-TD of an embodiment, a light emitting device ED-BT may include multiple light emitting structures OL-B1, OL-B2, and OL-B3. The light emitting device ED-BT may include the first electrode EL1 and the second electrode EL2 facing each other, and the light emitting structures OL-B1, OL-B2, and OL-B3 provided by being sequentially stacked in a thickness direction between the first electrode EL1 and the second electrode EL2. The light emitting structures OL-B1, OL-B2, and OL-B3 may each include the emission layer EML (FIG. 7), a hole transport region HTR, and an electron transport region ETR disposed, with the emission layer EML (FIG. 7) disposed therebetween.

For example, the light emitting device ED-BT included in the display apparatus DD-TD according to an embodiment may be a light emitting device having a tandem structure including multiple emission layers.

In an embodiment illustrated in FIG. 8, light emitted from each of the light emitting structures OL-B1, OL-B2, and OL-B3 may all be blue light. However, embodiments are not limited thereto, and wavelength ranges of light emitted from each of the light emitting structures OL-B1, OL-B2, and OL-B3 may be different from each other. For example, the light emitting device ED-BT including the light emitting structures OL-B1, OL-B2, and OL-B3 emitting light in different wavelength ranges may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

Hereinafter, with reference to Examples and Comparative Examples, a light emitting device according to an embodiment including a polycyclic compound according to an embodiment will be described. The Examples shown below are illustrated only for the understanding of the disclosure, and the scope thereof is not limited thereto.

EXAMPLES

1. Synthesis of Polycyclic Compounds of Examples

A process of synthesizing a polycyclic compound according to an embodiment will be described by presenting a process of synthesizing Compounds A-8, B-18, and C-17 as an example. A process of synthesizing polycyclic compounds, which will be described hereinafter, is provided as an example, and thus a process of synthesizing compounds according to an embodiment is not limited to Examples below.

1. Synthesis of Compound A-8

Compound 1 according to an embodiment may be synthesized by, for example, Reaction Formula 1 below.

[Reaction Formula 1]

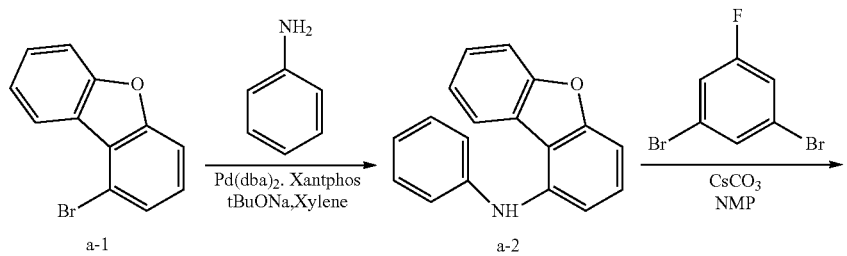

-continued
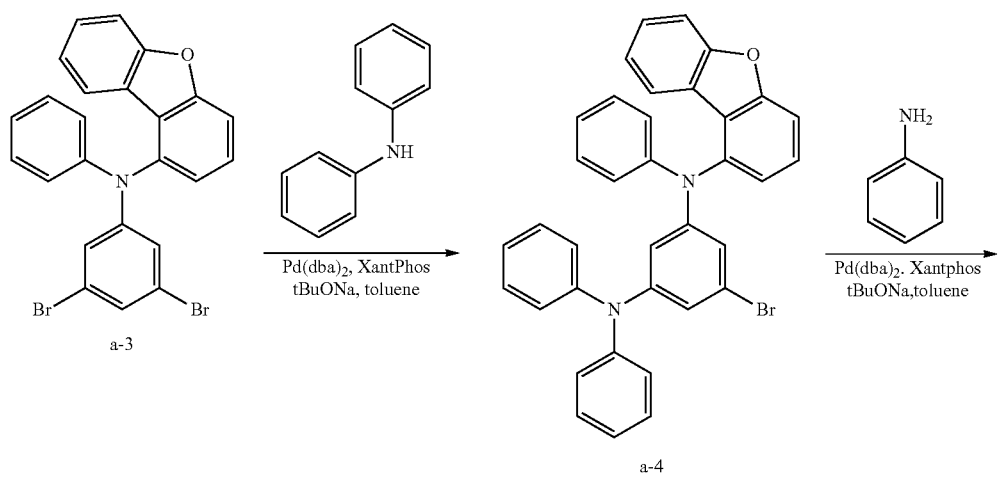
a-3
a-4
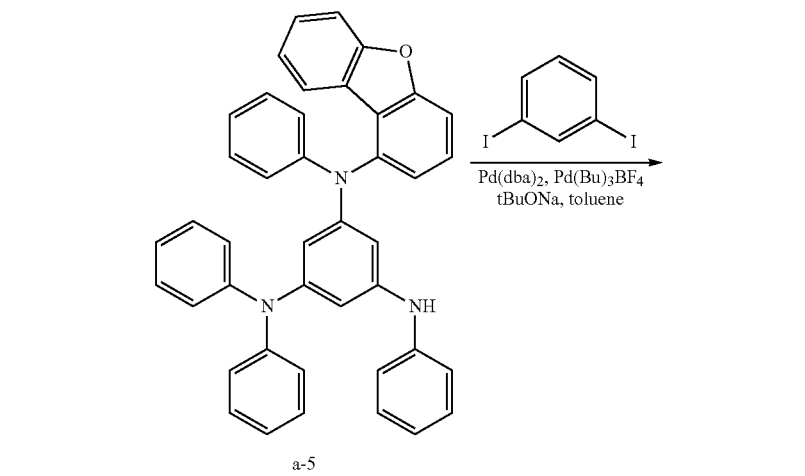
a-5
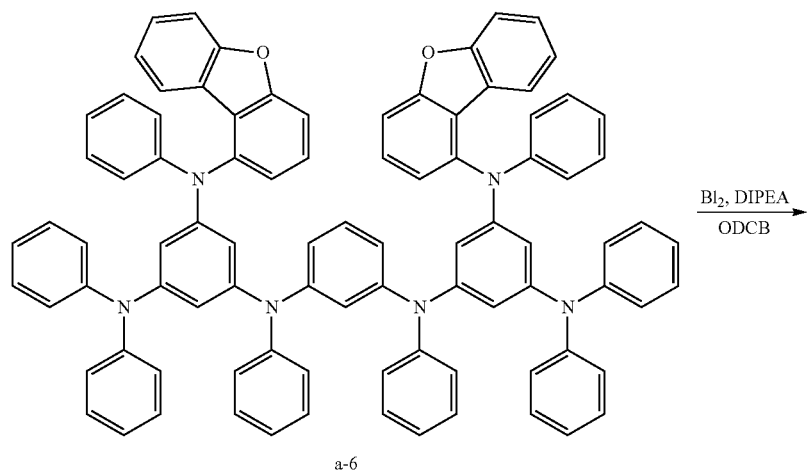
a-6

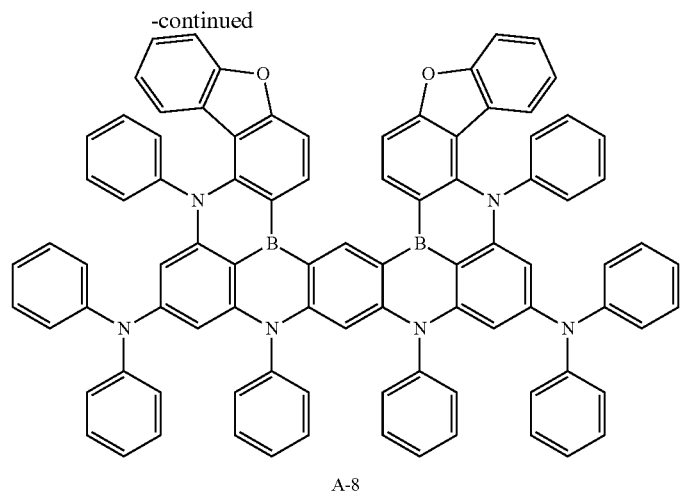

A-8

Compound a-1 (100 g, 404 mmol), aniline (56 g, 607 mmol), and tBuONa (46 g, 486 mmol), Pd(dba)$_2$ (12 g, 21 mmol), and xantPhos (13 g, 25 mmol) were added to a three-neck flask, substituted with argon (Ar), toluene (1500 mL) was added thereto, and the mixture was stirred at 60° C. for three hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (108 g, yield: 80%). The obtained purified product was confirmed to have a molecular weight of 335 as measured by FAB-MS, and it was confirmed that Compound a-2 was obtained.

Compound a-2 (100 g, 299 mmol) was added to a three-neck flask, substituted with argon (Ar), NMP (700 mL) was added thereto to be dissolved, and the mixture was stirred at 190° C. for five hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (110 g, yield: 75%). The obtained purified product was confirmed to have a molecular weight of 493 as measured by FAB-MS, and it was confirmed that Compound a-3 was obtained.

Compound a-3 (100 g, 203 mmol), diphenylamine (36 g, 213 mmol), tBuONa (23 g, 243 mmol), Pd(dba)$_2$ (4.7 g, 8.1 mmol), and xantPhos (4.7 g, 8.1 mmol) were added to a three-neck flask, substituted with argon (Ar), toluene (1000 mL) was added thereto, and the mixture was stirred at 60° C. for two hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (111 g, yield: 94%). The obtained purified product was confirmed to have a molecular weight of 581 as measured by FAB-MS, and it was confirmed that Compound a-4 was obtained.

Compound a-4 (100 g, 172 mmol), aniline (17 g, 189 mmol), tBuONa (20 g, 207 mmol), Pd(dba)$_2$ (5.0 g, 8.6 mmol), and xantPhos (5.5 g, 10 mmol) were added to a three-neck flask, substituted with argon (Ar), toluene (800 mL) was added thereto, and the mixture was stirred at 60° C. for six hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (70 g, yield: 69%). The obtained purified product was confirmed to have a molecular weight of 593 as measured by FAB-MS, and it was confirmed that Compound a-5 was obtained.

Compound a-5 (70 g, 118 mmol), 1,3-diiodobenzene (19 g, 59 mmol), tBuONa (34 g, 354 mmol), Pd(dba)$_2$ (5.4 g, 9.4 mmol), and P(tBu)3HBF4 (5.5 g, 19 mmol) were added to a three-neck flask, substituted with argon (Ar), toluene (600 mL) was added thereto, and the mixture was stirred at 80° C. for one hour. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (107 g, yield: 72%). The obtained purified product was confirmed to have a molecular weight of 1261 as measured by FAB-MS, and it was confirmed that Compound a-6 was obtained.

Compound a-6 (20 g, 16 mmol) was added to a three-neck flask, substituted with argon (Ar), BI3 (25 g, 64 mmol), and ODCB (160 mL) were added thereto to be dissolved, and DIPEA (11 mL, 63 mmol) was added thereto and stirred at 190° C. for 20 minutes. DIPEA (260 mL, 190 mmol) was added to the reaction mixture, and stirred for 30 minutes. The reaction solution was dispersed and washed using a large amount of acetonitrile, and the solid was collected through filtration. The obtained crude product was purified using silica gel column chromatography (a mixed solvent of hexane/dichloromethane) and a recrystallization solvent (a mixed solvent of ethanol/toluene) to obtain a yellow solid (6.5 g, yield: 32%). The obtained purified product was confirmed to have a molecular weight of 1277 as measured by FAB-MS, and it was confirmed that Compound A-8 was obtained.

1-2 Synthesis of Compound B-18

Compound B-18 according to an embodiment may be synthesized by, for example, Reaction Formulas 2-1 to 2-3 below.

[Reaction Formula 2-1]

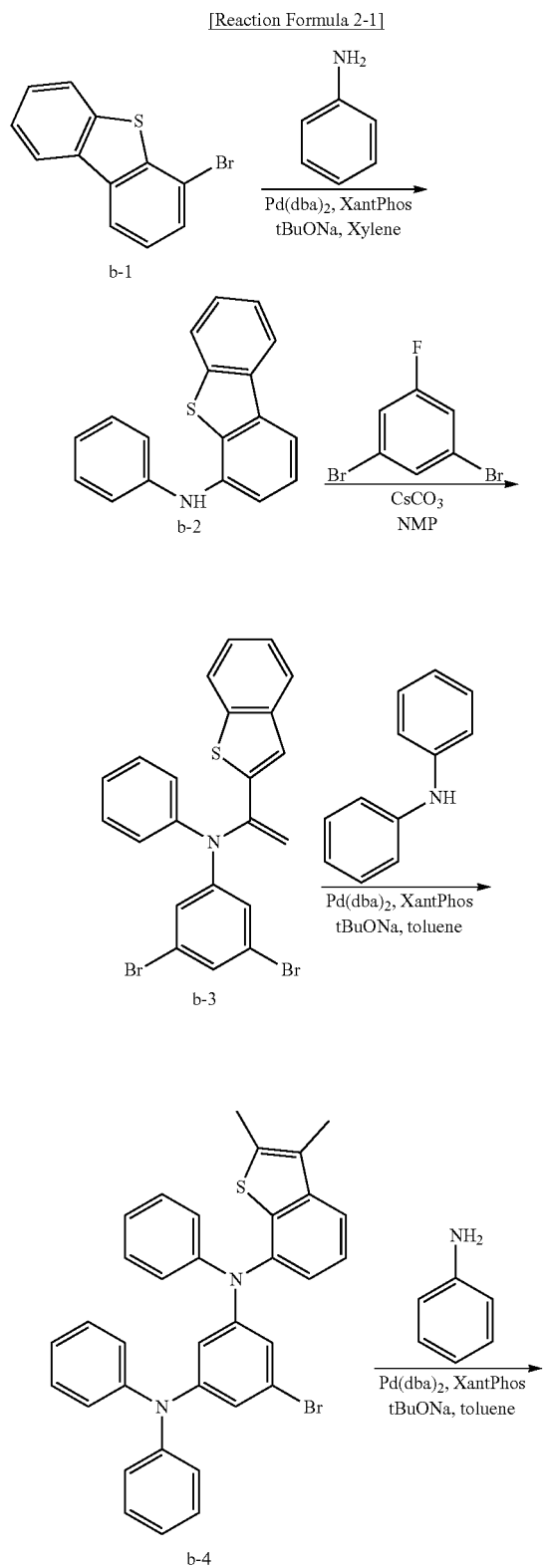

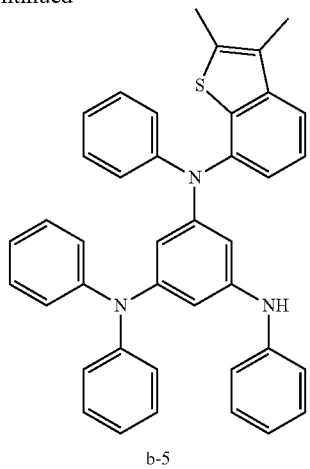

Compound b-1 (100 g, 380 mmol), aniline (70 g, 760 mmol), tBuONa (44 g, 456 mmol), Pd(dba)$_2$ (11 g, 19 mmol), and xantPhos (12 g, 23 mmol) were added to a three-neck flask, substituted with argon (Ar), toluene (1900 mL) was added thereto, and the mixture was stirred at 80° C. for one hour. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (90 g, yield: 86%). The obtained purified product was confirmed to have a molecular weight of 275 as measured by FAB-MS, and it was confirmed that Compound b-2 was obtained.

Compound b-2 (45 g, 163 mmol), 1,3-dibromo-5-fluorobenzene (50 g, 196 mmol), and CsCO$_3$ (80 g, 245 mmol) were added to a three-neck flask, substituted with argon (Ar), and NMP (400 mL) was added thereto to be dissolved, and the mixture was stirred at 180° C. for three hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (67 g, yield: 81%). The obtained purified product was confirmed to have a molecular weight of 509 as measured by FAB-MS, and it was confirmed that Compound b-3 was obtained.

Compound b-3 (67 g, 132 mmol), diphenylamine (23 g, 138 mmol), tBuONa (15 g, 158 mmol), Pd(dba)$_2$ (3.0 g, 5.2 mmol), and xantPhos (3.0 g, 5.3 mmol) were added to a three-neck flask, substituted with argon (Ar), toluene (700 mL) was added thereto, and the mixture was stirred at 60° C. for six hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (68 g, yield: 87%). The obtained purified product was confirmed to have a molecular weight of 598 as measured by FAB-MS, and it was confirmed that Compound b-4 was obtained.

Compound b-4 (65 g, 109 mmol), aniline (11 g, 120 mmol), tBuONa (12 g, 130 mmol), Pd(dba)$_2$ (3.1 g, 5.4 mmol), and xantPhos (3.4 g, 6.5 mmol) were added to a three-neck flask, substituted with argon (Ar), toluene (500 mL) was added thereto, and the mixture was stirred at 60° C. for two hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (40 g, yield: 60%). The obtained purified product was confirmed to have a molecular weight of 610 as measured by FAB-MS, and it was confirmed that Compound b-5 was obtained.

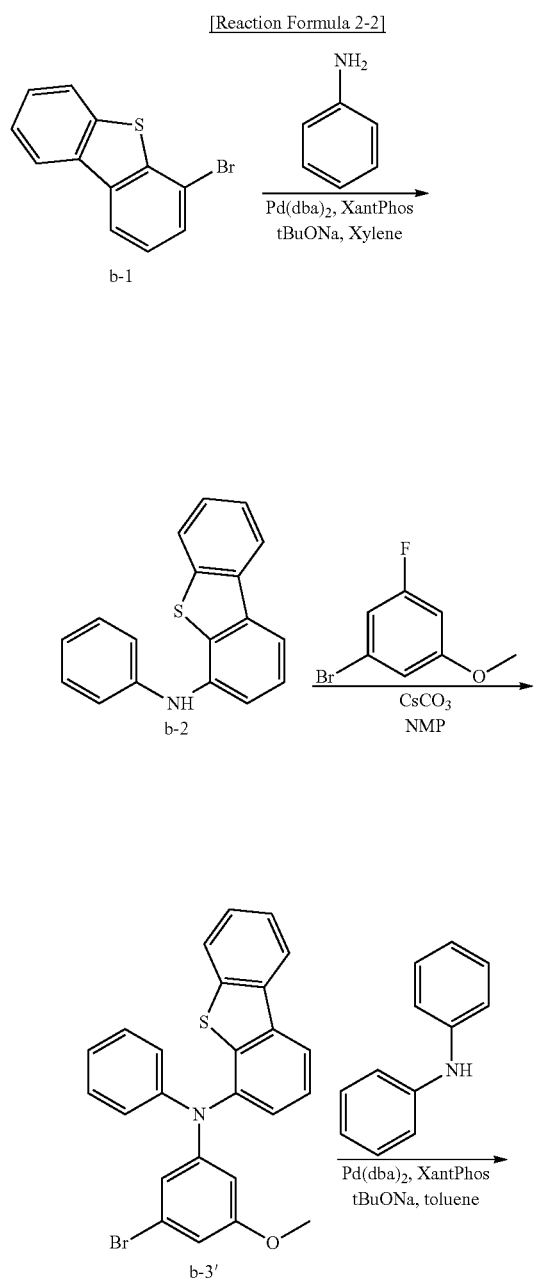

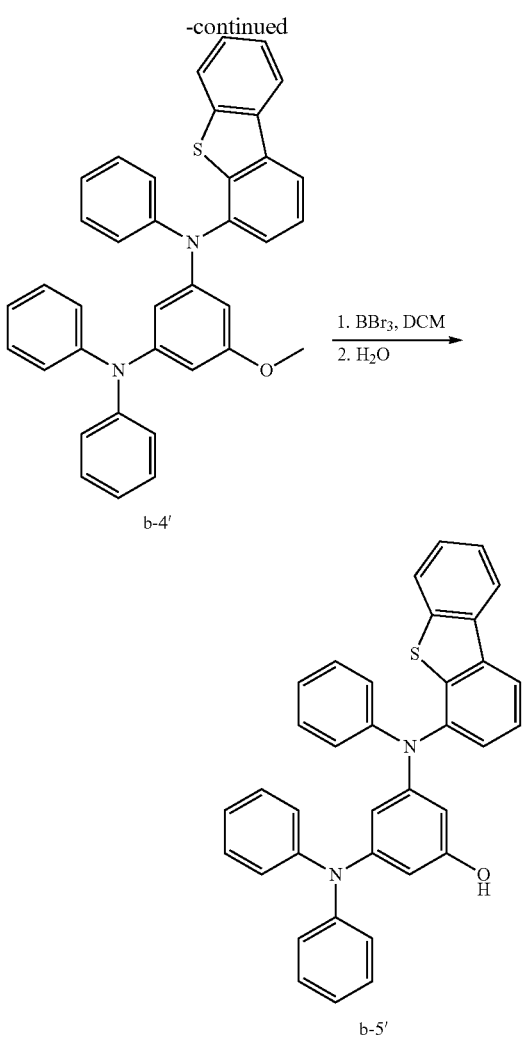

Compound b-2 (45 g, 163 mmol), 3-bromo-5-fluoroanisole (40 g, 196 mmol), and CsCO₃ (80 g, 245 mmol) were added to a three-neck flask, substituted with argon (Ar), NMP (400 mL) was added thereto to be dissolved, and the mixture was stirred at 190° C. for five hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (67 g, yield: 90%). The obtained purified product was confirmed to have a molecular weight of 460 as measured by FAB-MS, and it was confirmed that Compound b-3' was obtained.

Compound b-3' (60 g, 130 mmol), diphenylamine (23 g, 169 mmol), tBuONa (15 g, 156 mmol), Pd(dba)₂ (3.0 g, 5.2 mmol), and xantPhos (3.0 g, 5.3 mmol) were added to a three-neck flask, substituted with argon (Ar), toluene (500 mL) was added thereto, and the mixture was stirred at 60° C. for four hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (60 g, yield: 83%). The obtained purified product was confirmed to have a molecular weight of 549 as measured by FAB-MS, and it was confirmed that Compound b-4' was obtained.

Compound b-4' (50 g, 91 mmol) and BBr3 (57 g, 228 mmol) were added to a three-neck flask, substituted with argon (Ar), DCM (500 mL) was added thereto, and the mixture was stirred at room temperature for 12 hours. After adding water to the reaction mixture, an organic layer was extracted using DCM, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (46 g, yield: 95%). The obtained purified product was confirmed to have a molecular weight of 535 as measured by FAB-MS, and it was confirmed that Compound b-5' was obtained.

[Reaction Formula 2-3]

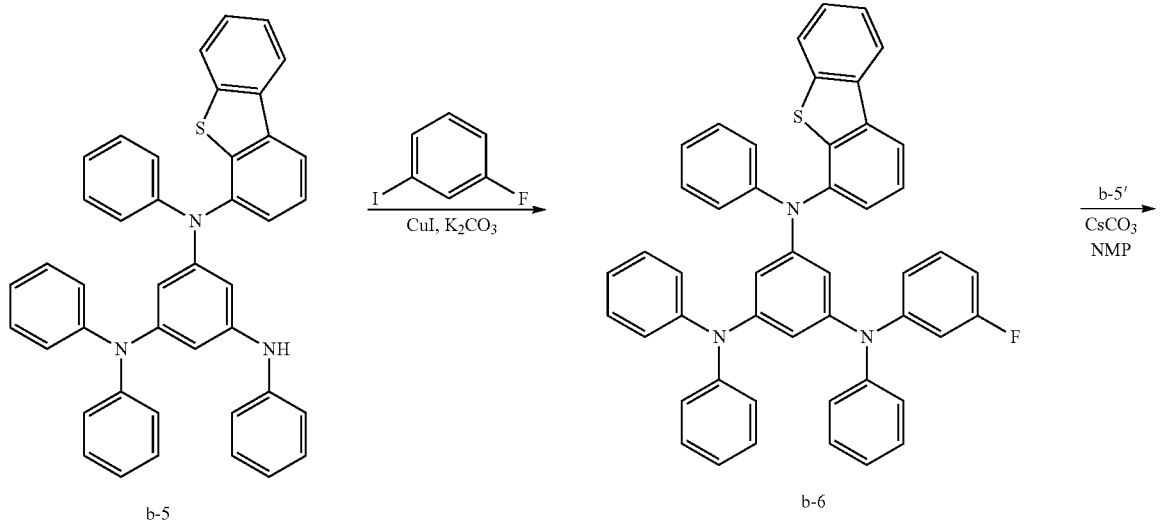

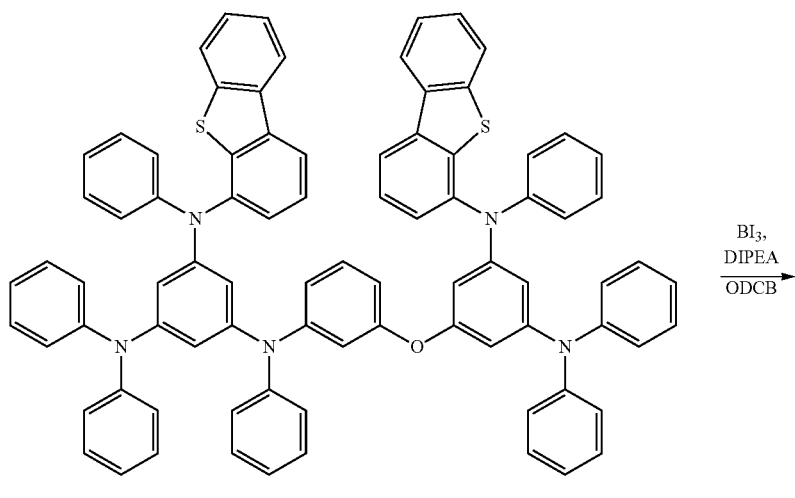

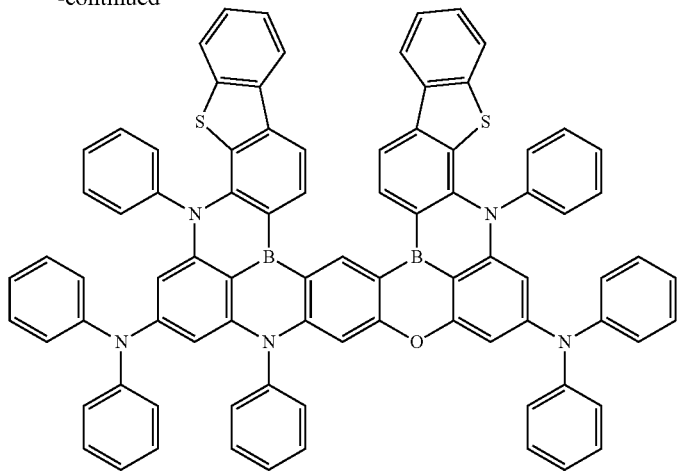

B-18

Compound b-5 (50 g, 82 mmol), 1-fluoro-3-iodobenzene (73 g, 328 mmol), K$_2$CO$_3$ (57 g, 410 mmol), and CuI (78 g, 410 mmol) were added to a three-neck flask, substituted with argon (Ar), and the mixture was stirred at 180° C. for 36 hours. After adding water to the reaction mixture, an organic layer was extracted using DCM, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (40 g, yield: 70%). The obtained purified product was confirmed to have a molecular weight of 704 as measured by FAB-MS, and it was confirmed that Compound b-6 was obtained.

Compound b-6 (40 g, 56 mmol), b-5' (36 g, 68 mmol), and CsCO$_3$ (28 g, 85 mmol) were added to a three-neck flask, substituted with argon (Ar), NMP (400 mL) was added thereto to be dissolved, and the mixture was stirred at 180° C. for four hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (46 g, yield: 67%). The obtained purified product was confirmed to have a molecular weight of 1218 as measured by FAB-MS, and it was confirmed that Compound b-7 was obtained.

Compound b-7 (20 g, 16 mmol) was added to a three-neck flask, substituted with argon (Ar), BI3 (26 g, 66 mmol), and ODCB (160 mL) were added thereto to be dissolved, and DIPEA (11 mL, 65 mmol) was added thereto and stirred at 160° C. for 10 minutes. DIPEA (260 mL, 190 mmol) was added to the reaction mixture, and stirred for 30 minutes. The reaction solution was dispersed and washed using a large amount of acetonitrile, and the solid was collected through filtration. The obtained crude product was purified using silica gel column chromatography (a mixed solvent of hexane/dichloromethane) and a recrystallization solvent (a mixed solvent of ethanol/toluene) to obtain a yellow solid (10 g, yield: 52%). The obtained purified product was confirmed to have a molecular weight of 1234 as measured by FAB-MS, and it was confirmed that Compound B-18 was obtained.

1-3 Synthesis of Compound C-17

Compound C-17 according to an embodiment may be synthesized by, for example, Reaction Formulas 3-1 to 3-3 below.

[Reaction Formula 3-1]

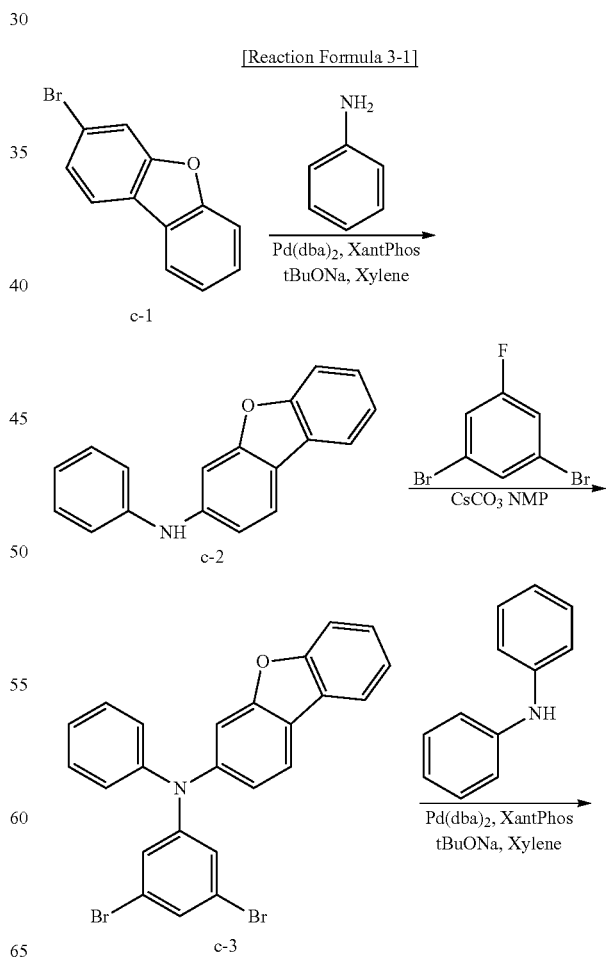

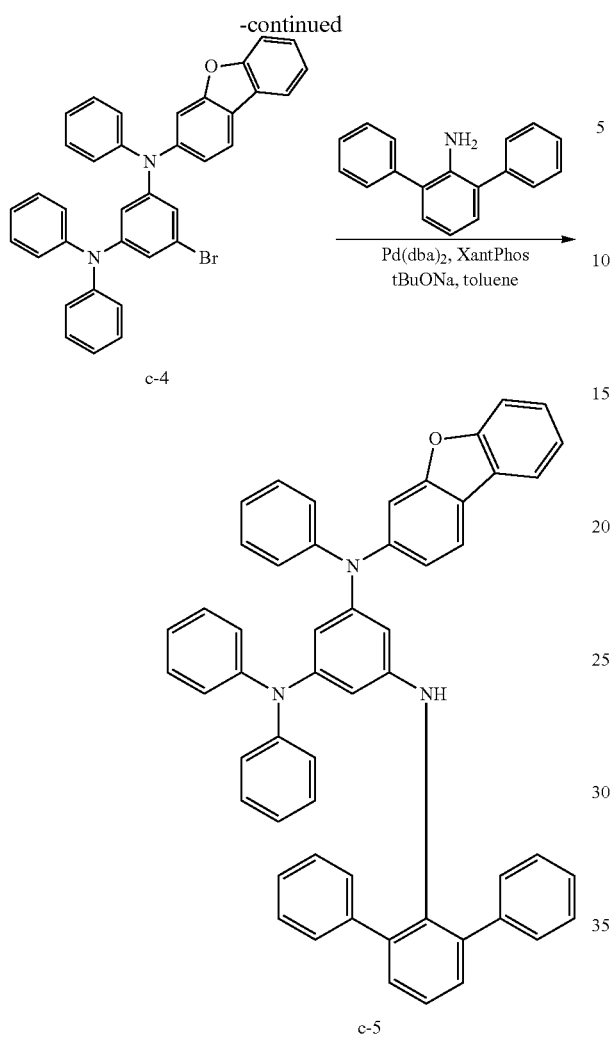

c-4 c-5

Compound c-1 (100 g, 405 mmol), aniline (113 g, 1214 mmol), tBuONa (47 g, 486 mmol), Pd(dba)₂ (12 g, 20 mmol), and xantPhos (13 g, 25 mmol) were added to a three-neck flask, substituted with argon (Ar), toluene (2000 mL) was added thereto, and the mixture was stirred at 60° C. for one hour. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (81 g, yield: 78%). The obtained purified product was confirmed to have a molecular weight of 259 as measured by FAB-MS, and it was confirmed that Compound c-2 was obtained.

Compound c-2 (50 g, 193 mmol), 1,3-dibromo-5-fluorobenzene (59 g, 254 mmol), and CsCO₃ (94 g, 290 mmol) were added to a three-neck flask, substituted with argon (Ar), NMP (500 mL) was added thereto to be dissolved, and the mixture was stirred at 180° C. for two hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (86 g, yield: 90%). The obtained purified product was confirmed to have a molecular weight of 493 as measured by FAB-MS, and it was confirmed that Compound c-3 was obtained.

Compound c-3 (80 g, 162 mmol), diphenylamine (29 g, 170 mmol), tBuONa (19 g, 195 mmol), Pd(dba)₂ (3.7 g, 6.5 mmol), and xantPhos (3.7 g, 6.5 mmol) were added to a three-neck flask, substituted with argon (Ar), xylene (800 mL) was added thereto, and the mixture was stirred at 60° C. for three hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (78 g, yield: 83%). The obtained purified product was confirmed to have a molecular weight of 581 as measured by FAB-MS, and it was confirmed that Compound c-4 was obtained.

Compound c-4 (75 g, 129 mmol), terphenylamine (35 g, 142 mmol), tBuONa (15 g, 155 mmol), Pd(dba)₂ (3.7 g, 6.5 mmol), and xantPhos (4.0 g, 7.7 mmol) were added to a three-neck flask, substituted with argon (Ar), toluene (500 mL) was added thereto, and the mixture was stirred at 60° C. for five hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (51 g, yield: 53%). The obtained purified product was confirmed to have a molecular weight of 746 as measured by FAB-MS, and it was confirmed that Compound c-5 was obtained.

[Reaction Formula 3-2]

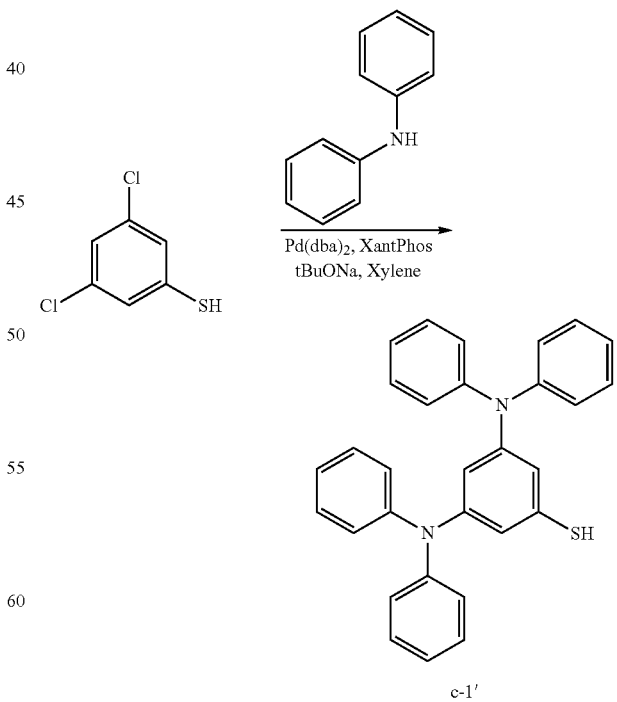

c-1'

3,5-dichlorobenzenethiol (50 g, 279 mmol), diphenylamine (236 g, 1396 mmol), tBuONa (64 g, 670 mmol), Pd(dba)$_2$ (12.8 g, 22 mmol), and xantPhos (26 g, 45 mmol) were added to a three-neck flask, substituted with argon (Ar), xylene (1500 mL) was added thereto, and the mixture was stirred at 120° C. for eight hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (58 g, yield: 47%). The obtained purified product was confirmed to have a molecular weight of 445 as measured by FAB-MS, and it was confirmed that Compound c-1' was obtained.

[Reaction Formula 3-3]

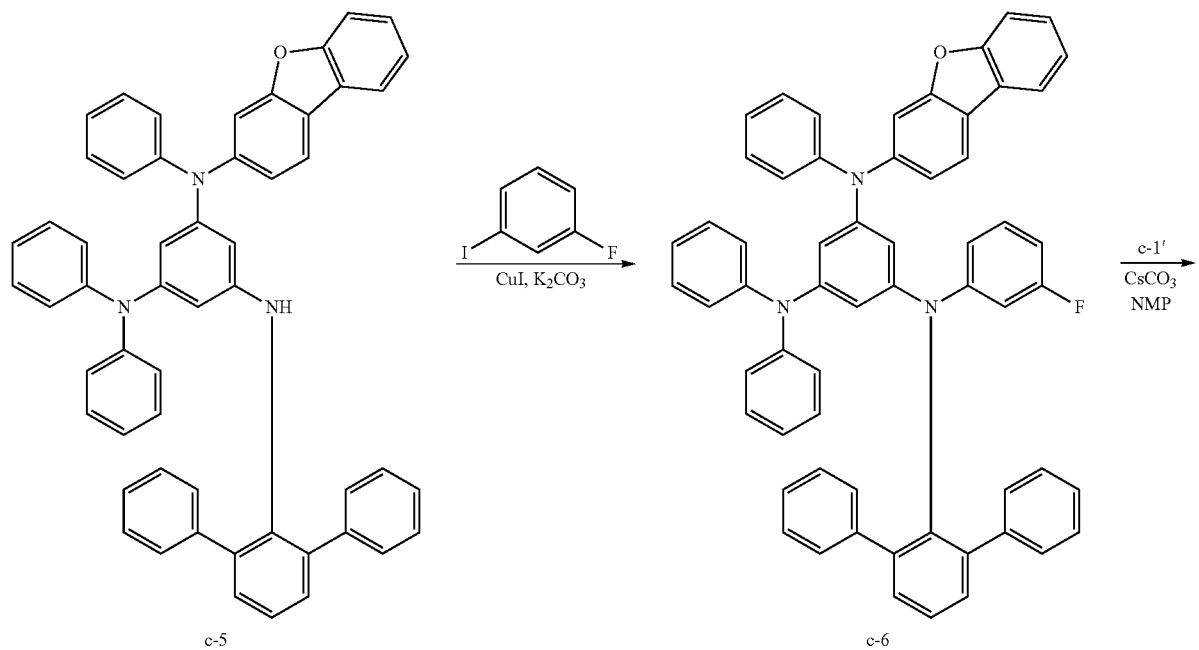

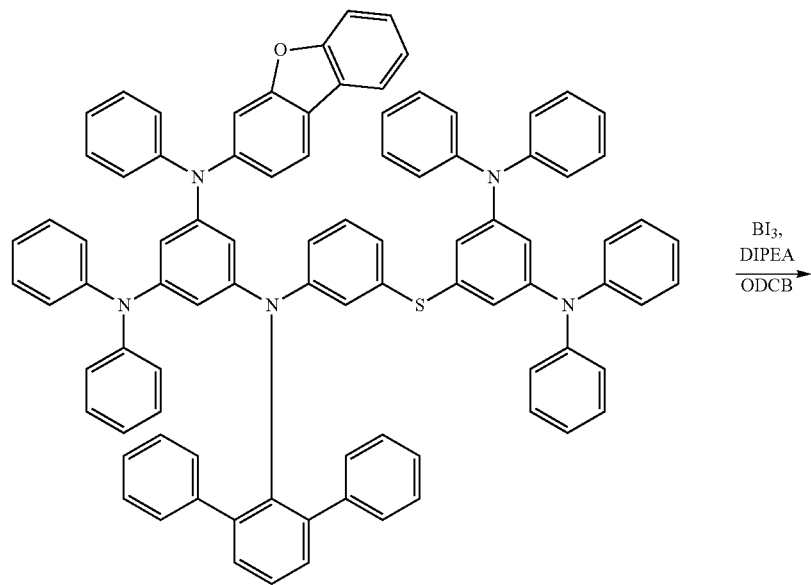

-continued

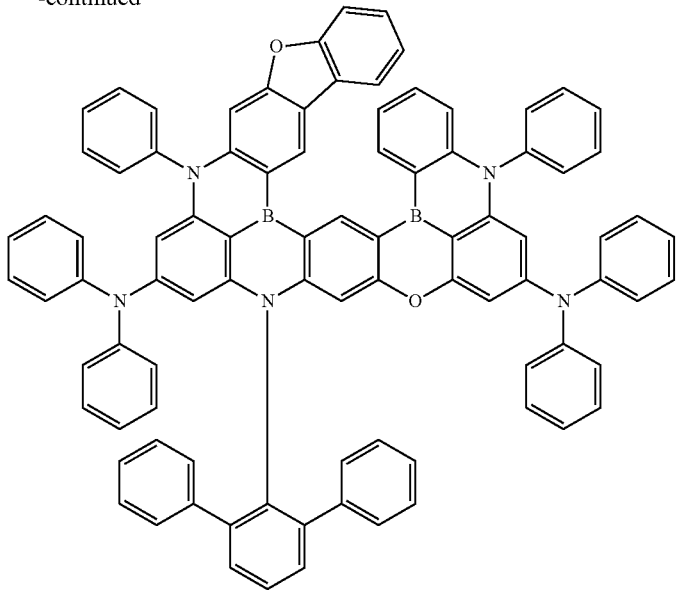

C-17

Compound c-5 (50 g, 84 mmol), 1-fluoro-3-iodobenzene (75 g, 337 mmol), K₂CO₃ (58 g, 422 mmol), and CuI (80 g, 422 mmol) were added to a three-neck flask, substituted with argon (Ar), and the mixture was stirred at 180° C. for 50 hours. After adding water to the reaction mixture, an organic layer was extracted using DCM, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (42 g, yield: 70%). The obtained purified product was confirmed to have a molecular weight of 704 as measured by FAB-MS, and it was confirmed that Compound c-6 was obtained.

Compound c-6 (40 g, 57 mmol), c-1' (30 g, 68 mmol), and CsCO₃ (28 g, 85 mmol) were added to a three-neck flask, substituted with argon (Ar), NMP (200 mL) was added thereto to be dissolved, and the mixture was stirred at 180° C. for three hours. After adding water to the reaction mixture, an organic layer was extracted using toluene, and dried using magnesium sulfate to remove the solvent. The obtained crude product was purified using silica gel column chromatography (a mixed solvent of hexane/toluene) and a recrystallization solvent (a mixed solvent of ethanol/toluene) to obtain a white solid (44 g, yield: 70%). The obtained purified product was confirmed to have a molecular weight of 1112 as measured by FAB-MS, and it was confirmed that Compound c-7 was obtained.

Compound c-7 (20 g, 18 mmol) was added to a three-neck flask, substituted with argon (Ar), BI3 (28 g, 72 mmol), and ODCB (180 mL) were added thereto to be dissolved, and DIPEA (13 mL, 72 mmol) was added thereto and stirred at 160° C. for 20 minutes. DIPEA (290 mL, 214 mmol) was added to the reaction mixture, and stirred for 30 minutes. The reaction solution was dispersed and washed using a large amount of acetonitrile, and the solid was collected through filtration. The obtained crude product was purified using silica gel column chromatography (a mixed solvent of hexane/dichloromethane) and a recrystallization solvent (a mixed solvent of ethanol/toluene) to obtain a yellow solid (5.1 g, yield: 25%). The obtained purified product was confirmed to have a molecular weight of 1127 as measured by FAB-MS, and it was confirmed that Compound C-17 was obtained.

2. Evaluation of Physical Properties of Polycyclic Compounds

[Molecular Orbit Calculation]

Table 1 below shows S1 energy levels and T1 energy levels of Example compounds A-8, B-18, and C-17, and Comparative Example compounds X1 to X6. The S1 levels and the T1 energy levels were calculated using a non-empirical molecular orbital method. The calculation was performed based on B3LYP as functional and 6-31G(d) as a basis function, using Gaussian 09 from Gaussian.

TABLE 1

| Compound | S1 energy level | T1 energy level | ΔEst |
|---|---|---|---|
| Example Compound A-8 | 2.91 | 2.63 | 0.28 |
| Example Compound B-18 | 2.89 | 2.59 | 0.30 |
| Example Compound C-17 | 2.87 | 2.58 | 0.29 |
| Comparative Example Compound X1 | 2.90 | 2.58 | 0.32 |
| Comparative Example Compound X2 | 3.04 | 2.71 | 0.33 |
| Comparative Example Compound X3 | 2.92 | 2.59 | 0.32 |
| Comparative Example Compound X4 | 2.28 | 2.27 | 0.01 |
| Comparative Example Compound X5 | 2.73 | 2.26 | 0.47 |

TABLE 1-continued

| Compound | S1 energy level | T1 energy level | ΔEst |
|---|---|---|---|
| Comparative Example Compound X6 | 2.89 | 2.53 | 0.36 |

Comparative Example Compounds

[Comparative Example Compounds]

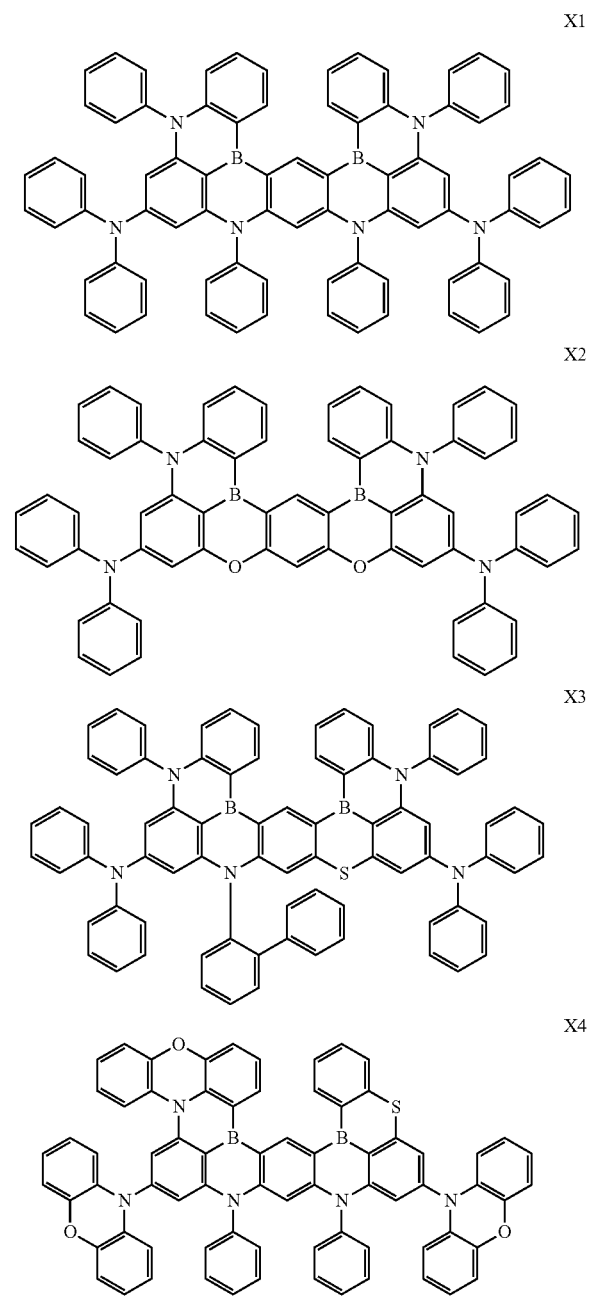

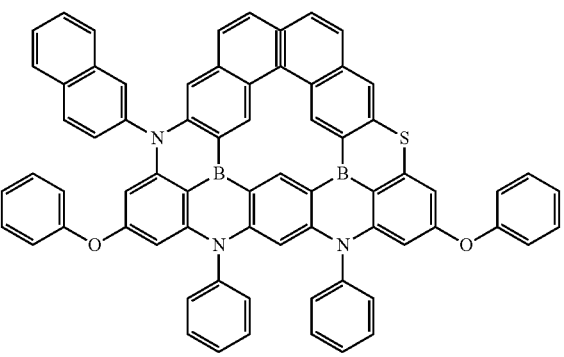

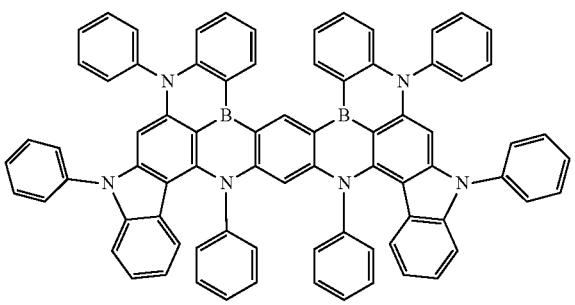

Example Compounds A-8, B-18, and C-17 had a smaller Δ Est than Comparative Example Compounds X1 to X3, X5, and X6, indicating that Example Compounds A-8, B-18, and C-17 satisfied a range of 0.2 to 0.3. Therefore, Example Compounds are applicable as a TADF dopant material. However, it is determined that unlike Comparative Compounds X1 to X3, X5, and X6, HOMO and LUMO were separated in Comparative Example Compound X4, and Comparative Example Compound $X_4$ was different in light emitting mechanism from Comparative Compounds X1 to X3, X5 and X6, thereby having a small Δ Est value.

[Evaluation of Fluorescence Characteristics]

To evaluate the luminescence characteristics, using a JASCO V-670 spectrometer, PPF and an Example Compound or a Comparative Example Compound were deposited on a quartz glass at 80:20, and the fluorescence spectra were measured and shown in Table 2. Fluorescence quantum yield was measured using a JASCOILF-835 integrating sphere system.

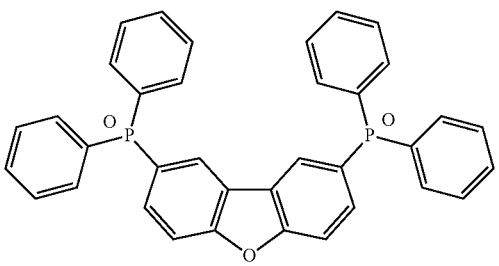

TABLE 2

| Compound | λmax/nm | Fluorescence quantum yield/% |
|---|---|---|
| Example Compound A-8 | 459 | 93.7 |
| Example Compound B-18 | 462 | 95.3 |
| Example Compound C-17 | 464 | 91.1 |
| Comparative Example Compound X1 | 467 | 85.5 |
| Comparative Example Compound X2 | 449 | 83.1 |
| Comparative Example Compound X3 | 465 | 83.2 |
| Comparative Example Compound X4 | 565 | 72.1 |
| Comparative Example Compound X5 | 486 | 67.2 |
| Comparative Example Compound X6 | 470 | 81.4 |

It is seen that Example Compounds A-8, B-18, and C-17 each had greater fluorescence quantum yields than Comparative Example Compounds X1 to X6.

3. Preparation and Evaluation of Light Emitting Devices (Preparation of Light Emitting Devices)

An ITO layer having a thickness of 1,500 Å was patterned on a glass substrate, washed with ultrapure water, and UV ozone-treated for 10 minutes to form a first electrode. A hole injection layer having a thickness of 100 Å was formed through vacuum deposition using HAT-CN on the first electrode. A hole transport layer having a thickness of 400 Å was formed through vacuum deposition using NPD on the hole injection layer. An electron blocking layer having a thickness of 100 Å was formed through vacuum deposition using mCP on the hole transport layer. On the electron blocking layer, mCBP and an Example Compound or a Comparative Example Compound were co-deposited at a weight ratio of 80:20 to form an emission layer having a thickness of 200 Å. An electron transport layer having a thickness of 300 Å was formed through deposition using TBPi on the emission layer, and an electron injection layer having a thickness of 5 Å was formed through deposition using Liq on the electron transport layer. A second electrode having a thickness of 1,000 Å was formed through vacuum deposition using aluminum (Al) on the electron injection layer. A capping layer having a thickness of 700 Å was formed through vacuum deposition using Compound P5 on the second electrode, thereby manufacturing a light emitting device. In Examples, a first electrode, a hole injection layer, a hole transport layer, an electron blocking layer, an emission layer, an electron transport layer, and an electron injection layer, a second electrode, and a capping layer were formed using a vacuum deposition apparatus.

The compounds used in the manufacturing of a light emitting device are shown below.

mCP
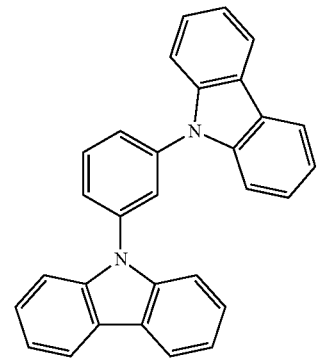

HAT-CN
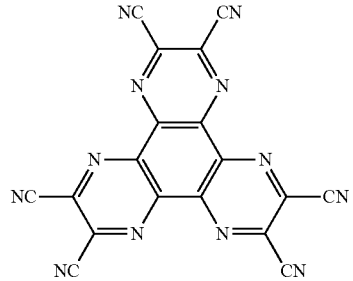

mCBP
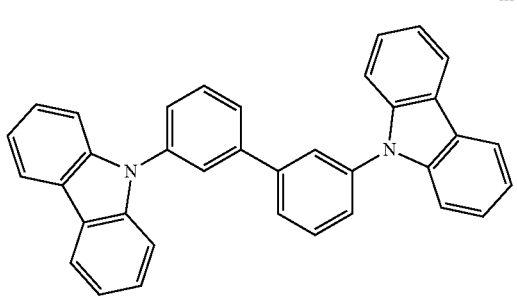

Liq
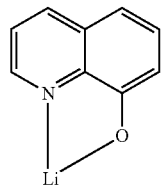

NPD
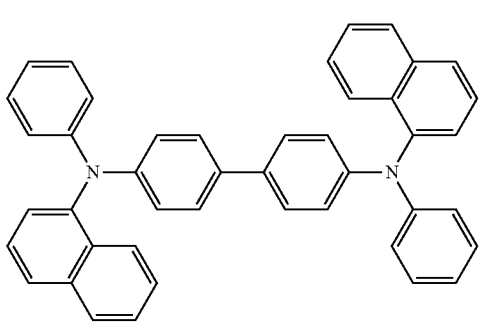

-continued

P5

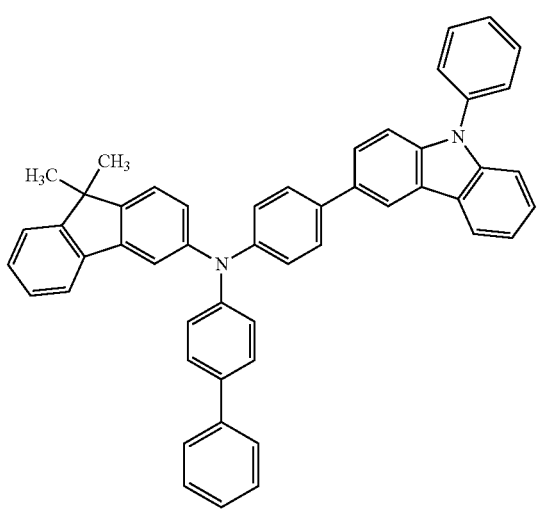

(Evaluation of Light Emitting Device Characteristics)

For evaluation of the characteristics of the light emitting devices according to Examples 1 to 3 and Comparative Examples 1 to 6, maximum values of external quantum efficiency were evaluated and shown in Table 3. Voltage and current density were measured using a source meter (Keithley Instrument, 2400 series), and luminance and external quantum efficiency were measured using an external quantum efficiency measuring apparatus (Hamamatsu Photonics, C9920-12)

TABLE 3

| Dopant Preparation example of element | | $\lambda max$ (Nm) | $EQE_{max}$ (%) | $LT_{50}$ (h) |
|---|---|---|---|---|
| Example 1 | Example Compound A-8 | 459 | 33.7 | 187 |
| Example 2 | Example Compound B-18 | 464 | 30.5 | 184 |
| Example 3 | Example Compound C-17 | 465 | 28.6 | 198 |
| Comparative Example 1 | Comparative Example Compound X1 | 469 | 25.2 | 45 |
| Comparative Example 2 | Comparative Example Compound X2 | 450 | 26.3 | 5 |
| Comparative Example 3 | Comparative Example Compound X3 | 466 | 26.9 | 90 |
| Comparative Example 4 | Comparative Example Compound X4 | 569 | 15.6 | 13 |
| Comparative Example 5 | Comparative Example Compound X5 | 488 | 7.5 | 21 |
| Comparative Example 6 | Comparative Example Compound X6 | 472 | 28.0 | 146 |

Comparing Examples 1 to 3 with Comparative Examples 1 to 6, it can be seen that the light emitting devices including Examples 1 to 3 exhibit a long service life. This is believed to be due to the fact that the compounds of Examples 1 to 3 have a greater molecular orbit over the entire molecule than the compounds of Comparative Examples 1 to 6, thereby improving electrical stability.

In the compounds of Comparative Examples 1 to 6, a portion having boron as a main skeleton is not substituted with a dibenzoheterole group. On the other hand, in the compounds of Examples 1 to 3, a portion having boron as a main skeleton is substituted with at least one dibenzoheterole group, and thus the compounds of Examples 1 to 3 have a long conjugation structure, thereby exhibiting improved electrical stability.

As described above, when Examples 1 to 3 are included, light emitting devices have increased lifespan compared to when Comparative Examples 1 and 6 are included. For example, the polycyclic compounds of Examples 1 to 3 include the substituted dibenzoheterole group in a boron-substituted benzene ring, and thus have high electrical stability, and accordingly, a light emitting device including the same may have increased lifespan.

The light emitting device according to an embodiment includes a polycyclic compound containing a dibenzoheterole group substituted on a boron-substituted benzene ring, and may thus have increased lifespan.

A light emitting device according to an embodiment includes a polycyclic compound according to an embodiment in an emission layer, and may thus exhibit long life characteristics.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:
a first electrode;
a second electrode disposed on the first electrode; and
an emission layer disposed between the first electrode and the second electrode, wherein
the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, W, In, Sn, Zn, an oxide thereof, a compound thereof, and a mixture thereof, and
the emission layer includes a polycyclic compound represented by Formula 1:

[Formula 1]

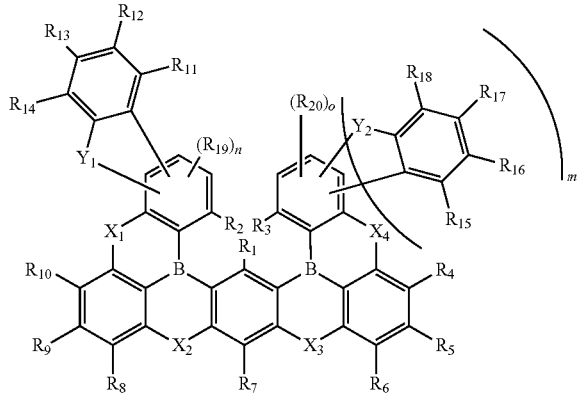

wherein in Formula 1, m and n are each independently 0 or 1, o is an integer from 0 to 3, $X_1$ to $X_4$ are each independently $N(Ra)$, $C(Rb)(Rc)$, O, or S, $Y_1$ and $Y_2$ are each independently $N(Rd)$, O, or S, and $R_1$ to $R_{20}$, and Ra to Rd are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

2. The light emitting device of claim 1, wherein the polycyclic compound represented by Formula 1 is represented by Formula 2-1 or Formula 2-2:

[Formula 2-1]

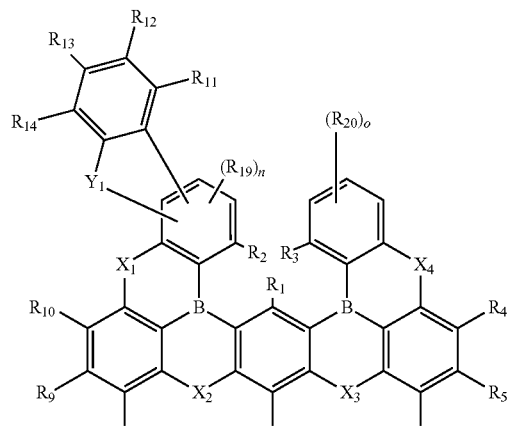

[Formula 2-2]

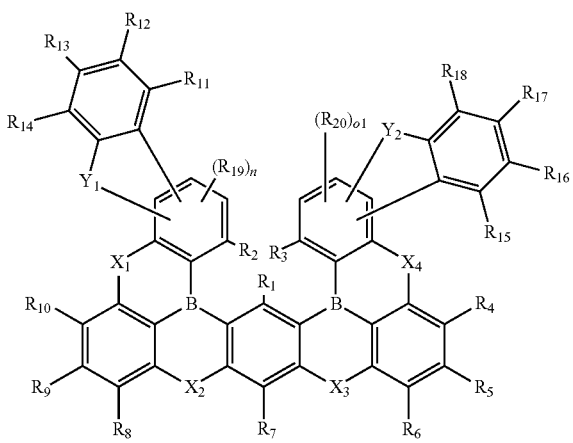

wherein in Formulas 2-1 and 2-2, n, o, $X_1$ to $X_4$, $Y_1$, $Y_2$, and $R_1$ to $R_{20}$ are the same as defined in connection with Formula 1, and wherein in Formula 2-2, o1 is 0 or 1.

3. The light emitting device of claim 1, wherein the polycyclic compound represented by Formula 1 is represented by one of Formulas 3-1 to 3-3:

[Formula 3-1]

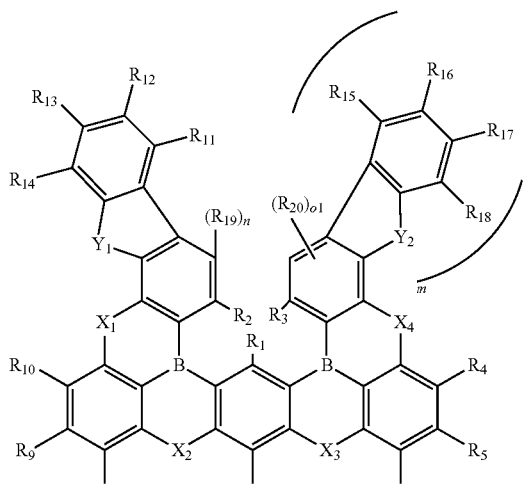

[Formula 3-2]

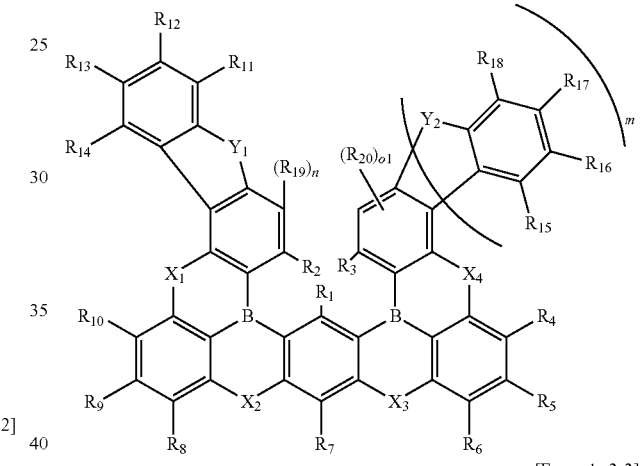

[Formula 3-3]

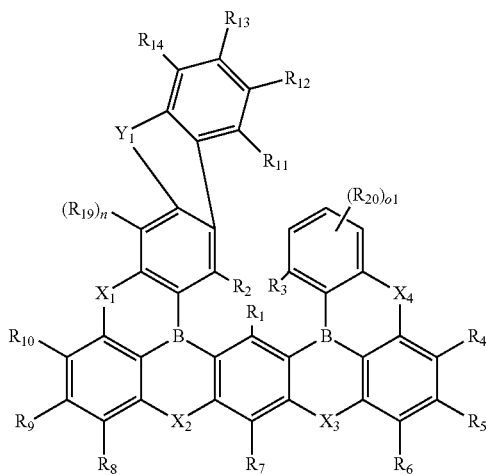

wherein in Formulas 3-1 to 3-3, m to o, $X_1$ to $X_4$, $Y_1$, $Y_2$, and $R_1$ to $R_{20}$ are the same as defined in connection with Formula 1, and wherein in Formulas 3-1 and 3-2, o1 is 0 or 1.

4. The light emitting device of claim 3, wherein in Formula 3-1, at least one of $R_{11}$ to $R_{18}$ is an unsubstituted phenyl group.

5. The light emitting device of claim 1, wherein the polycyclic compound represented by Formula 1 is represented by one of Formulas 4-1 to 4-3:

[Formula 4-1]

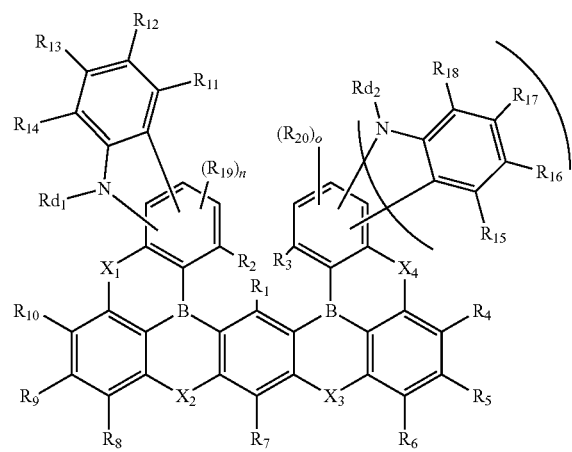

[Formula 4-2]

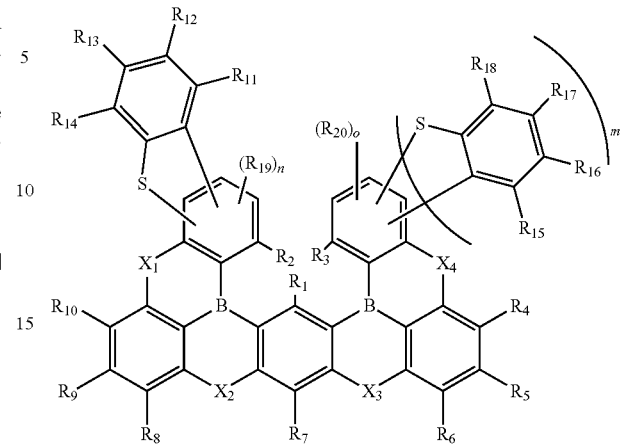

[Formula 4-3]

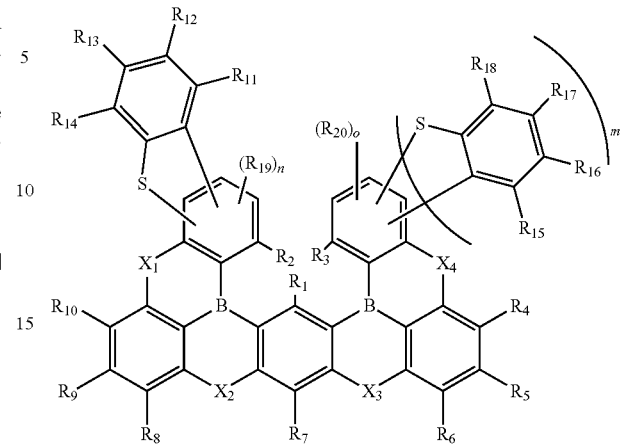

wherein in Formulas 4-1 to 4-3, m to o, $X_1$ to $X_4$, and $R_1$ to $R_{20}$ are the same as defined in connection with Formula 1, and $Rd_1$ and $Rd_2$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

6. The light emitting device of claim 1, wherein in Formula 1, at least one of $X_1$ to $X_4$ is N(Ra), and Ra is a substituted or unsubstituted phenyl group, a substituted or unsubstituted biphenyl group, or a substituted or unsubstituted terphenyl group.

7. The light emitting device of claim 1, wherein in Formula 1, at least one of $Y_1$ and $Y_2$ is N(Rd), and Rd is a substituted or unsubstituted phenyl group.

8. The light emitting device of claim 1, wherein the emission layer comprises a dopant and a host, the dopant contains the polycyclic compound.

9. The light emitting device of claim 1, wherein the emission layer emits thermally activated delayed fluorescence.

10. The light emitting device of claim 1, wherein the emission layer emits light having a central emission wavelength in a range of about 430 nm to about 490 nm.

11. The light emitting device of claim 1, wherein in Formula 1, $R_1$ to $R_{20}$ are each a deuterium atom.

12. The light emitting device of claim 1, wherein the emission layer comprises at least one compound selected from Compound Group 1:

[Compound Group 1]
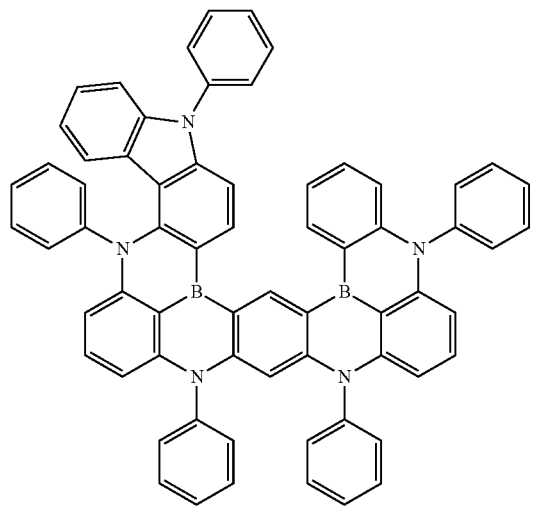
A-1
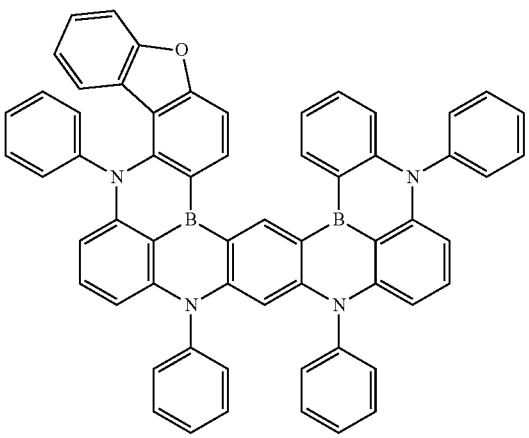
A-2
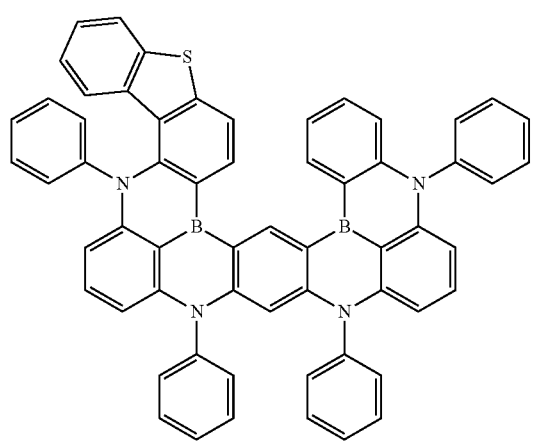
A-3
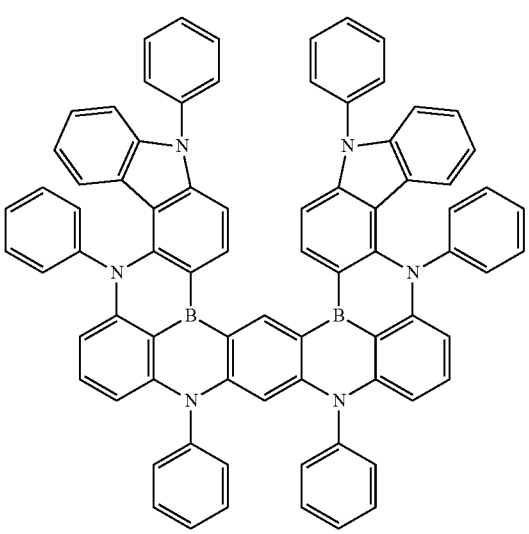
A-4
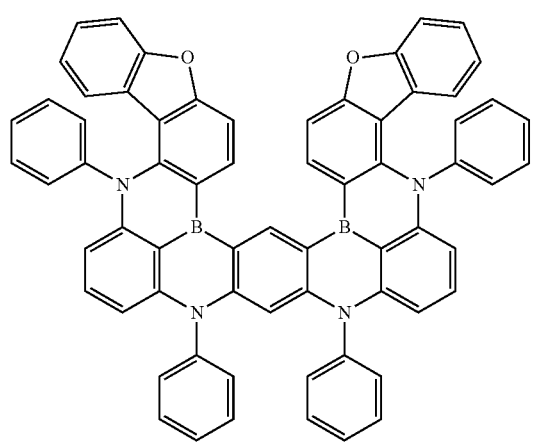
A-5
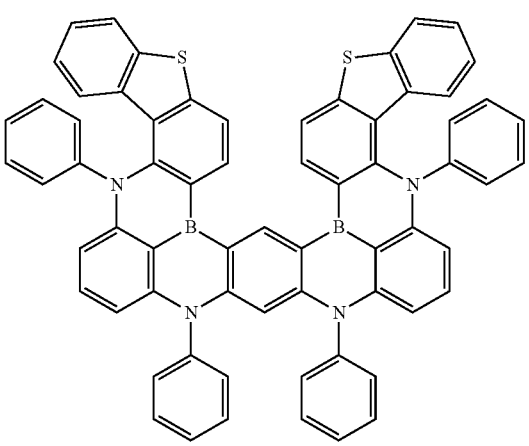
A-6

-continued
A-7
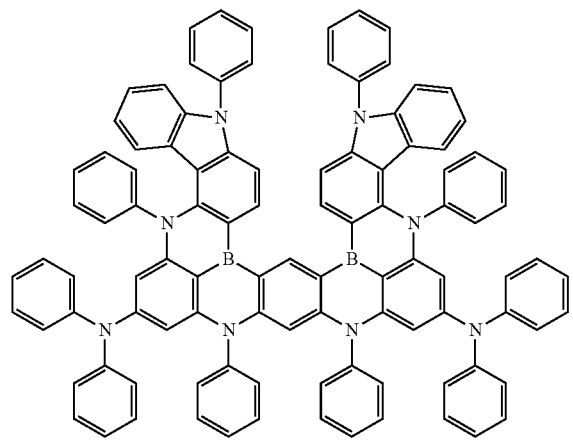
A-8
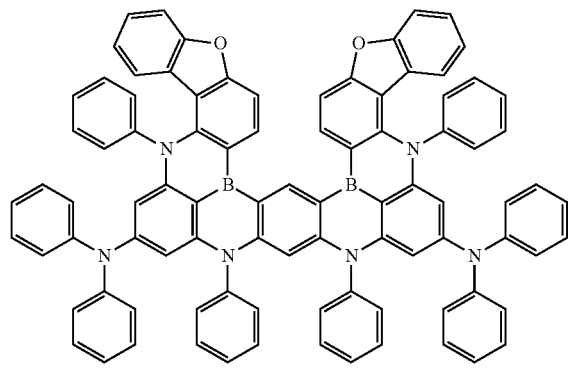
A-9
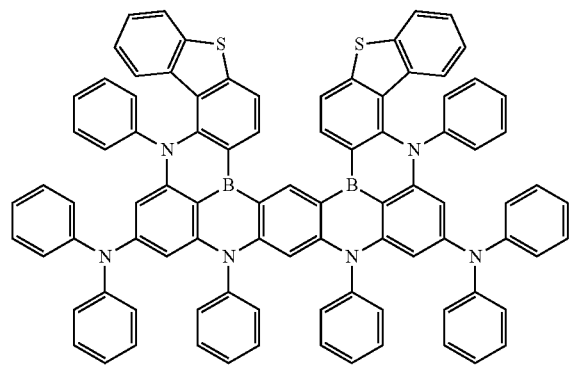
A-10
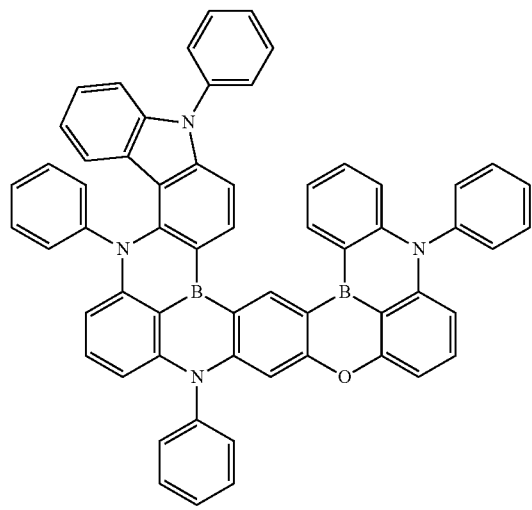
A-11
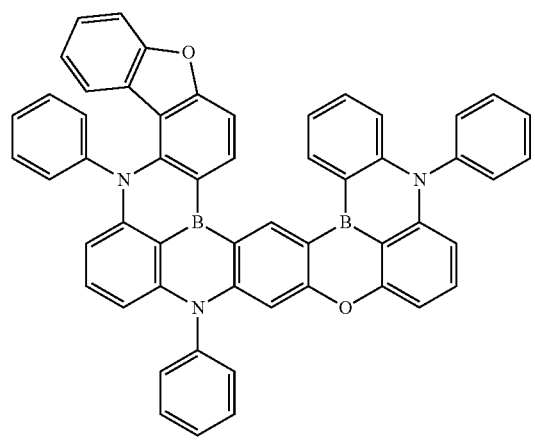
A-12
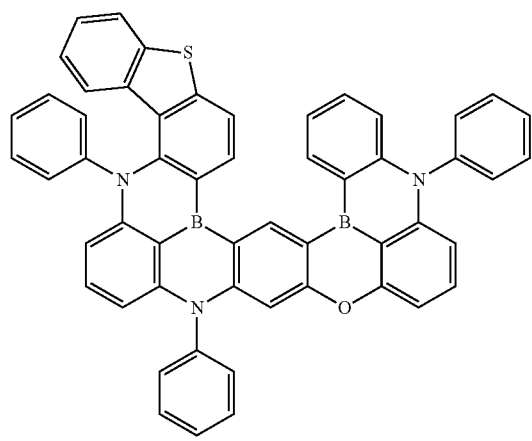

-continued
A-13
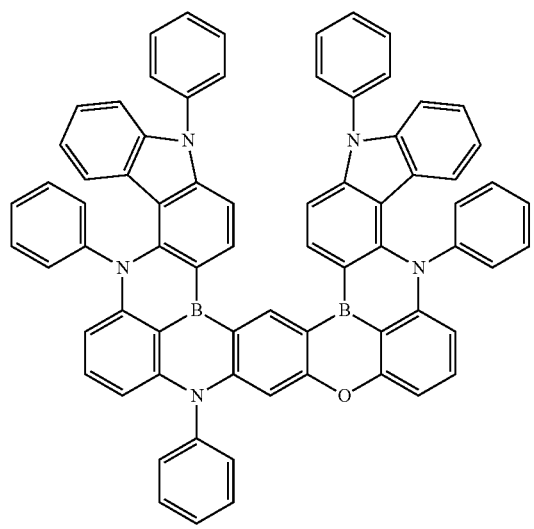
A-14
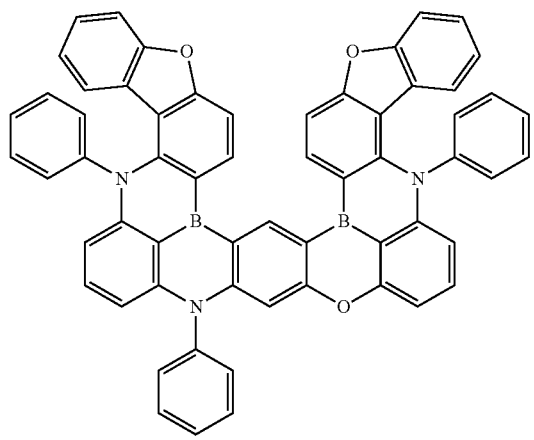
A-15
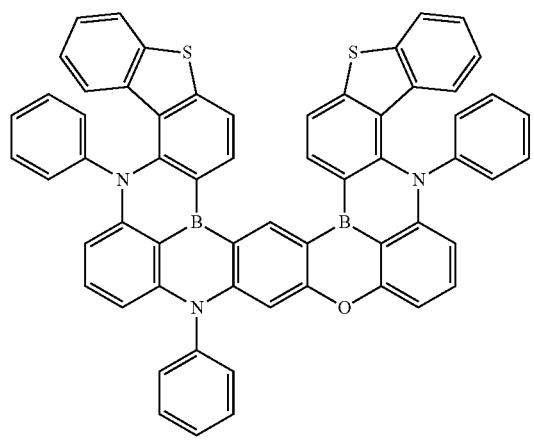
A-16
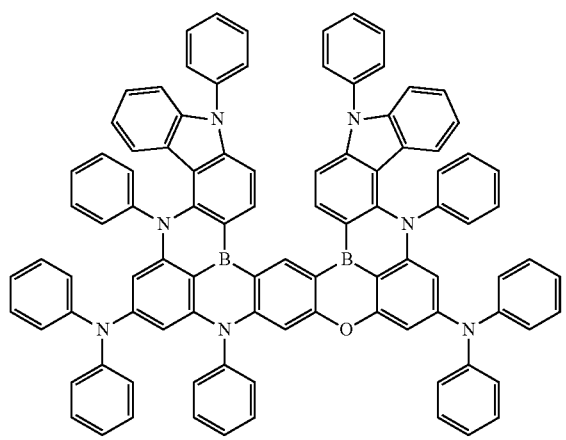
A-17
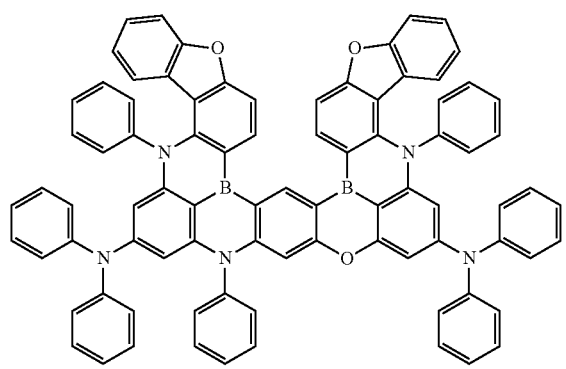
A-18
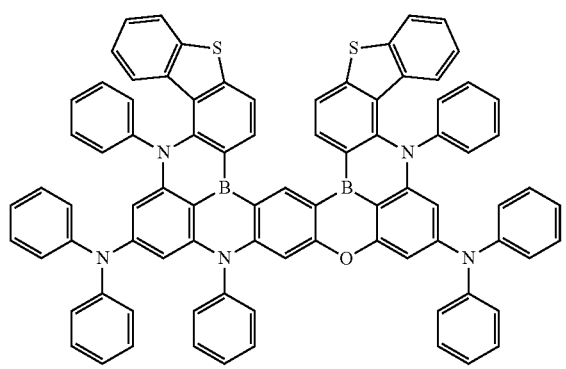

-continued
A-19
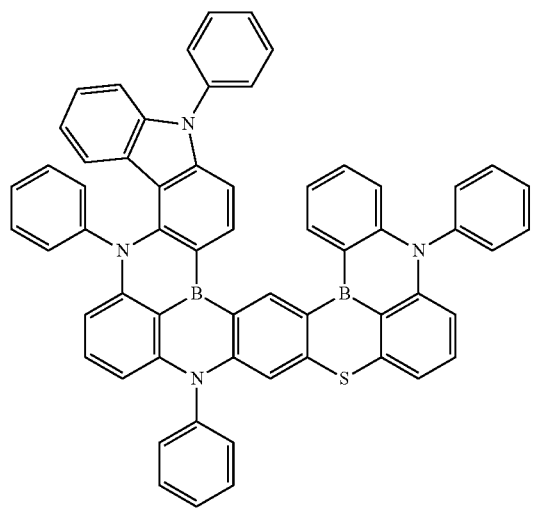
A-20
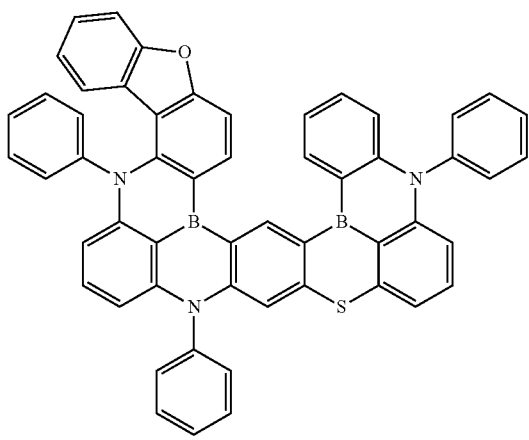
A-21
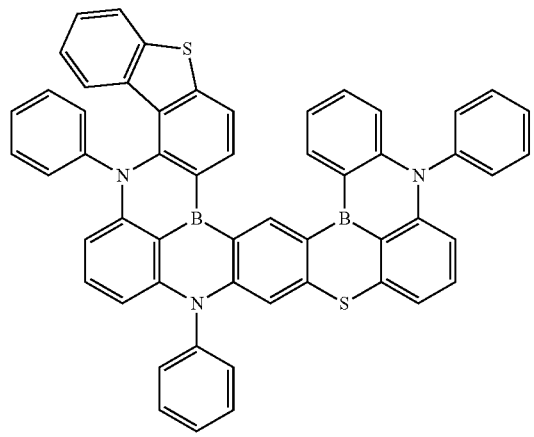
A-22
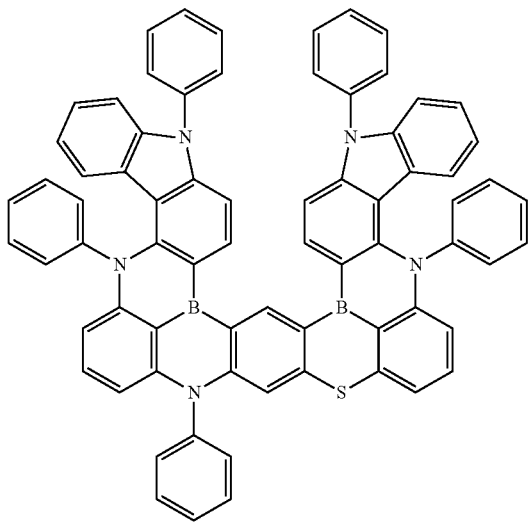
A-23
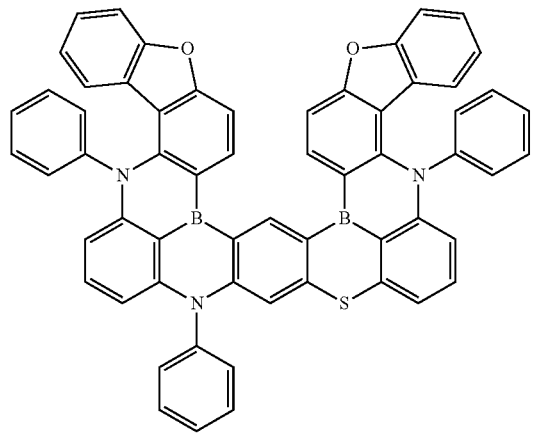
A-24
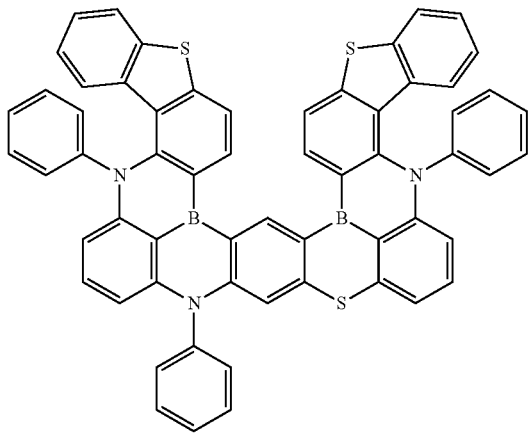

-continued
A-25
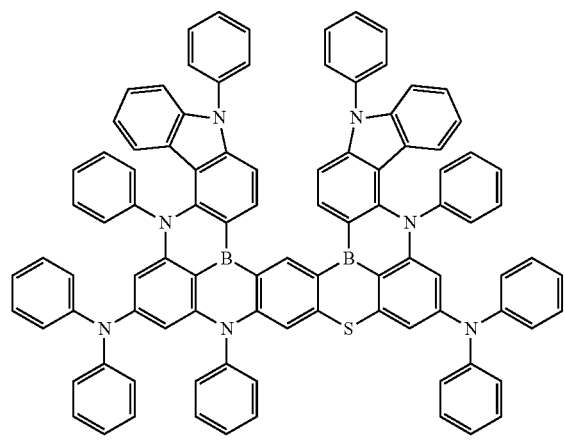
A-26
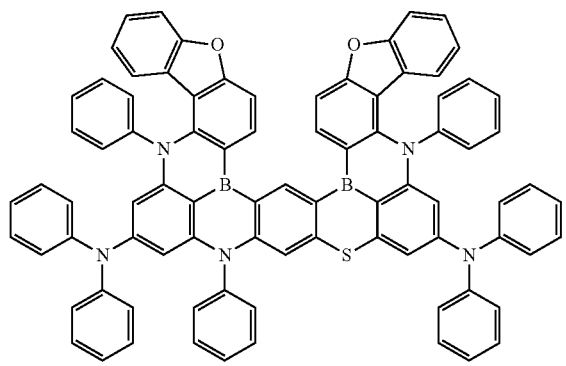
A-27
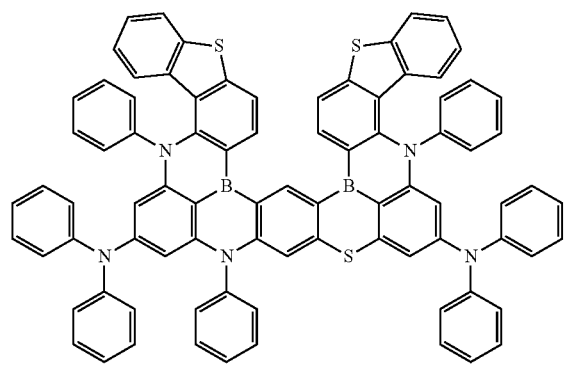
A-28
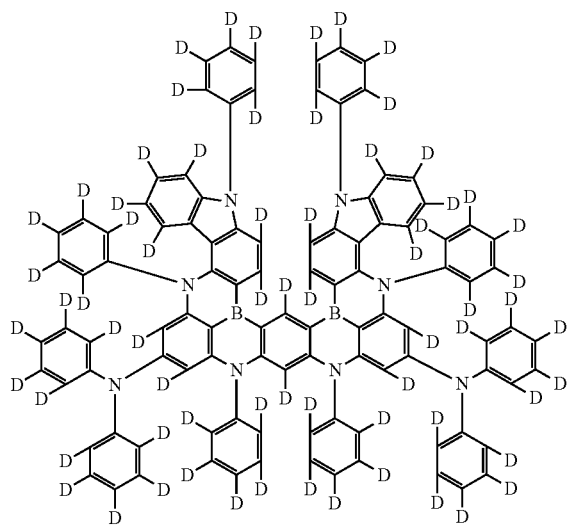
A-29
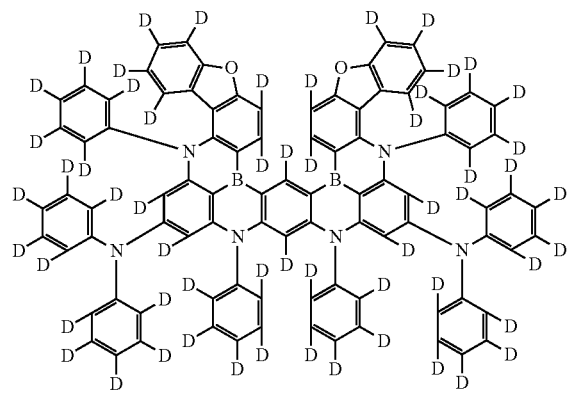
A-30
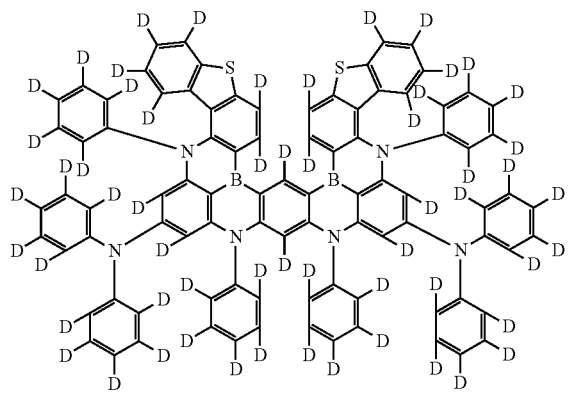

-continued
A-31
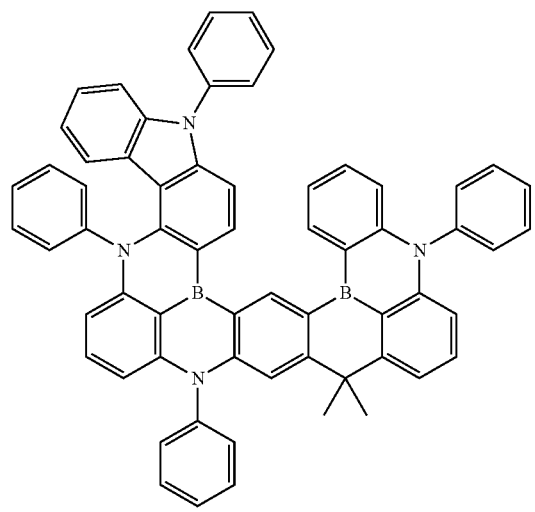
A-32
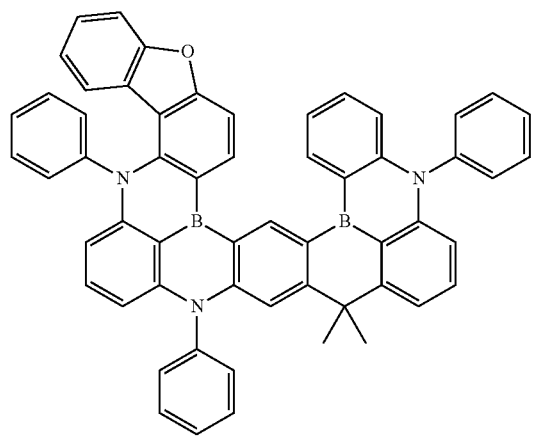
A-33
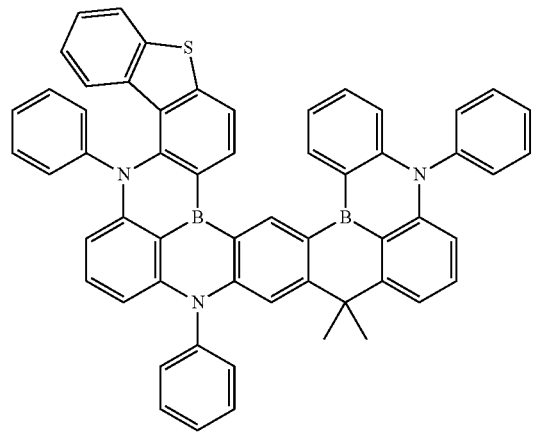
A-34
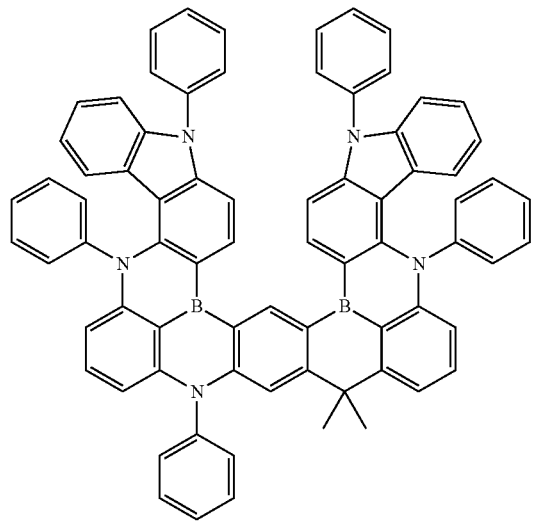
A-35
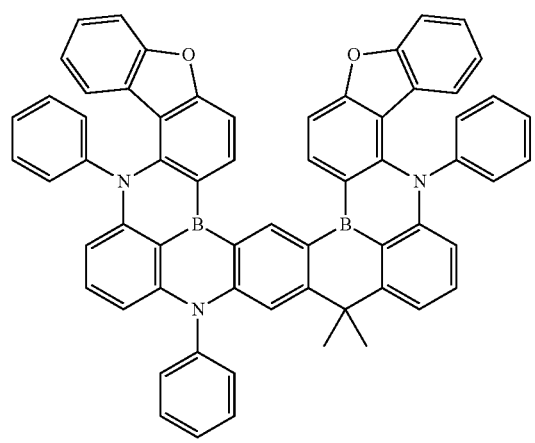
A-36
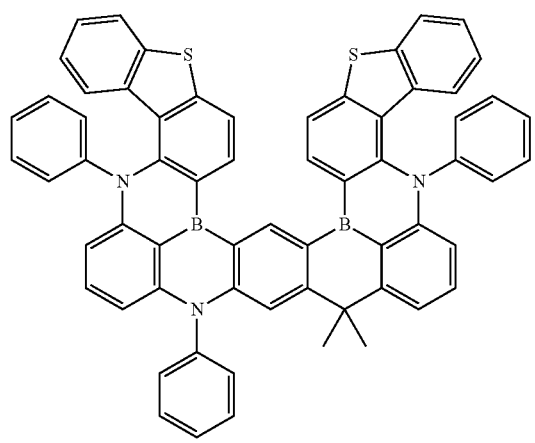

-continued
A-31
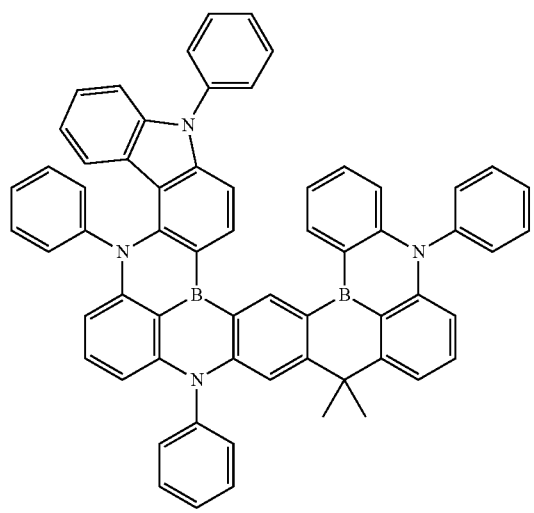
A-32
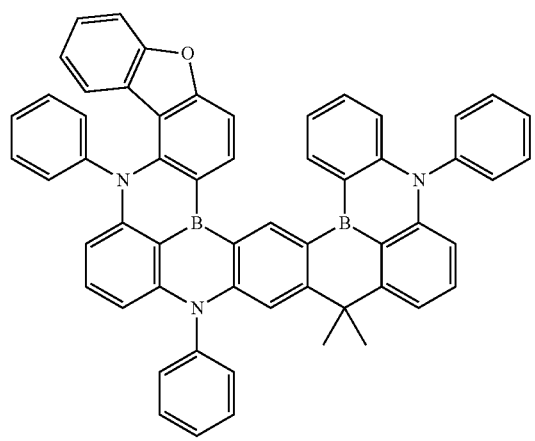
A-33
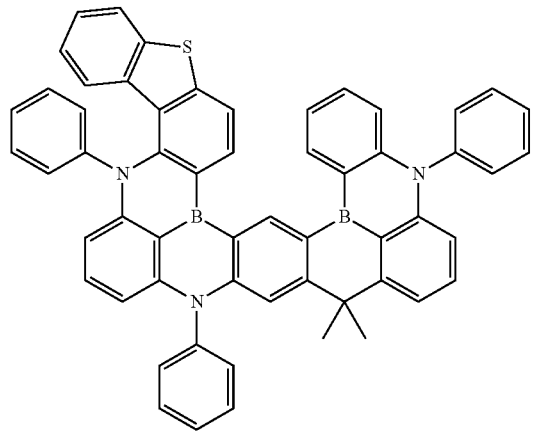
A-34
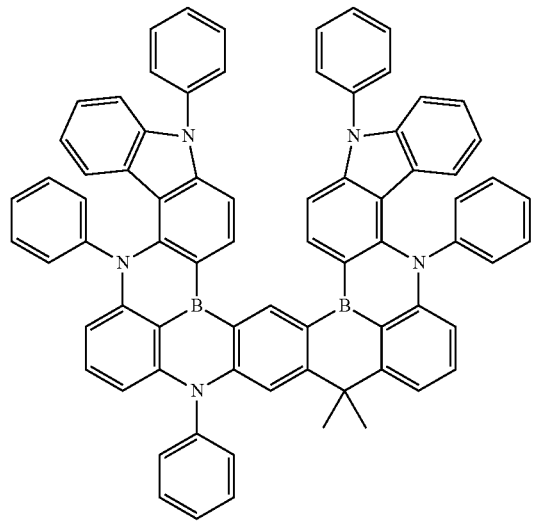
A-35
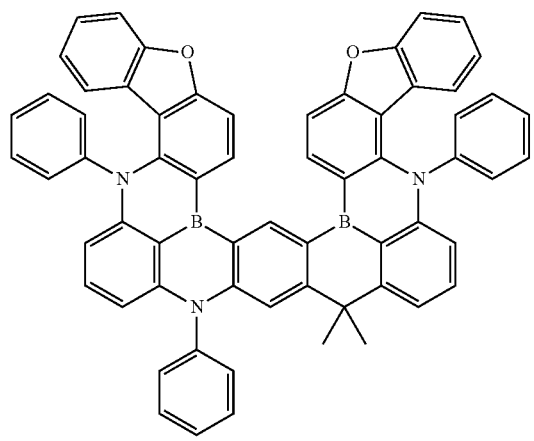
A-36
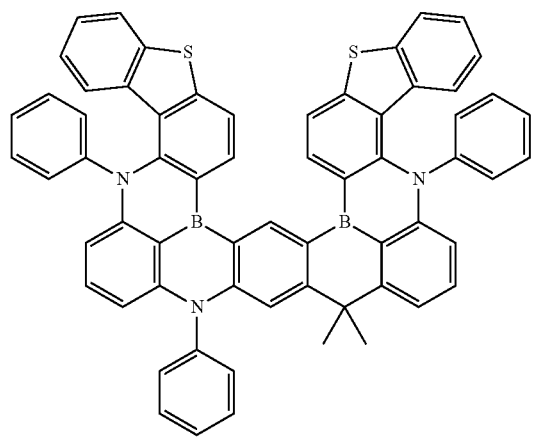

-continued
A-37
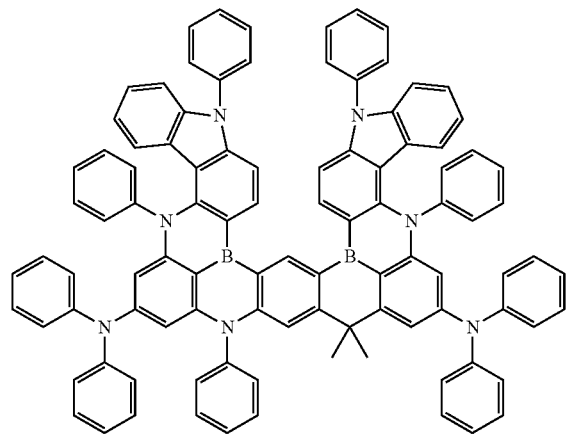
A-38
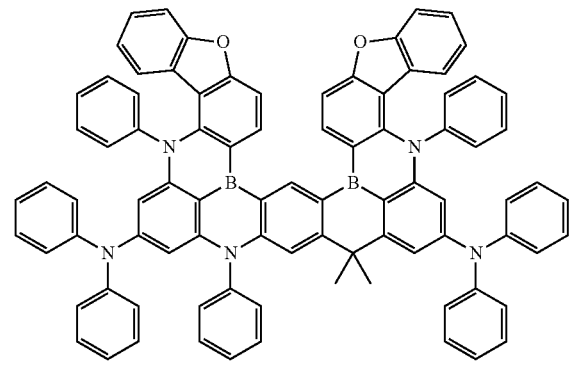
A-39
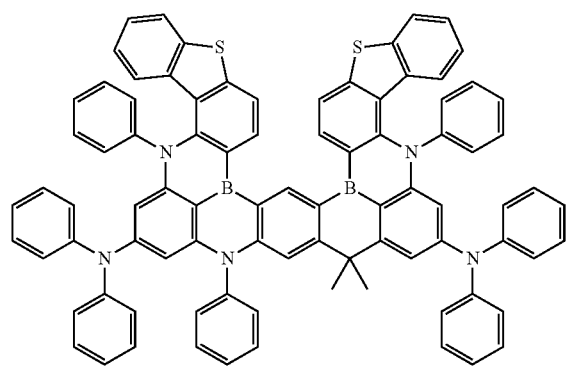
A-40
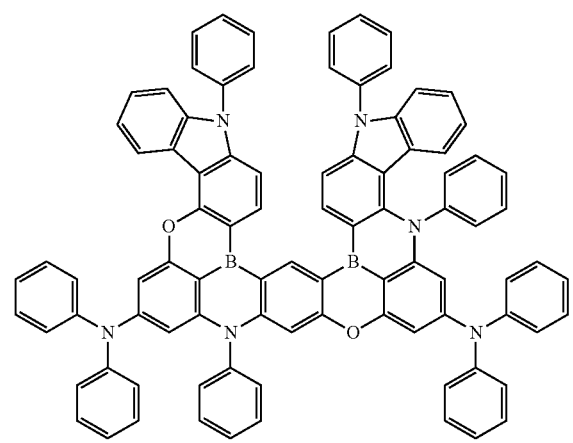
A-41
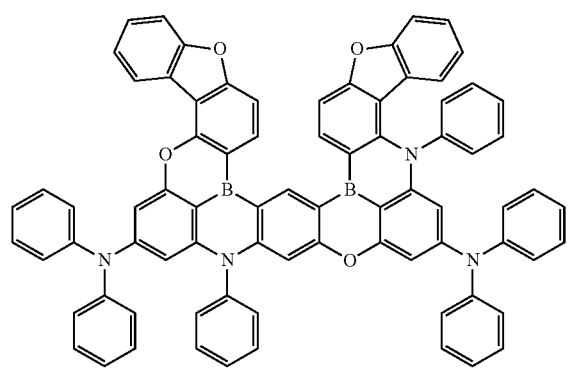
A-42
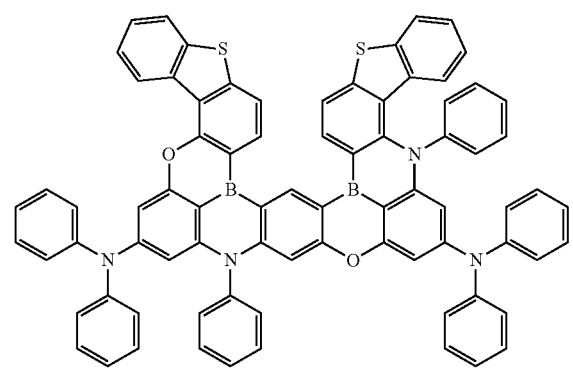

-continued
A-43
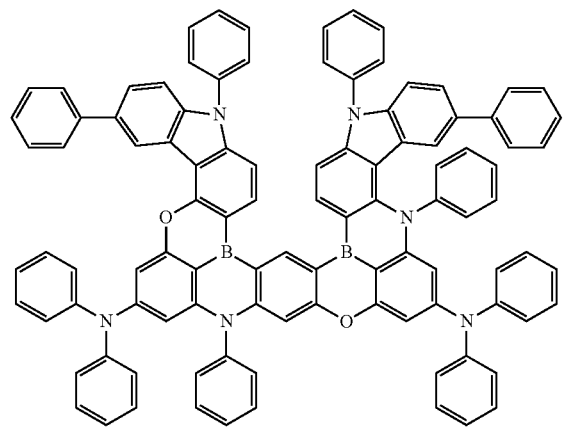
A-44
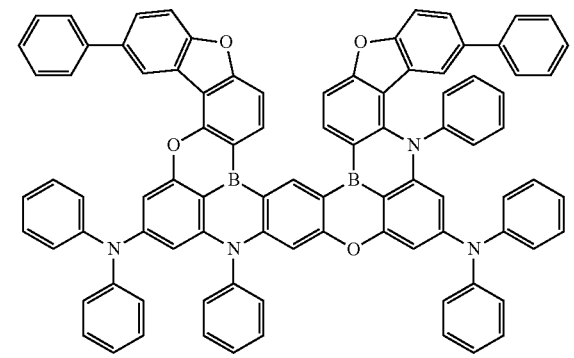
A-45
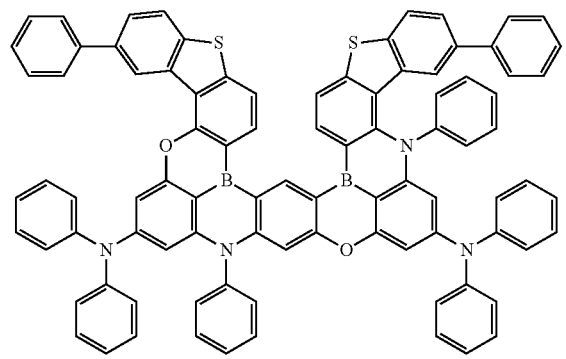
B-1
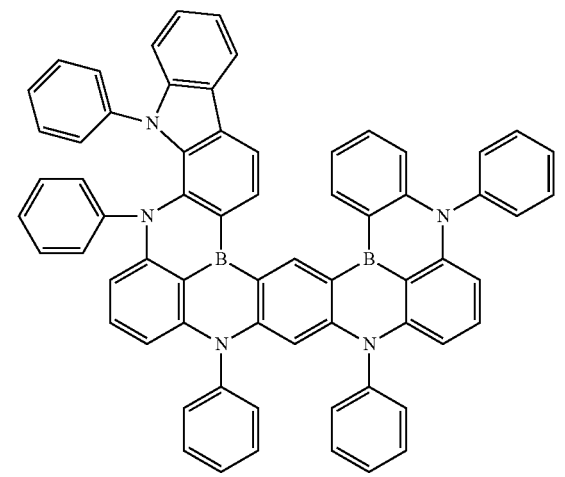
B-2
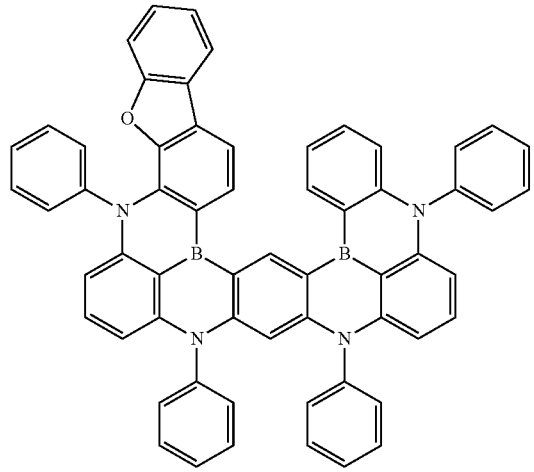
B-3
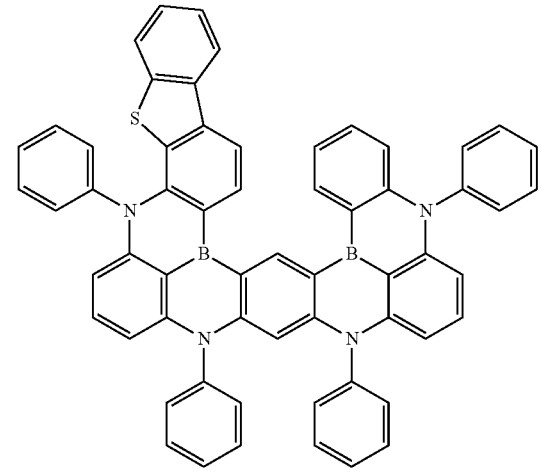

-continued
B-4
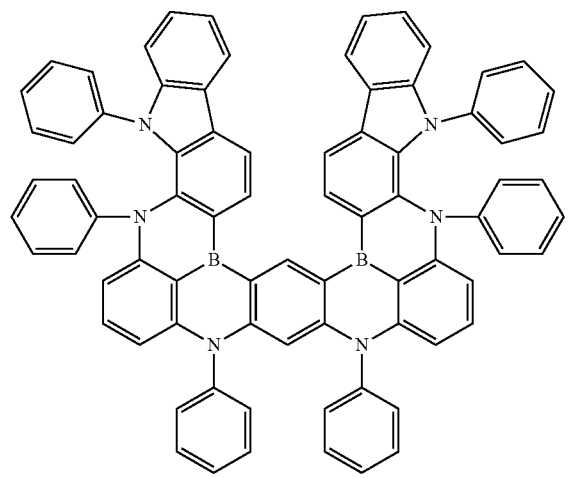
B-5
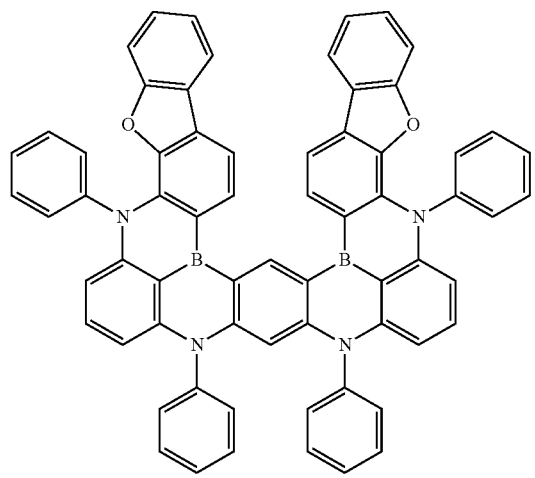
B-6
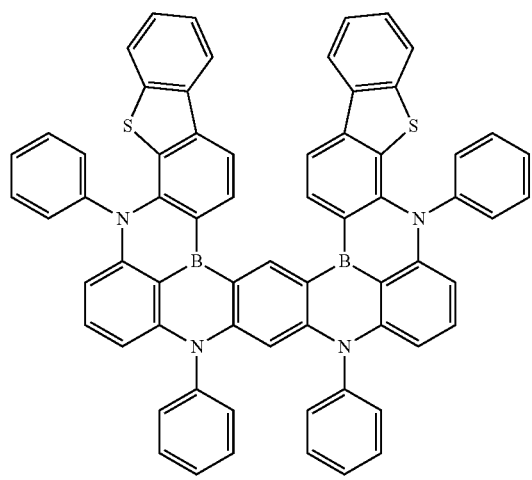
B-7
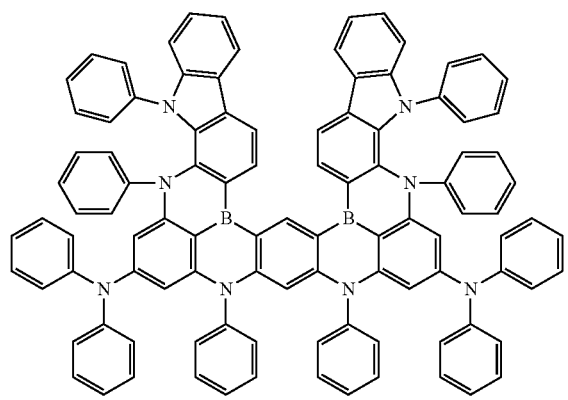
B-8
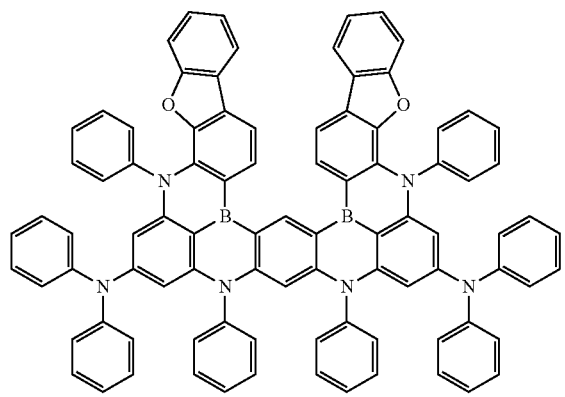
B-9
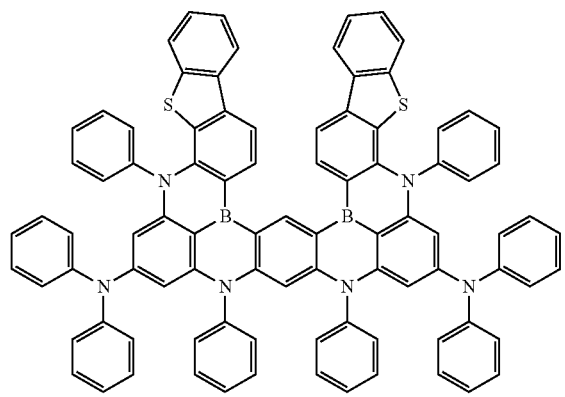

-continued
B-10
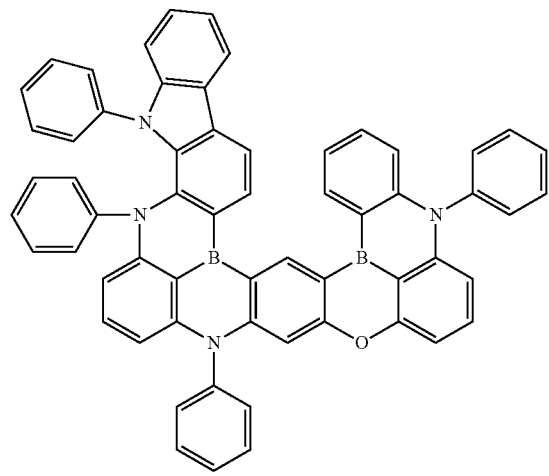
B-11
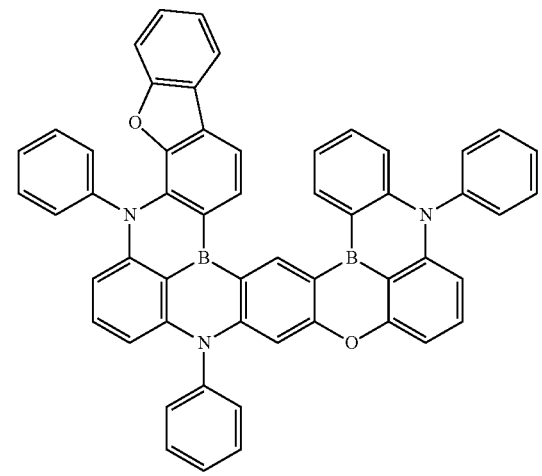
B-12
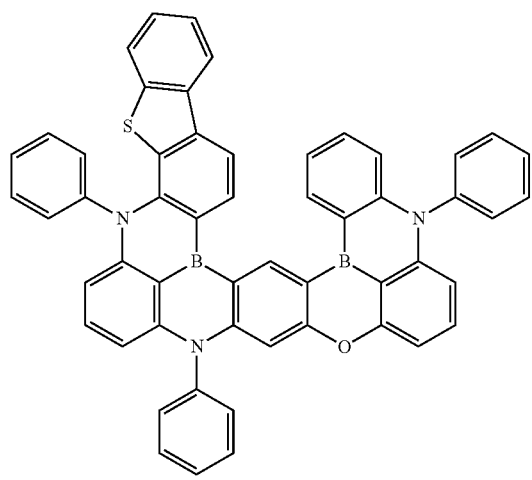
B-13
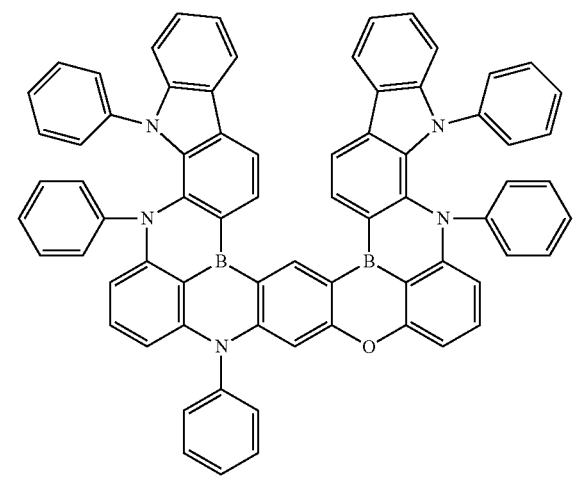
B-14
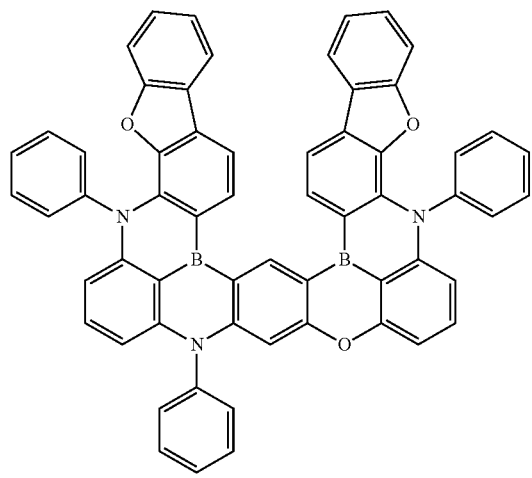
B-15
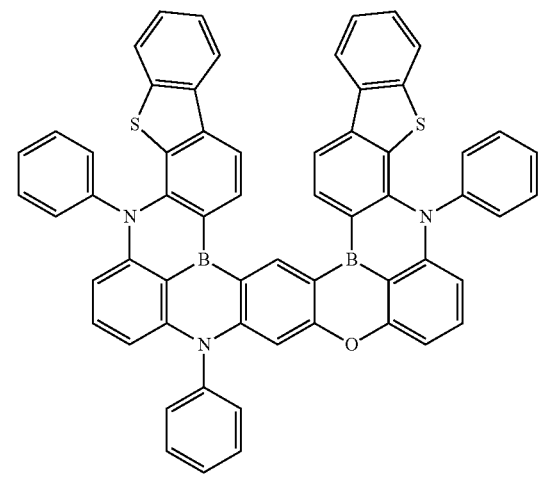

-continued
B-16
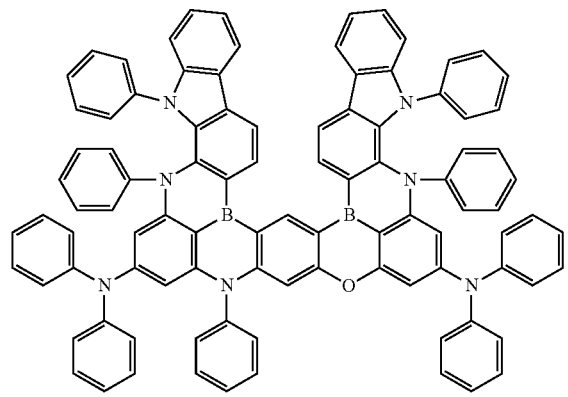
B-17
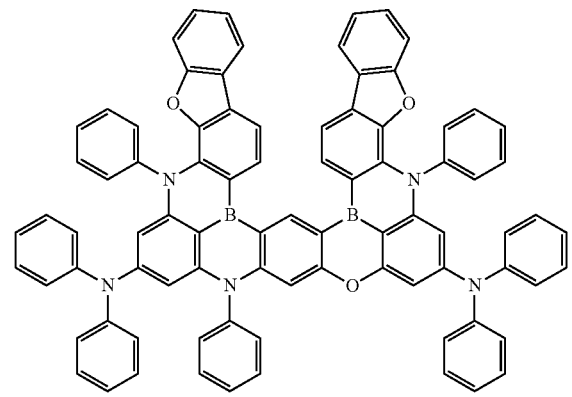
B-18
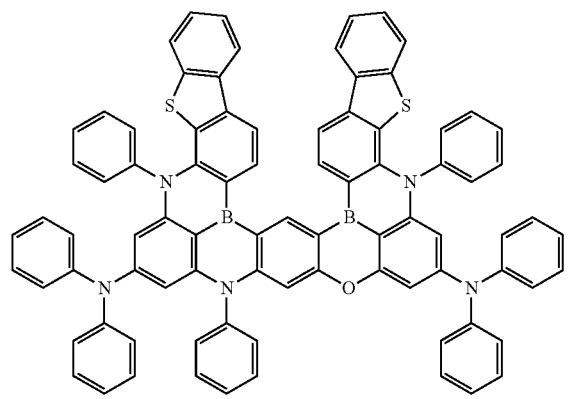
B-19
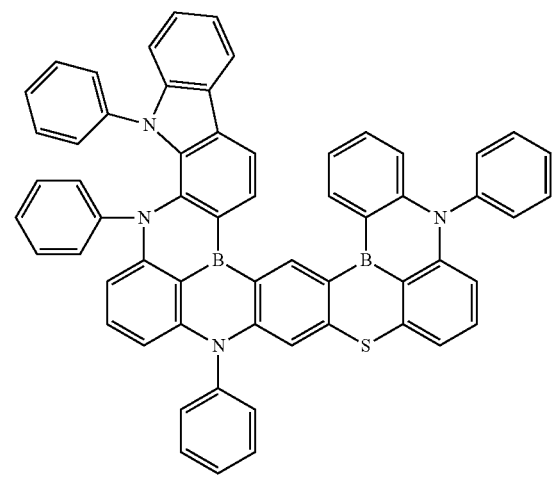
B-20
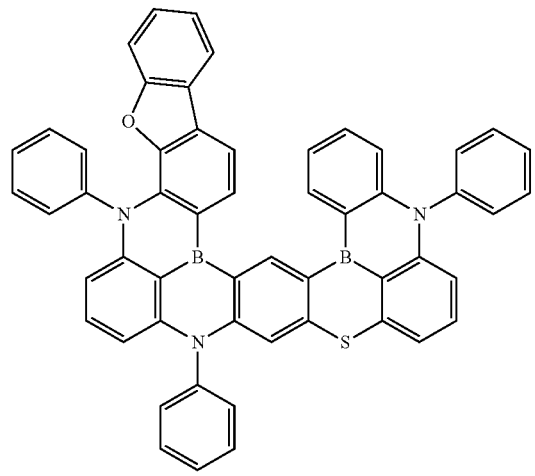
B-21
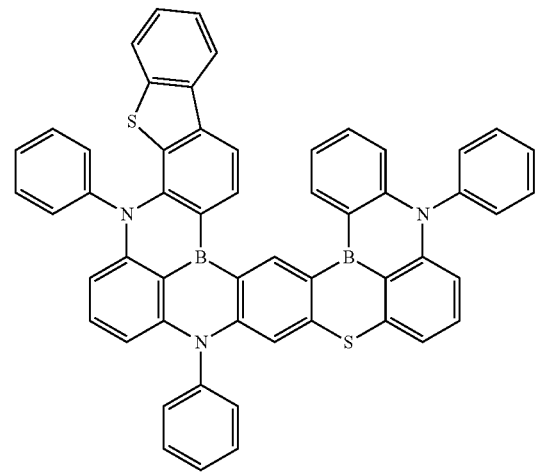

-continued
B-22
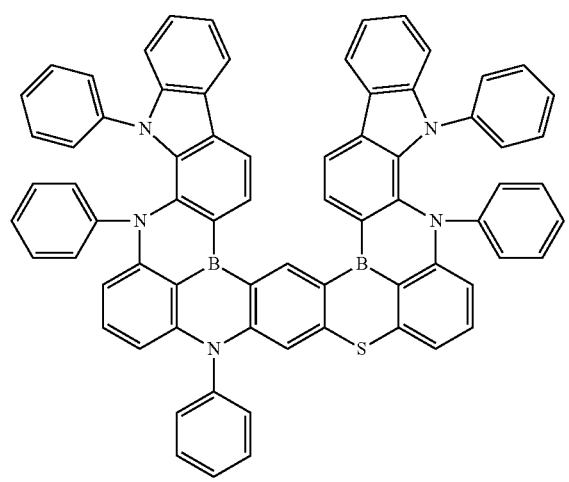
B-23
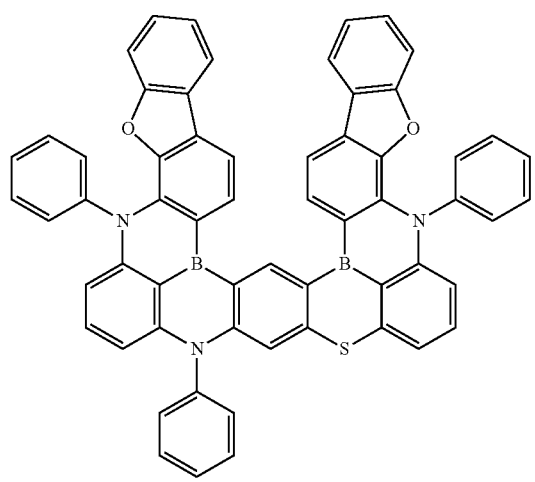
B-24
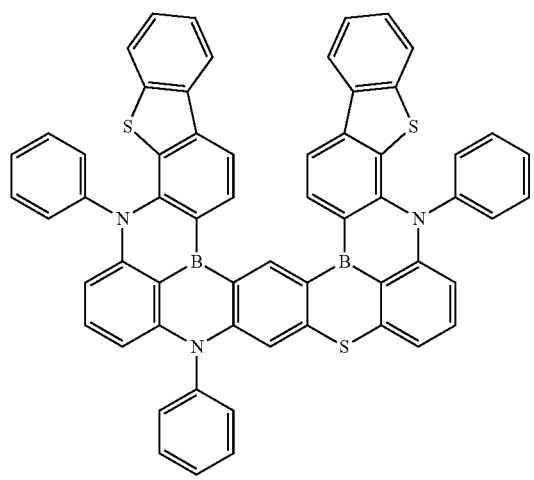
B-25
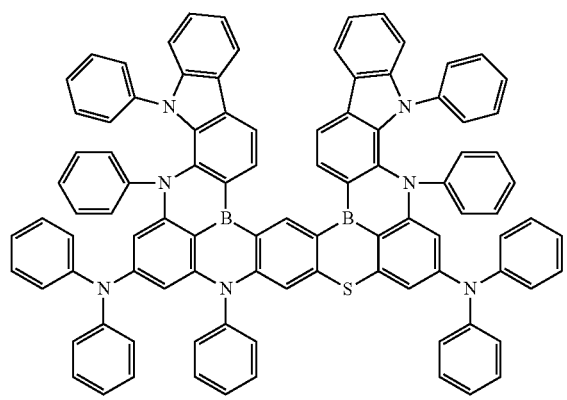
B-26
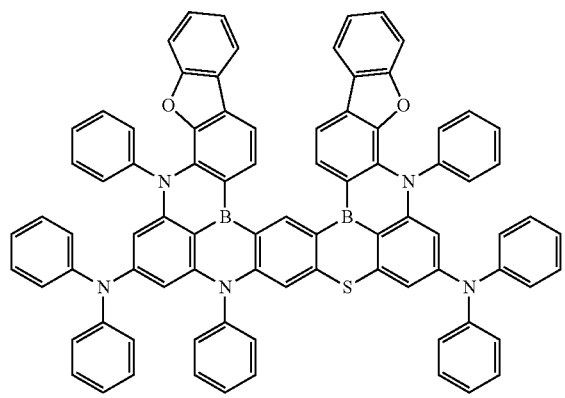
B-27
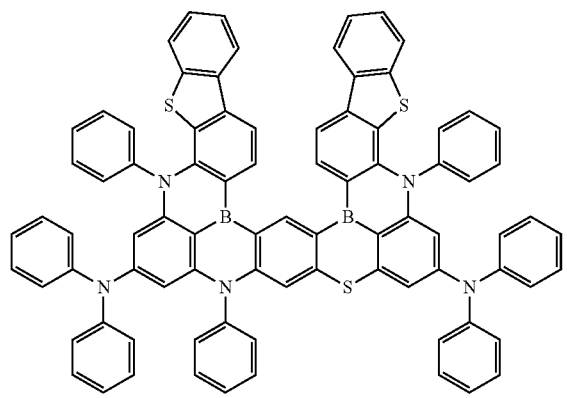

-continued
B-28
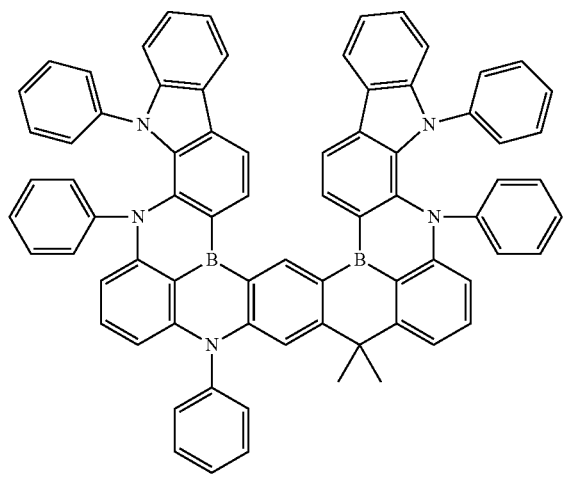
B-29
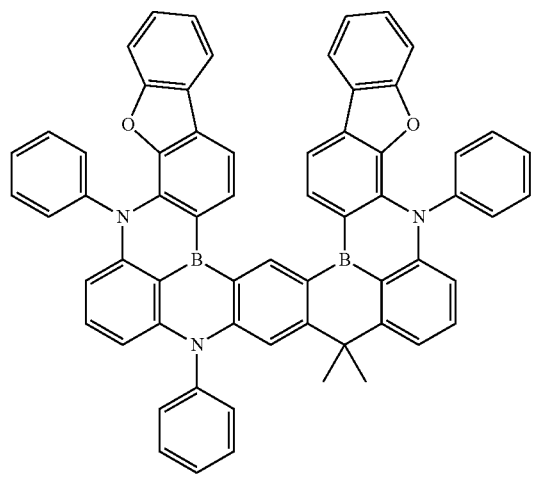
B-30
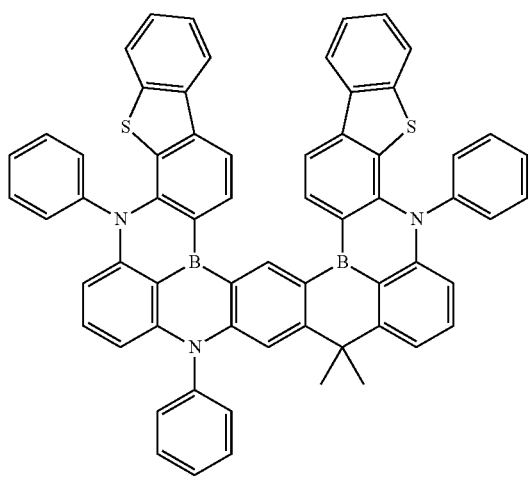
B-31
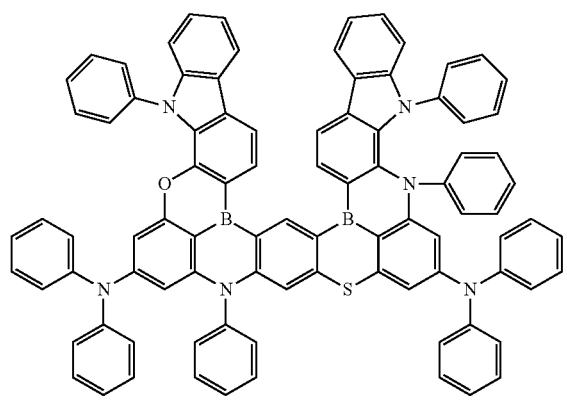
B-32
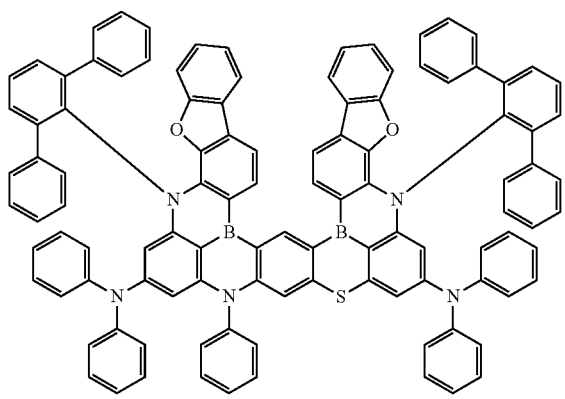
B-33
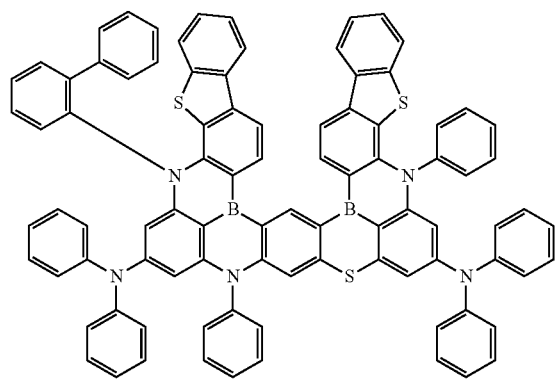

-continued
B-34
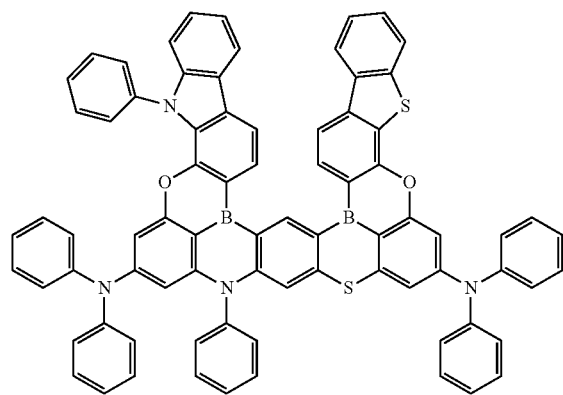
B-35
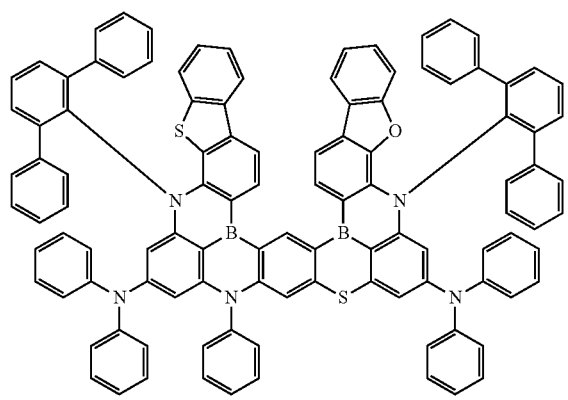
B-36
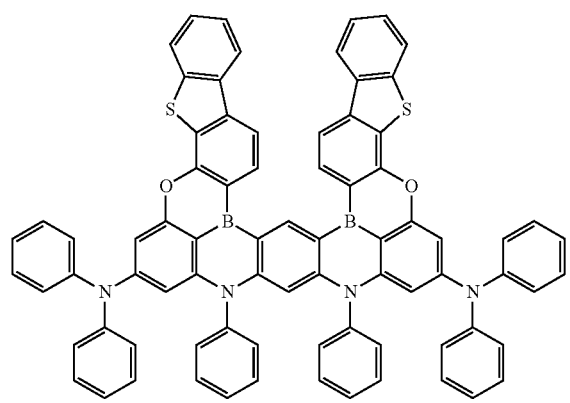
C-1
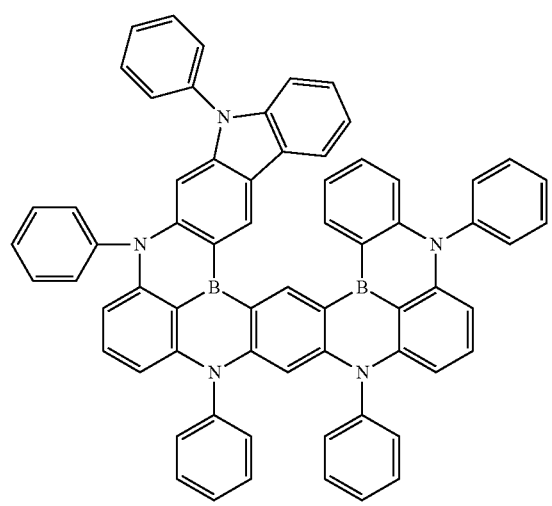
C-2
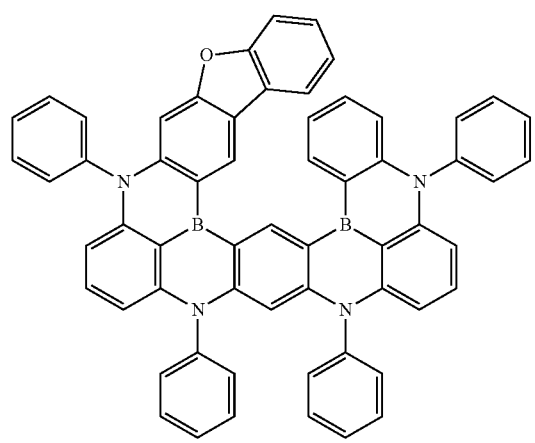
C-3
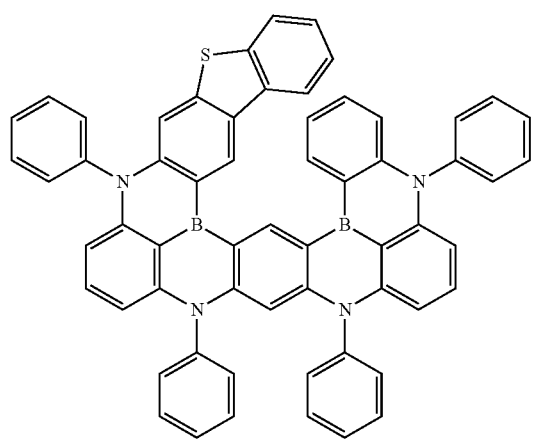

-continued
C-4
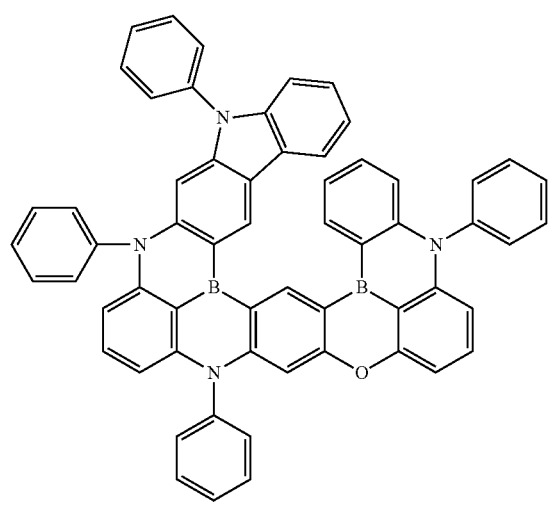
C-5
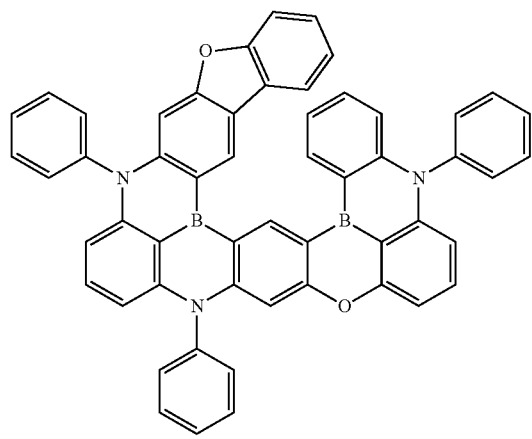
C-6
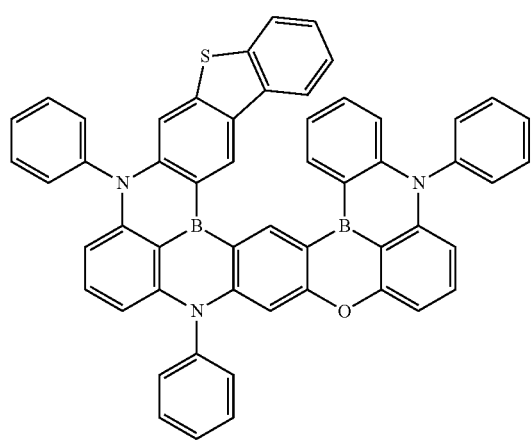
C-7
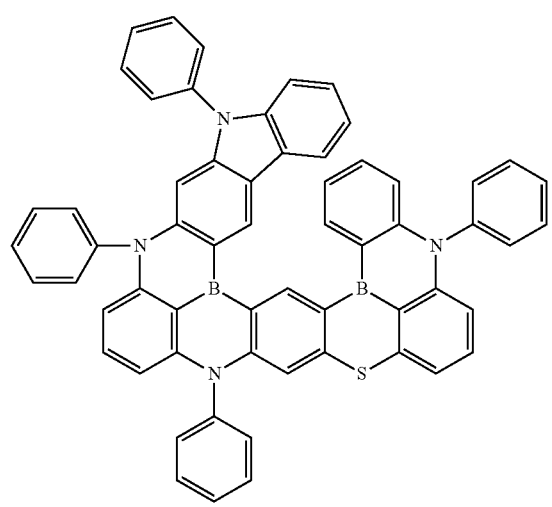
C-8
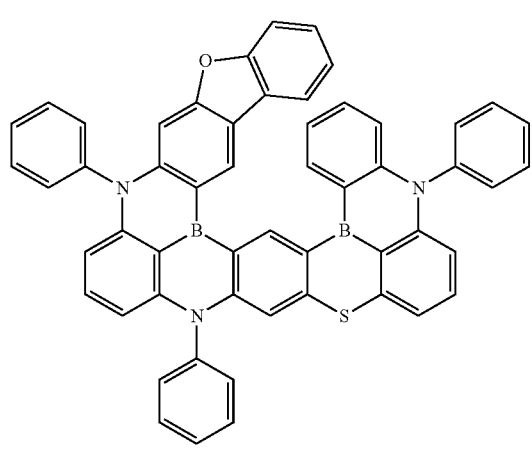
C-9
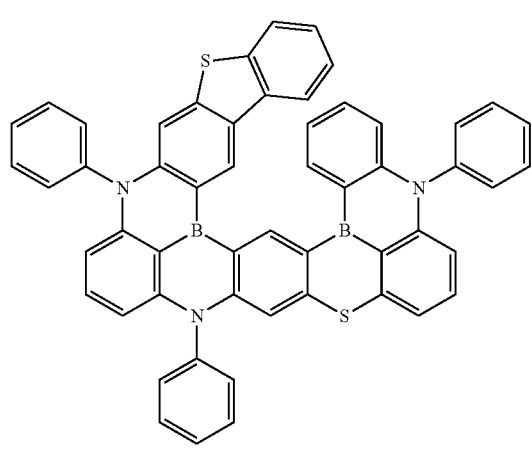

-continued
C-10
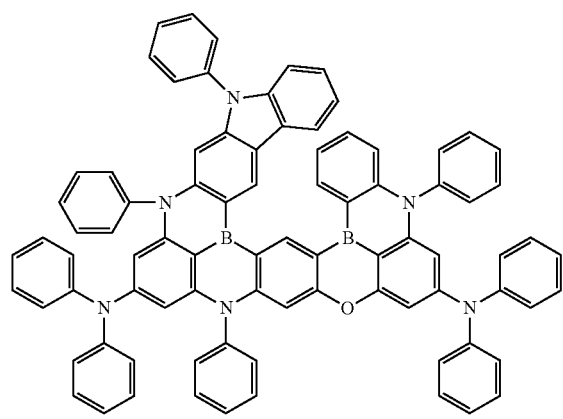
C-11
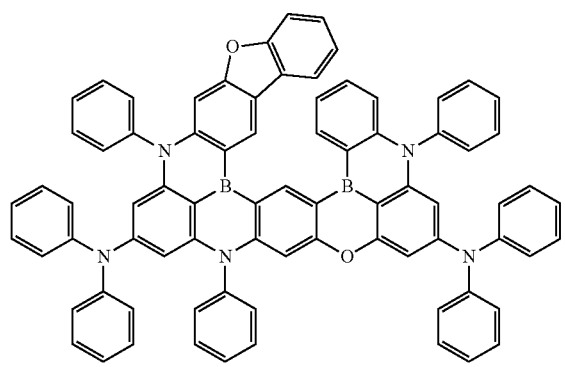
C-12
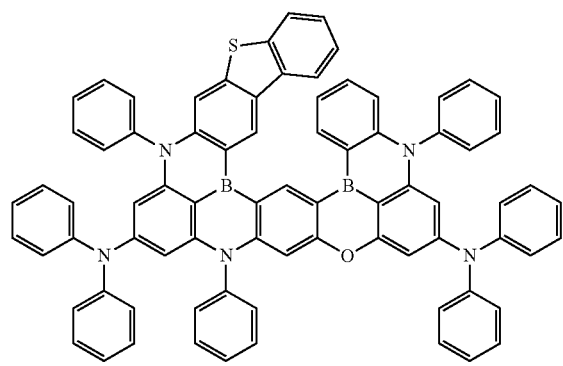
C-13
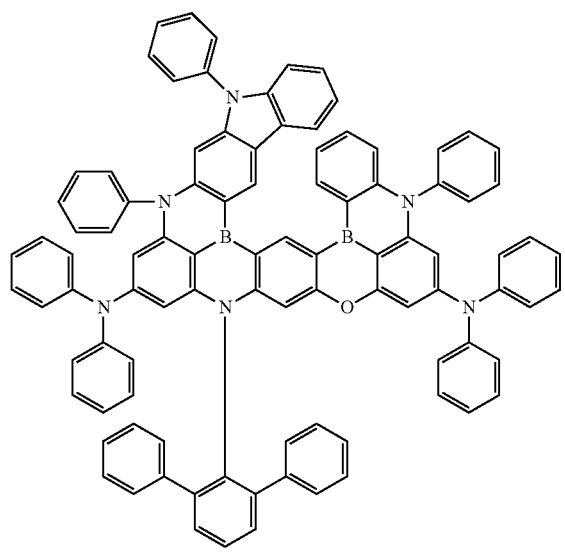
C-14
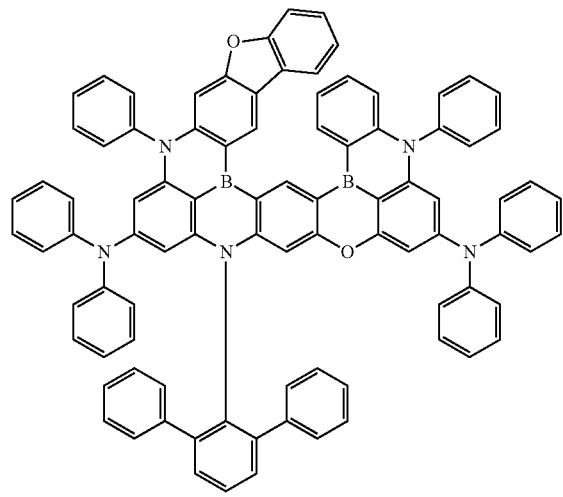
C-15
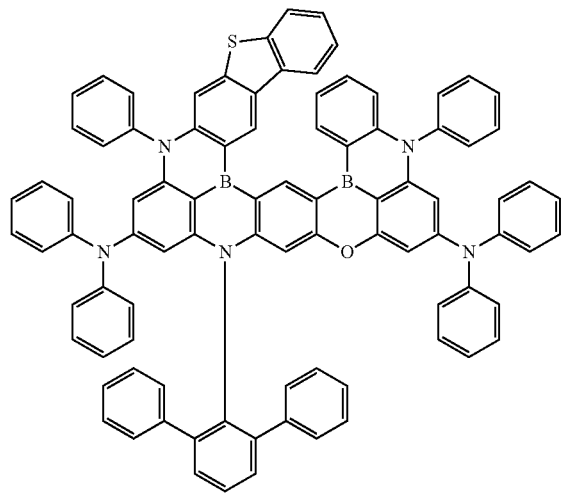

-continued
C-16
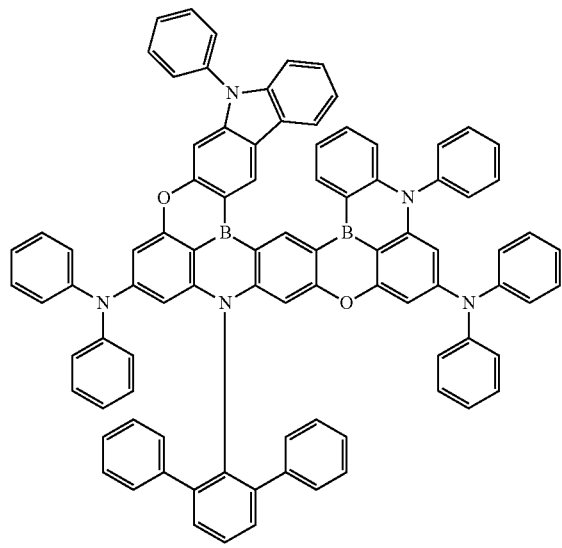
C-17
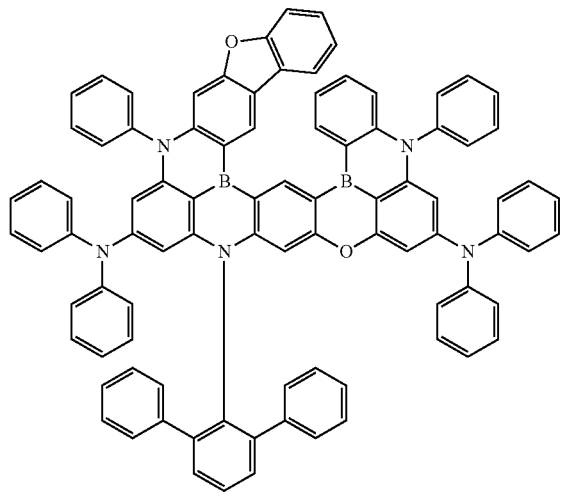
C-18
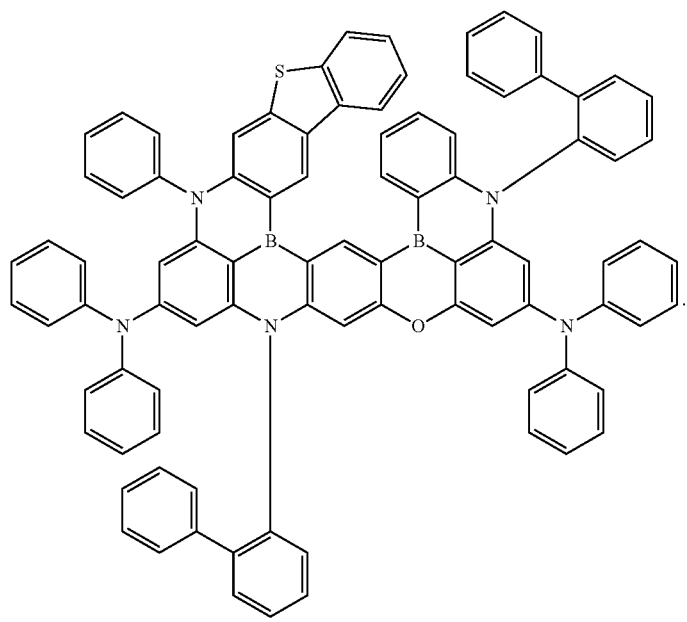
* * * * *